(12) United States Patent
Rotem et al.

(10) Patent No.: US 6,411,187 B1
(45) Date of Patent: Jun. 25, 2002

(54) ADJUSTABLE HYBRID MAGNETIC APPARATUS

(75) Inventors: Haim Rotem, Mate Asher; Ehud Katznelson, Ramat Yishai, both of (IL)

(73) Assignee: Odin Medical Technologies, Ltd., Yokneam Ilit (IL)

( * ) Notice: Subject to any disclaimer, the term of this patent is extended or adjusted under 35 U.S.C. 154(b) by 0 days.

(21) Appl. No.: 09/721,767

(22) Filed: Nov. 27, 2000

Related U.S. Application Data

(63) Continuation-in-part of application No. 09/274,671, filed on Mar. 24, 1999, now Pat. No. 6,157,278, which is a continuation-in-part of application No. 08/898,773, filed on Jul. 23, 1997, now Pat. No. 5,900,793.

(51) Int. Cl.$^7$ .......................... H01F 3/00; G01R 33/20; G01V 3/00

(52) U.S. Cl. ...................... 335/296; 335/298; 335/299; 335/306; 324/319; 324/320

(58) Field of Search .......................... 335/216, 296–306; 324/318–320; 600/407, 410, 421, 422

(56) References Cited

U.S. PATENT DOCUMENTS

| | | |
|---|---|---|
| 4,341,220 A | 7/1982 | Perry |
| 4,608,977 A | 9/1986 | Brown |
| 4,695,802 A | 9/1987 | Zijlstra |
| 4,829,252 A | 5/1989 | Kaufman |
| 4,862,086 A | 8/1989 | Maeda |
| 4,875,485 A | 10/1989 | Matsutani |
| 5,134,374 A | 7/1992 | Breneman et al. |
| 5,153,517 A | 10/1992 | Oppelt et al. |
| 5,241,272 A | 8/1993 | Friedrich |
| 5,296,811 A | 3/1994 | Ehnholm et al. |
| 5,304,933 A | 4/1994 | Vavrek et al. |
| 5,309,106 A | 5/1994 | Miyajima et al. |
| 5,332,971 A | 7/1994 | Aubert |
| 5,357,958 A | 10/1994 | Kaufman |
| 5,365,927 A | 11/1994 | Roemer et al. |
| 5,390,673 A | 2/1995 | Kikinis |
| 5,410,287 A | 4/1995 | Laskaris et al. |
| 5,428,292 A | 6/1995 | Dorri et al. |
| 5,475,355 A | 12/1995 | Abele et al. ................ 335/301 |
| 5,483,158 A | 1/1996 | Van Heteren et al. |
| 5,490,509 A | 2/1996 | Carlson et al. |
| 5,495,222 A | 2/1996 | Abele et al. |
| 5,517,119 A | 5/1996 | Weinstock et al. |
| 5,517,169 A | 5/1996 | Laskaris et al. |

(List continued on next page.)

FOREIGN PATENT DOCUMENTS

| | | |
|---|---|---|
| WO | WO 99/05531 | 2/1999 |
| WO | WO 99/15914 | 4/1999 |
| WO | WO 99/40593 | 8/1999 |
| WO | WO 00/33722 | 6/2000 |
| WO | WO 00/57435 | 9/2000 |

*Primary Examiner*—Ramon M. Barrera
(74) *Attorney, Agent, or Firm*—Eitan, Pearl, Latzer & Cohen-Zedek

(57) ABSTRACT

Adjustable hybrid magnetic apparatus for use in medical and other applications includes an electromagnet flux generator for generating a first magnetic field in an imaging volume, and permanent magnet assemblies for generating a second magnetic field superimposed on the first magnetic field for providing a substantially homogenous magnetic field having improved magnitude within the imaging volume. The permanent magnet assemblies may include a plurality of annular or disc like concentric magnets spaced-apart along their axis of symmetry. The electromagnet flux generator may include two electromagnet assemblies. The electromagnet assemblies and the permanent magnet assemblies may be static assemblies or may be movable and/or tiltable and/or movable and tiltable, for fine tuning of the magnetic field within the imaging volume. The hybrid magnetic apparatus may include a high magnetic permeability yoke for increasing the intensity of the magnetic field in the imaging volume of the hybrid magnetic apparatus.

128 Claims, 29 Drawing Sheets

U.S. PATENT DOCUMENTS

| | | |
|---|---|---|
| 5,565,779 A | 10/1996 | Arakawa et al. |
| 5,565,831 A | 10/1996 | Dorri et al. |
| 5,568,102 A | 10/1996 | Dorri et al. |
| 5,570,073 A | 10/1996 | Muller |
| 5,574,417 A | 11/1996 | Dorri et al. |
| H1615 H | 12/1996 | Leupold |
| 5,581,220 A | 12/1996 | Rodenbush et al. |
| 5,623,241 A | 4/1997 | Minkoff |
| 5,675,305 A | 10/1997 | DeMeester et al. |
| 5,677,630 A | 10/1997 | Laskaris et al. |
| 5,696,449 A | 12/1997 | Boskamp |
| 5,735,278 A | 4/1998 | Hoult et al. |
| 5,801,609 A | 9/1998 | Laskaris et al. ............. 335/216 |
| 5,812,043 A | 9/1998 | Gore et al. ................. 335/216 |
| 5,855,555 A | 1/1999 | Crowely |
| 5,874,882 A | 2/1999 | Laskaris et al. ............. 335/299 |
| 5,880,661 A | 3/1999 | Davidson et al. |
| 5,900,793 A | 5/1999 | Katznelson et al. |
| 6,011,396 A | 1/2000 | Eckels et al. |
| 6,147,578 A | 11/2000 | Panfil et al. |
| 6,150,911 A | 11/2000 | Katznelson et al. |
| 6,157,278 A | 12/2000 | Katznelson et al. |
| 6,157,281 A | 12/2000 | Katznelson et al. |
| 6,163,240 A | 12/2000 | Zuk et al. |

ADJUSTABLE HYBRID MAGNETIC APPARATUS

RELATED U.S. APPLICATIONS

This Application is a continuation in part of U.S. patent application Ser. No. 09/274,671 to Katznelson et al., entitled "HYBRID MAGNETIC APPARATUS FOR USE IN MEDICAL APPLICATIONS" filed Mar. 24, 1999, now U.S. Pat. No. 6,157,278, assigned to the assignee of the present invention and incorporated herein by reference in its entirety, which is a continuation in part of U.S. patent application Ser. No. 08/898,773 to Katznelson et al., entitled "PERMANENT MAGNETIC ASSEMBLIES FOR USE IN MEDICAL APPLICATIONS", filed Jul. 23, 1997, now U.S. Pat. No. 5,900,793, assigned to the assignee of the present invention and incorporated herein by reference in its entirety.

FIELD OF THE INVENTION

This invention relates to permanent magnet assemblies for use in medical applications and particularly to permanent magnet assemblies for use in Magnetic Resonance Imaging (MRI) and/or Magnetic Resonance Therapy (MRT) and/or interventional MRI (iMRI) which produce a predetermined volume of substantially uniform magnetic field extending in a first direction beyond the surface of the permanent magnet assemblies.

BACKGROUND OF THE INVENTION

The principles of MRI are set forth in several patents such as U.S. Pat. No. 5,304,933, which is incorporated herein by reference. Interventional MRI (iMRI) which is also referred to as intraoperative MRI, is the performance of an interventional medical procedure on a patient in an MRI system. During the procedure, a surgical instrument is inserted into a patient in order to perform the procedure at a predetermined site in the body. The iMRI system is used in this case to monitor in quasi real-time the correct placement of the instrument and also to observe the nature and the extent of the effect of the intervention on the tissue.

In an MRI and/or iMRI system a strong uniform magnetic field is required in order to align an objects nuclear spins along the z-axis of a Cartesian coordinate system having mutually orthogonal x-y-z axes. The required strong uniform magnetic field, used for full body imaging, is normally in the order of 0.1 to 2 Tesla. The image quality and the accuracy of an MRI and/or iMRI system is dependent on the degree of uniformity of the strong uniform magnetic field. Uniformity is critical in MRI and/or iMRI applications because if the strong uniform magnetic field is not properly uniform within the volume of interest, the desired discrimination between different elements, due to the finely controlled magnetic field gradient, will be subject to misinterpretation. Typically, the uniformity required for the strong uniform magnetic field is within the order of 10 ppm within the volume of interest. It is essential for iMRI systems used in interventional procedures to be based on an open structure, so as to provide the physician easy access to the intervention site. Presently, most MRI systems employ a large magnet, which effectively surrounds the whole body of the patient, to produce the strong uniform magnetic field. Such magnets are usually large superconductor resistive or permanent magnets, each of which is expensive and heavy. Further, the access to the patient in these cases is obstructed.

Attempts have been made to provide open magnets for interventional procedures by employing two spaced-apart Helmholtz superconductive coil assemblies. They provide only limited space between the assemblies allowing for constricted access by only one person, such as a surgeon. Moreover, they are large, massive, immobile and expensive. See U.S. Pat. No. 5,410,287 (Laskaris et al.) and U.S. Pat. No. 5,428,292 (Dorri et al.).

U.S. Pat. No. 5,574,417 (Dorri et al.) discloses an open MRI magnet having two opposing superconducting coils and two annular shaped permanent magnet arrays. The radially separated inward and radially apart from the superconducting coil. Each of the permanent magnet arrays has a magnetic field direction generally opposite to the magnetic field direction of the corresponding superconducting coil. The permanent magnet arrays are stationary.

U.S. Pat. No. 5,696,476 (Havens et al.) discloses a passively shimmed open architecture magnetic resonance imaging magnet utilizing separated superconducting coil assemblies with open space between including shaped ferromagnetic bands in the bore of the magnets, the shaping including an axial notch and circumferential holes for attaching passive shims, the ferromagnetic bands are stationary.

U.S. Pat. No. 4,710,741 (McGinley et al.) discloses a coil arrangement for producing a homogenous magnetic field, comprising a single pair of identical annular coils disposed coaxially in spaced relationship and a pair of annular members of ferromagnetic material disposed coaxially with the coils. The annular members are stationary.

U.S. Pat. No. 5,463,364 (Muller) discloses an open magnetic apparatus having two opposing electromagnet coils and one or two pairs of opposing ferromagnetic rings. The rings of one pair of ferromagnetic rings are at least partially integrated into the electromagnet coils. The pairs of rings are stationary relative to the coils.

British patent GB 2219406A (Warner) discloses an electromagnet for providing a volume of homogenous magnetic field, comprising a pair of annular coils disposed coaxially in spaced relationship and ferromagnetic means, such as ferromagnetic annuli, disposed coaxially with the coils. The ferromagnetic means are stationary means.

U.S. Pat. No. 4,875,485 (Matsutani) discloses an apparently more compact configuration, based on a pair of spaced-apart superconductive Helmholtz coil assemblies, arranged for movement relative to a platform carrying the patient. The access to the patient remains restricted in this case as well, due to the additional space occupied by the cryostat. Additionally, the movement of the coils independently of one another is impractical, because the superconducting properties of the coils require extreme precision in positioning of the two poles, in the absence of which the magnetic system quenches.

In comparison to superconductive systems, permanent magnets are less expensive, generate only a minimal unwanted fringe field and are not involved with liquefied gas handling or vacuum requirements. Open access MRI systems based on permanent magnets have been disclosed by U.S. Pat. No. 4,829,252 (Kaufman) and U.S. Pat. No. 5,134,374 (Breneman). Both are using a pair of opposing magnetic flat circular poles, employed one above the other, with the patient lying down between the magnets. The poles are mounted on end plates, supported by connecting members, which provide return paths for the magnetic flux. These systems are massive and immobile and the access to the patient is encumbered by the supporting structure.

A pair of opposing permanent magnet assemblies for use in MRI, each made of concentric magnetic rings, composed of a set of magnetic polygonal blocks, is disclosed in U.S. Pat. No. 5,332,971 (Aubert). Aubert teaches that the opposing concentric rings within each of the pairs of permanent magnets are to be spaced apart from each other the same distance. The magnet is massive, weighing about 3 tons and is therefore not amenable to movement relative to a patient's body.

In each of the above prior art magnets, used for providing the large uniform magnetic field for MRI and/or iMRI applications, the magnetic field is generated in a first stage as uniformly as possible. More uniformity is achieved subsequently by shimming.

Co-pending U.S. patent application Ser. No. 09/161,336, to Zuk et al., entitled "MAGNETIC APPARATUS FOR MRI", filed Sep. 25, 1998, assigned to the assignee of the present invention, and the corresponding International Patent Application PCT/IL98/00463 published as International Publication No. WO 99/15914, the entire specification of which is incorporated herein by reference, disclose, inter alia, magnetic apparatus including an opposing pair of permanent magnetic assemblies defining an open region therebetween in which an organ or body part is positioned for imaging. The magnetic apparatus includes a plurality of gradient coils at least one of which is positioned outside of the open region.

Co-pending U.S. patent application Ser. No. 09/405,835 to Katznelson et al., filed Sep. 27, 1999, entitled "YOKED PERMANENT MAGNET ASSEMBLIES FOR USE IN MEDICAL APPLICATIONS", assigned to the assignee of the present invention and incorporated herein by reference in its entirety discloses, inter alia, an MRI system having an open magnet including two spaced apart permanent magnet assemblies attached to an open ferromagnetic yoke.

U.S. Pat. No. 6,147,578 to Panfil et al. entitled "A METHOD FOR DESIGNING OPEN MAGNETS AND OPEN MAGNETIC APPARATUS FOR USE IN MRI/MRT PROBES", assigned to the assignee of the present invention, and the corresponding International Patent Application PCT/IL99/00075, published as International Publication No. WO 99/40593, entitled "A METHOD FOR DESIGNING OPEN MAGNETS AND OPEN MAGNETIC APPARATUS FOR USE IN MRI/MRT PROBES", both applications are incorporated herein by reference in their entirety, disclose, inter alia, an open iMRI magnet having an open ferromagnetic yoke and including two spaced apart permanent magnet assemblies having ferromagnetic collimators arranged to have an open region therebetween.

Co-pending U.S. patent application Ser. No. 09/274,671 to Katznelson et al., filed Mar. 24, 1999, entitled "HYBRID MAGNETIC APPARATUS FOR USE IN MEDICAL APPLICATIONS", discloses, inter alia, a compact open iMRI magnet having adjustable permanent magnet assemblies and fixed electromagnet assemblies.

SUMMARY OF THE INVENTION

There is therefore provided, in accordance with a preferred embodiment of the present invention an open magnetic apparatus for producing a predetermined volume of substantially uniform magnetic field directed parallel to an axis of symmetry of the volume. The apparatus includes a first electromagnet assembly disposed at a first position along the axis. The first electromagnet assembly includes at least a first electromagnet coil. The at least first electromagnet coil is radially symmetric with respect to the axis. The apparatus also includes a second electromagnet assembly disposed at a second position spaced apart from the first position of the electromagnet assembly along the axis. The second electromagnet assembly includes at least a second electromagnet coil. The at least second electromagnet coil is radially symmetric with respect to the axis. The first electromagnet coil and the second electromagnet coil are substantially equidistant from the center of the volume. The first electromagnet assembly and the second electromagnet assembly are configured for generating a first magnetic field within the volume. The apparatus also includes a first permanent magnet assembly positioned at a third position disposed between the first position and the second position along the axis. The first permanent magnet assembly has an inner surface facing the volume and an outer surface facing the first electromagnet assembly. The first permanent magnet assembly includes at least two coaxial permanent magnets. The at least two permanent magnets are radially symmetric with respect to the axis. The apparatus also includes a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes at least two coaxial permanent magnets the at least two permanent magnets of the second permanent magnet assembly are radially symmetric with respect to the axis. The inner surface of the first permanent magnet assembly and the inner surface of the second permanent magnet assembly define an open region therebetween. The volume is disposed within the open region. The third position of the first permanent magnet assembly and the fourth position of second permanent magnet assembly are substantially equidistant from the center of the volume along the axis. The first permanent magnet assembly and the second permanent magnet assembly are configured for generating a second magnetic field superimposed on the first magnetic field to provide the substantially uniform magnetic field within the volume.

Furthermore, in accordance with another preferred embodiment of the present invention, at least one electromagnet assembly of the first electromagnet assembly and the second electromagnet assembly is a movable electromagnetmagnet assembly.

Furthermore, in accordance with another preferred embodiment of the present invention, at least one electromagnet assembly of the first electromagnet assembly and the second electromagnet assembly is controllably movable relative to the volume.

There is further provided, in accordance with another preferred embodiment of the present invention, an open magnetic apparatus for producing a predetermined volume of substantially uniform magnetic field directed parallel to an axis of symmetry of the volume. The apparatus includes a first electromagnet assembly disposed at a first position along the axis. The first electromagnet assembly includes at least a first electromagnet coil. The at least first electromagnet coil is radially symmetric with respect to the axis. The apparatus further includes a second electromagnet assembly disposed at a second position spaced apart from the first position of the first electromagnet assembly along the axis. The second electromagnet assembly includes at least a second electromagnet coil. The at least second electromagnet coil is radially symmetric with respect to the axis. The at least first electromagnet coil and the at least second electromagnet coil are substantially equidistant from the center of the volume. The first electromagnet assembly and the second electromagnet assembly are configured for generating a first magnetic field within the volume. The apparatus further includes a first permanent magnet assembly positioned at a third position disposed between the first position and the second position along the axis. The first permanent magnet assembly has an inner surface facing the volume and an outer surface facing the first electromagnet assembly. The first permanent magnet assembly includes at least two coaxial permanent magnets. The at least two permanent magnets are radially symmetric with respect to the axis. The apparatus further includes a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes at least two coaxial permanent magnets. The at least two permanent magnets of the second permanent magnet assembly are radially symmetric with respect to the axis. The inner surface of the first permanent magnet assembly and the inner surface of the second permanent magnet assembly define an open region therebetween. The volume is disposed within the open region. The third position of the first permanent magnet assembly and the fourth position of second permanent magnet assembly are substantially equidistant from the center of the volume along the axis. The first permanent magnet assembly and the second permanent magnet assembly are configured for generating a second magnetic field superimposed on the first magnetic field to provide the substantially uniform magnetic field within the volume. At least one of the first electromagnet assembly, the second electromagnet assembly, the first permanent magnet assembly and the second permanent magnet assembly is controllably movable relative to the volume.

Furthermore, in accordance with another preferred embodiment of the present invention, at least one electromagnet assembly of the first electromagnet assembly and the second electromagnet assembly is controllably movable relative to the volume.

Furthermore, in accordance with another preferred embodiment of the present invention, the hybrid magnetic apparatus further includes at least one moving mechanism configured for moving the at least one electromagnet assembly relative to the volume.

Furthermore, in accordance with another preferred embodiment of the present invention, the at least one moving mechanism is configured for moving the at least one electromagnet assembly towards or away from the volume in a direction parallel to the axis.

Furthermore, in accordance with another preferred embodiment of the present invention, the at least one moving mechanism is configured for tilting the at least one electromagnet assembly at an angle with respect to a plane orthogonal to the axis.

Furthermore, in accordance with another preferred embodiment of the present invention, the at least one moving mechanism is configured for moving the at least one electromagnet assembly towards or away from the volume in a direction parallel to the axis and for tilting the at least one electromagnet assembly at an angle with respect to a plane orthogonal to the axis.

Furthermore, in accordance with another preferred embodiment of the present invention, the at least one moving mechanism is a motorized moving mechanism.

Furthermore, in accordance with another preferred embodiment of the present invention, the motorized moving mechanism includes at least one motor for controllably moving the at least one electromagnet assembly.

Furthermore, in accordance with another preferred embodiment of the present invention, the at least one motor is a magnetic resonance imaging compatible motor.

Furthermore, in accordance with another preferred embodiment of the present invention, at least one permanent magnet assembly of the first permanent magnet assembly and the second permanent magnet assembly is movable relative to the volume.

Furthermore, in accordance with another preferred embodiment of the present invention, the hybrid magnetic apparatus further includes at least one moving mechanism configured for moving the at least one permanent magnet assembly relative to the volume.

Furthermore, in accordance with another preferred embodiment of the present invention, the at least one moving mechanism is configured for moving the at least one permanent magnet assembly towards or away from the volume in a direction parallel to the axis.

Furthermore, in accordance with another preferred embodiment of the present invention, the at least one moving mechanism is configured for tilting the at least one permanent magnet assembly at an angle with respect to a plane orthogonal to the axis.

Furthermore, in accordance with another preferred embodiment of the present invention, the at least one moving mechanism is configured for moving the at least one permanent magnet assembly towards or away from the volume in a direction parallel to the axis and for tilting the at least one permanent magnet assembly at an angle with respect to a plane orthogonal to the axis.

Furthermore, in accordance with another preferred embodiment of the present invention, the at least one moving mechanism is a motorized moving mechanism.

Furthermore, in accordance with another preferred embodiment of the present invention, the motorized moving mechanism includes at least one motor for controllably moving the at least one permanent magnet assembly.

Furthermore, in accordance with another preferred embodiment of the present invention, the at least one motor is a magnetic resonance imaging compatible motor.

Furthermore, in accordance with another preferred embodiment of the present invention, the at least first electromagnet coil and the at least second electromagnet coil are configured such that the radius of the at least first electromagnet coil is equal to the radius of the at least second electromagnet coil, and the distance between the at least first electromagnet coil and the at least second electromagnet coil is equal to the radius of the at least first electromagnet coil.

Furthermore, in accordance with another preferred embodiment of the present invention, the at least first electromagnet coil and the at least second electromagnet coil are configured such that the radius of the at least first electromagnet coil is equal to the radius of the at least second electromagnet coil, and the distance between the at least first electromagnet coil and the at least second electromagnet coil is greater than the radius of the at least first electromagnet coil.

Furthermore, in accordance with another preferred embodiment of the present invention, the at least first electromagnet coil and the at least second electromagnet coil are super-conducting electromagnet coils.

Furthermore, in accordance with another preferred embodiment of the present invention, the apparatus further includes at least a first cooling device for cooling the at least first electromagnet coil and a second cooling device for cooling the at least second electromagnet coil.

Furthermore, in accordance with another preferred embodiment of the present invention, the at least first cooling device and the at least second cooling device include a Dewar container or cryostat.

Furthermore, in accordance with another preferred embodiment of the present invention, the at least first cooling device and the at least second cooling device are selected from a low temperature gas operated cooling device, a low temperature liquefied gas based cooling device, an active cryo-cooling device, and a cooling device based on low pressure evaporative cooling of a liquefied gas.

Furthermore, in accordance with another preferred embodiment of the present invention, the super-conducting electromagnet coils include a low-temperature super-conducting material.

Furthermore, in accordance with another preferred embodiment of the present invention, the super-conducting electromagnet coils include a high-temperature super-conducting material.

Furthermore, in accordance with another preferred embodiment of the present invention, the at least two coaxial permanent magnets of the first permanent magnet assembly include a first permanent magnet having an outer diameter. The first permanent magnet has a first magnetization direction parallel to the axis. The at least two coaxial permanent magnets of the first permanent magnet assembly further include at least a second generally annular permanent magnet. The at least second permanent magnet has an inner diameter larger than the outer diameter of the first permanent magnet. The second permanent magnet has a second magnetization direction parallel to the axis. The at least two coaxial permanent magnets of the second permanent magnet assembly include a third permanent magnet having an outer diameter. The third permanent magnet has a magnetization direction equal to the first magnetization direction of the first permanent magnet. The at least two coaxial permanent magnets of the second permanent magnet assembly further include at least a fourth generally annular permanent magnet. The at least fourth permanent magnet has an inner diameter larger than the outer diameter of the third permanent magnet. The at least fourth permanent magnet has a magnetization direction equal to the second magnetization direction of the at least second permanent magnet.

Furthermore, in accordance with another preferred embodiment of the present invention, the first permanent magnet has a first surface facing the volume. The at least second permanent magnet has a second surface facing the volume. The third permanent magnet has a third surface facing the volume. The at least fourth permanent magnet has a first surface facing the volume. At least part of the second surface is offset from at least part of the first surface by a first distance along the axis, and at least part of the fourth surface is offset from at least part of the third surface by a second distance along the axis. The first distance is substantially equal to the second distance.

Furthermore, in accordance with another preferred embodiment of the present invention, the first permanent magnet has a first surface facing the volume. The at least second permanent magnet has a second surface facing the volume. The third permanent magnet has a third surface facing the volume. The at least fourth permanent magnet has a first surface facing the volume. At least part of the second surface is coplanar with at least part of the first surface, and at least part of the third surface is coplanar with at least part of the fourth surface.

Furthermore, in accordance with another preferred embodiment of the present invention, the first permanent magnet and the third permanent magnet are selected from a disc-like permanent magnet having a circular cross section in a plane perpendicular to the axis, a regular right polygonal prism-like permanent magnet having a regular polygonal cross-section in a plane perpendicular to the axis and having N sides, a ring-like annular permanent magnet and a annular right regular polygonal permanent magnet having N sides.

Furthermore, in accordance with another preferred embodiment of the present invention, N is equal to or larger than eight.

Furthermore, in accordance with another preferred embodiment of the present invention, the at least second and the at least fourth permanent magnets are selected from a ring-like annular permanent magnet and an annular right regular polygonal permanent magnet having N sides.

Furthermore, in accordance with another preferred embodiment of the present invention, N is equal to or larger than eight.

Furthermore, in accordance with another preferred embodiment of the present invention, the first permanent magnet and the third permanent magnet include a plurality of permanently magnetized segments attached to adjacent segments using a non-conductive adhesive, to reduce eddy currents.

Furthermore, in accordance with another preferred embodiment of the present invention, the segments are equi-angular segments.

Furthermore, in accordance with another preferred embodiment of the present invention, the at least second annular permanent magnet and the at least fourth annular permanent magnet include a plurality of permanently magnetized segments attached to adjacent segments using a non-conductive adhesive, to reduce eddy currents.

Furthermore, in accordance with another preferred embodiment of the present invention, the segments are equi-angular segments.

Furthermore, in accordance with another preferred embodiment of the present invention, the first permanent magnet assembly includes a first low magnetic permeability frame for supporting the first permanent magnet and the at least second permanent magnet, and the second permanent magnet assembly includes a second low magnetic permeability frame for supporting the third permanent magnet and the at least fourth permanent magnet.

Furthermore, in accordance with another preferred embodiment of the present invention, the first magnetization direction and the second magnetization direction are parallel to the axis and have the same polarity.

Furthermore, in accordance with another preferred embodiment of the present invention, the first magnetization direction and the second magnetization direction are parallel to the axis and have opposite polarities.

Furthermore, in accordance with another preferred embodiment of the present invention, the at least first electromagnet coil and the at least second electromagnet coil are selected from a circular coil and a regular polygonal shaped coil having N sides.

Furthermore, in accordance with another preferred embodiment of the present invention, N is equal to or larger than eight.

Furthermore, in accordance with another preferred embodiment of the present invention, the first permanent magnet assembly includes a first low magnetic permeability frame for supporting the at least two coaxial permanent magnets included in the first permanent magnet assembly, and the second permanent magnet assembly includes a second low magnetic permeability frame for supporting the at least two coaxial permanent magnets included in the second permanent magnet assembly.

Furthermore, in accordance with another preferred embodiment of the present invention, the first permanent magnet assembly includes a first adjustment mechanism configured for moving at least one of the at least two coaxial permanent magnets of the first permanent magnet assembly with respect to the volume.

Furthermore, in accordance with another preferred embodiment of the present invention, the second permanent magnet assembly includes a second adjustment mechanism configured for moving at least one of the at least two coaxial permanent magnets of the second permanent magnet assembly with respect to the volume.

Furthermore, in accordance with another preferred embodiment of the present invention, the apparatus includes a first gradient coil assembly disposed between the first permanent magnet assembly and the first electromagnet assembly, and a second gradient coil assembly disposed between the second permanent magnet assembly and the second electromagnet assembly.

Furthermore, in accordance with another preferred embodiment of the present invention, each of the first gradient coil assembly and the second gradient coil assembly are non-movably attached within the hybrid magnetic apparatus.

Furthermore, in accordance with another preferred embodiment of the present invention, each of the first gradient coil assembly and the second gradient coil assembly includes one or more gradient coils selected from a x-gradient coil, a y-gradient coil, a z-gradient coil, and any combination thereof.

Furthermore, in accordance with another preferred embodiment of the present invention, each of the first gradient coil assembly and the second gradient coil assembly is a multi-layer printed circuit assembly. At least one of the x-gradient coil, y-gradient coil and z-gradient coil of each of the first gradient coil assembly and the second gradient coil assembly is a substantially planar printed circuit coil.

Furthermore, in accordance with another preferred embodiment of the present invention, the first gradient coil assembly is attached to the first electromagnet assembly.

Furthermore, in accordance with another preferred embodiment of the present invention, the first gradient coil assembly is attached to the first permanent magnet assembly.

Furthermore, in accordance with another preferred embodiment of the present invention, the first gradient coil assembly is attached to a support member. The support member is suitably attached to the hybrid magnetic apparatus.

Furthermore, in accordance with another preferred embodiment of the present invention, the second gradient coil assembly is attached to the second electromagnet assembly.

Furthermore, in accordance with another preferred embodiment of the present invention, the second gradient coil assembly is attached to the second permanent magnet assembly.

Furthermore, in accordance with another preferred embodiment of the present invention, the second gradient coil assembly is attached to a support member. The support member is suitably attached to the hybrid magnetic apparatus.

Furthermore, in accordance with another preferred embodiment of the present invention, the apparatus includes one or more support members attached to the first electromagnet assembly, the second electromagnet assembly, the first permanent magnet assembly, and the second permanent magnet assembly, for supporting the first electromagnet assembly, the second electromagnet assembly, the first permanent magnet assembly, and the second permanent magnet assembly within the apparatus.

Furthermore, in accordance with another preferred embodiment of the present invention, the apparatus further includes an open high magnetic permeability yoke configured for closing the magnetic field lines of the hybrid magnetic apparatus.

Furthermore, in accordance with another preferred embodiment of the present invention, the open high magnetic permeability yoke includes at least one material selected from a ferromagnetic material, a high magnetic permeability material, soft iron, a nickel-iron containing alloy, a silicon-iron containing alloy, low carbon iron, and combinations thereof.

Furthermore, in accordance with another preferred embodiment of the present invention, the open high magnetic permeability yoke is selected from a generally c-shaped yoke, a generally U-shaped yoke, and a generally Y-shaped yoke.

There is further provided, in accordance with another preferred embodiment of the present invention, a method for constructing an open magnetic apparatus for producing a predetermined volume of substantially uniform magnetic field directed parallel to an axis of symmetry of the volume. The method includes the step of providing a first electromagnet assembly disposed at a first position along the axis. The first electromagnet assembly includes at least a first electromagnet coil. The at least first electromagnet coil is radially symmetric with respect to the axis. The method also includes the step of providing a second electromagnet assembly disposed at a second position spaced apart from the first position of the electromagnet assembly along the axis. The second electromagnet assembly includes at least a second electromagnet coil. The at least second electromagnet coil is radially symmetric with respect to the axis. The at least first electromagnet coil and the at least second electromagnet coil are substantially equidistant from the center of the volume. The first electromagnet assembly and the second electromagnet assembly are configured for generating a first magnetic field within the volume. The method also includes the step of providing a first permanent magnet assembly positioned at a third position disposed between the first position and the second position along the axis. The first permanent magnet assembly has an inner surface facing the volume and an outer surface facing the first electromagnet assembly. The first permanent magnet assembly includes at least two coaxial permanent magnets. The at least two permanent magnets are radially symmetric with respect to the axis. The method also includes the step of providing a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes at least two coaxial permanent magnets. The at least two permanent magnets of the second permanent magnet assembly are radially symmetric with respect to the axis. The method also includes the step of positioning the first permanent magnet assembly and the second permanent magnet assembly such that the inner surface of the first permanent magnet assembly and the inner surface of the second permanent magnet assembly define an open region therebetween. The volume is disposed within the open region. The third position of the first permanent magnet assembly and the fourth position of second permanent magnet assembly are substantially equidistant from the center of the volume along the axis. The first permanent magnet assembly and the second permanent magnet assembly generate a second magnetic field superimposed on the first magnetic field to provide the substantially uniform magnetic field within the volume.

Furthermore, in accordance with another preferred embodiment of the present invention, the method further includes the step of providing an open high magnetic permeability yoke configured for closing the magnetic field lines of the hybrid magnetic apparatus.

There is further provided, in accordance with another preferred embodiment of the present invention, a method for tuning an open magnetic apparatus for producing a predetermined volume of substantially uniform magnetic field directed parallel to an axis of symmetry of the volume. The method includes the step of providing a first electromagnet assembly disposed at a first position along the axis, the first electromagnet assembly includes at least a first electromagnet coil, the at least first electromagnet coil is radially symmetric with respect to the axis. The method also includes the step of providing a second electromagnet assembly disposed at a second position spaced apart from the first position of the electromagnet assembly along the axis, the second electromagnet assembly includes at least a second electromagnet coil, the at least second electromagnet coil is radially symmetric with respect to the axis, the at least first electromagnet coil and the at least second electromagnet coil are substantially equidistant from the center of the volume, the first electromagnet assembly and the second electromagnet assembly are configured for generating a first magnetic field within the volume. The method also includes the step of providing a first permanent magnet assembly positioned at a third position disposed between the first position and the second position along the axis, the first permanent magnet assembly has an inner surface facing the volume and an outer surface facing the first electromagnet assembly, the first permanent magnet assembly includes at least two coaxial permanent magnets, the at least two permanent magnets are radially symmetric with respect to the axis. The method also includes the step of providing a second permanent magnet assembly opposed to the first permanent magnet assembly, the second permanent magnet assembly is positioned at a fourth position spaced apart from the third position along the axis, the second permanent magnet assembly has an inner surface facing the volume and an outer surface facing the second electromagnet assembly, the second permanent magnet assembly includes at least two coaxial permanent magnets, the at least two permanent magnets of the second permanent magnet assembly are radially symmetric with respect to the axis. The method also includes the step of positioning the first permanent magnet assembly and the second permanent magnet assembly such that the inner surface of the first permanent magnet assembly and the inner surface of the second permanent magnet assembly define an open region therebetween. The volume is disposed within the open region. The third position of the first permanent magnet assembly and the fourth position of second permanent magnet assembly are substantially equidistant from the center of the volume along the axis. The first permanent magnet assembly and the second permanent magnet assembly generate a second magnetic field superimposed on the first magnetic field to provide the substantially uniform magnetic field within the volume. The method also includes the step of controllably moving at least one of the first electromagnet assembly, the second electromagnet assembly, the first permanent magnet assembly, and the second permanent magnet assembly relative to the volume for improving the homogeneity of the magnetic field within the volume.

Furthermore, in accordance with another preferred embodiment of the present invention, the method further includes the step of providing an open high magnetic permeability yoke configured for closing the magnetic field lines of the hybrid magnetic apparatus, prior to the step of controllably moving.

There is further provided, in accordance with another preferred embodiment of the present invention, a method for operating an open magnetic apparatus for producing a predetermined volume of substantially uniform magnetic field directed parallel to an axis of symmetry of the volume. The method includes the step of providing a first electromagnet assembly disposed at a first position along the axis. The first electromagnet assembly includes at least a first electromagnet coil, the at least first electromagnet coil is radially symmetric with respect to the axis. The method also includes the step of providing a second electromagnet assembly disposed at a second position spaced apart from the first position of the electromagnet assembly along the axis. The second electromagnet assembly includes at least a second electromagnet coil. The at least second electromagnet coil is radially symmetric with respect to the axis. The at least first electromagnet coil and the at least second electromagnet coil are substantially equidistant from the center of the volume. The first electromagnet assembly and the second electromagnet assembly are configured for generating a first magnetic field within the volume. The method also includes the step of providing a first permanent magnet assembly positioned at a third position disposed between the first position and the second position along the axis. The first permanent magnet assembly has an inner surface facing the volume and an outer surface facing the first electromagnet assembly. The first permanent magnet assembly includes at least two coaxial permanent magnets. The at least two permanent magnets are radially symmetric with respect to the axis. The method also includes the step of providing a second permanent magnet assembly opposed to the first permanent magnet assembly. The second permanent magnet assembly is positioned at a fourth position spaced apart from the third position along the axis. The second permanent magnet assembly has an inner surface facing the volume and an outer surface facing the second electromagnet assembly. The second permanent magnet assembly includes at least two coaxial permanent magnets. The at least two permanent magnets of the second permanent magnet assembly are radially symmetric with respect to the axis. The method also includes the step of positioning the first permanent magnet assembly and the second permanent magnet assembly such that the inner surface of the first permanent magnet assembly and the inner surface of the second permanent magnet assembly define an open region therebetween. The volume is disposed within the open region. The third position of the first permanent magnet assembly and the fourth position of second permanent magnet assembly are substantially equidistant from the center of the volume along the axis. The first permanent magnet assembly and the second permanent magnet assembly generate a second magnetic field superimposed on the first magnetic field to provide the substantially uniform magnetic field within the volume. The method also includes the step of electrically energizing the first electromagnet assembly and the second electromagnet assembly to provide a second magnetic field within the volume. The second magnetic field is superimposed on the first permanent magnetic field to provide the substantially uniform magnetic field within the volume.

Furthermore, in accordance with another preferred embodiment of the present invention, the method further includes the step of providing an open high magnetic permeability yoke configured for closing the magnetic field lines of the hybrid magnetic apparatus.

Furthermore, in accordance with another preferred embodiment of the present invention, the method further includes the step of controllably moving at least one of the first electromagnet assembly, the second electromagnet assembly, the first permanent magnet assembly, and the second permanent magnet assembly relative to the high magnetic permeability yoke for improving the homogeneity of the magnetic field within the volume.

Finally, in accordance with another preferred embodiment of the present invention, the open high magnetic permeability yoke includes at least one material selected from a ferromagnetic material, a high magnetic permeability material, soft iron, a nickel-iron containing alloy, a silicon-iron containing alloy, low carbon iron, and combinations thereof.

BRIEF DESCRIPTION OF THE DRAWINGS

In order to understand the invention and see how it may be carried out in practice, several preferred embodiments will now be described, by way of non-limiting example only, with reference to the accompanying drawings, in which like components are designated by like reference numerals.

DETAILED DESCRIPTION OF THE INVENTION

Figure 1:
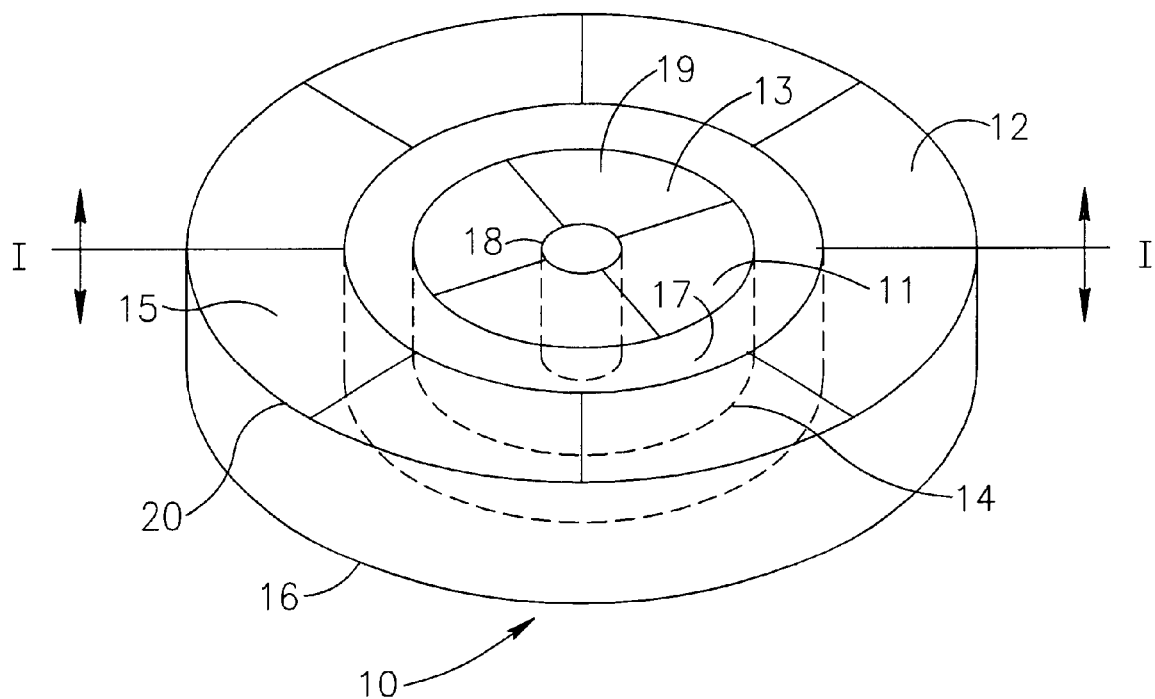
FIG. 1 is a pictorial perspective view of one segmented permanent magnet assembly according to the invention.

The following terms are used throughout the application:

| Term | Definition |
|---|---|
| MRI | Magnetic Resonance Imaging |
| iMRI | Interventional Magnetic Resonance Imaging |
| MRT | Magnetic Resonance Therapy |
| RF | Radio Frequency |
| FOV | Field of View |
| ppm | Parts Per Million |
| HTS | High Temperature Superconductor |
| LTS | Low Temperature Superconductor |

The present invention is based, in part, upon the realization that whole body imaging is not necessary for the performance of an interventional medical procedure on a patient in an MRI system. It has been realized that, in fact, a machine with a restricted field of view performs satisfactorily in such a setting and can be built in a more efficient and economical fashion than one built for accommodating a whole body. Furthermore, in order to leave an open access to reach conveniently the part of the body on which the intervention is performed, the invention is concerned with assemblies that are compact and also do not incorporate ferromagnetic structures for the creation of return paths of the magnetic flux.

In accordance with this invention, permanent magnet assemblies, each formed from a plurality of annular concentric permanent magnets provide a volume of substantially uniform magnetic field extending from a central portion thereof.

The field strength of a single annular permanent magnet along a z-axis perpendicular to its face and passing through its center is given by the following expression, using the center of the permanent magnet as the origin of the coordinate system:

$$B(z) = \frac{\mu_0 \mu \Phi}{2}\left( \frac{z+h/2}{\sqrt{(z+h/2)^2 + b^2}} - \frac{z-h/2}{\sqrt{(z-h/2)^2 + b^2}} - \frac{z+h/2}{\sqrt{(z+h/2)^2 + a^2}} + \frac{z-h/2}{\sqrt{(z-h/2)^2 + a^2}} \right)$$

where:

| | |
|---|---|
| $\mu_0$ | is the permeability of air |
| $\mu$ | is the permeability of the annular permanent magnet |
| $\Phi$ | is the magnetization |
| a | is the inner radius of the annular permanent magnet |
| b | is the outer radius of the annular permanent magnet |
| h | is the height of the annular permanent magnet |

The uniformity of the magnetic field in the volume is based on the fact that any annular single permanent magnet has one point on its axis and located outside its own plane, of maximum or minimum field strength, so that the derivative of the field strength with respect to the z-axis there is zero (i.e. dB/dz=0). It has been realized that by displacing the upper surfaces of a plurality of concentric annular permanent magnets in the assembly from each other, the respective points of zero derivative can be displaced from each other, allowing the magnetic field in the volume to be made uniform to within a defined tolerance by superimposing each of the curves describing the field strength one on top of each other, so that the point of zero derivative of one curve is superimposed on top of the descending or ascending part of the other. In a like manner the upper surfaces themselves can be created with steps to provide additional displaced points of zero derivative.

The permanent magnet assemblies of this invention can be used in various ways. One way of use is to construct a single permanent magnet assembly by itself, to provide the uniform magnetic field adjacent to the upper surface thereof.

Figure 2:
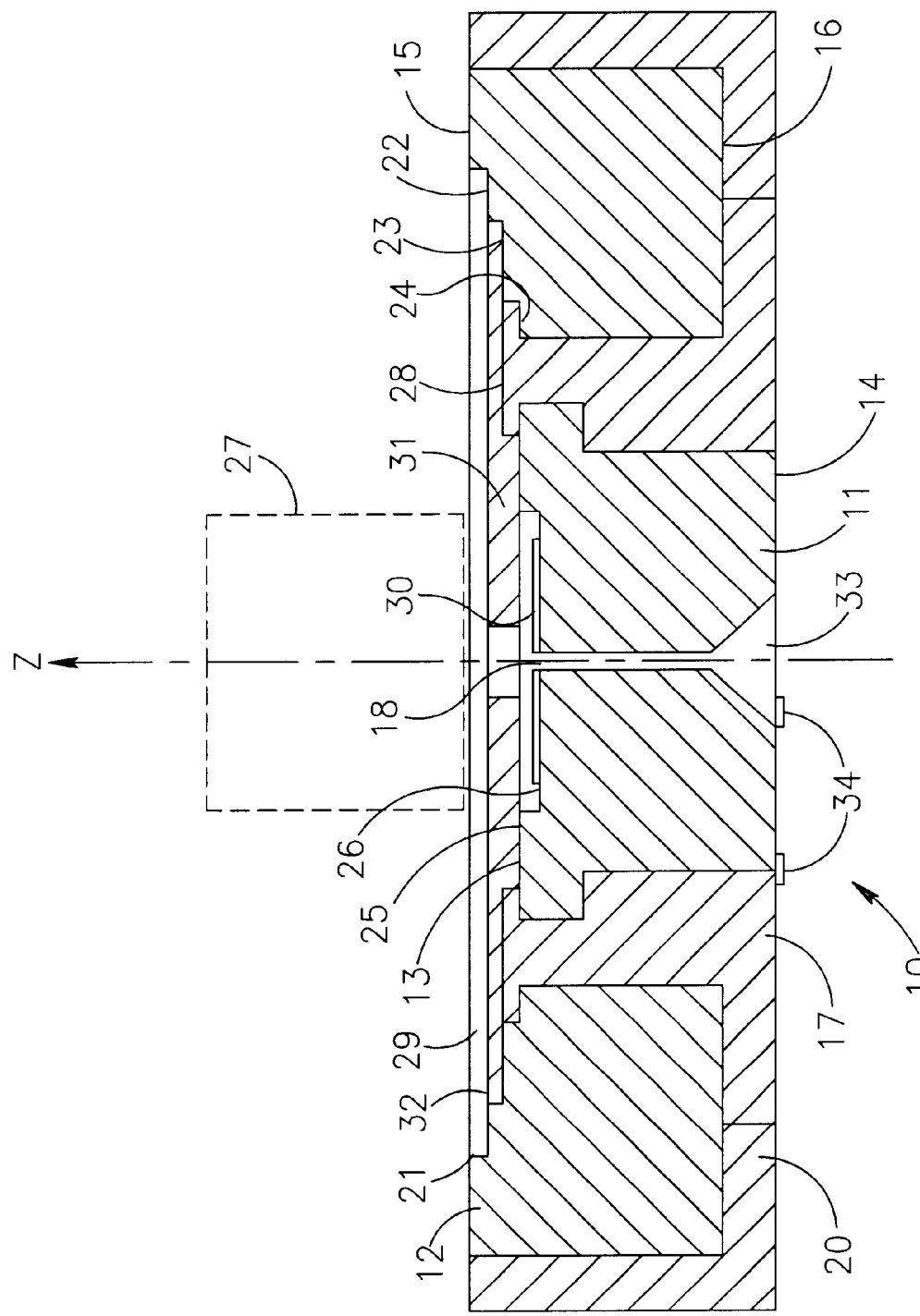
FIG. 2 is a half cross-sectional view through the line I—I in FIG. 1.

FIGS. 1 and 2, taken together, show pictorially one embodiment of the invention wherein a permanent magnet assembly 10 comprises inner and outer aligned annular permanent magnets 11 and 12 formed of Neodymium-Iron-Boron or another suitable permanent magnet material known in the art. The annular permanent magnets 11 and 12 are preferably concentric. The inner annular permanent magnet 11 has a first surface 13 lying in a first plane and a second surface 14 lying in a different plane, each plane being parallel to the x-y plane of the permanent magnet assembly 10. The outer annular permanent magnet 12 has a first surface 15 lying in a second plane and a second surface 16 lying in a different plane, each plane being parallel to the x-y plane of the permanent magnet assembly 10. The inner and outer annular permanent magnets 11 and 12 are interconnected by an intermediate annular band 17 of low permeability material which holds them with their north and south poles aligned in the same direction.

The complete structure comprising the inner annular permanent magnet 11, the outer annular permanent magnet 12 and the intermediate annular band 17 are supported by a support annular band 20 formed of low permeability material surrounding the outer annular permanent magnet 12. If desired, the support annular band 20 may be integral with the intermediate annular band 17, as shown in FIG. 2.

Referring particularly now to FIG. 2, a cross-section of the permanent magnet assembly 10 taken through the line I—I in FIG. 1, the first surface 15 of the outer annular permanent magnet is stepped such that a periphery 21 of the outer annular permanent magnet 12 is higher than successive intermediate portions 22, 23 and 24. Similarly, the first surface 13 of the inner annular permanent magnet 11 has a periphery 25 higher than an intermediate portion 26 thereof. The permanent magnet assembly 10 provides a volume 27 of substantially uniform magnetic field which is adjacent to its upper surface. Uniformity of the magnetic field in the volume 27 is based on the fact that any annular permanent magnet has one point where the derivative of the field strength with respect to the z-axis is zero (i.e. dB/dz=0), in a first direction perpendicular to the face of the magnet. In order to achieve the desired uniformity in the magnetic field of volume 27, the first surface 15 of the outer annular permanent magnet 12 is provided with steps 21, 22, 23, 24 and the first surface 13 of the inner annular permanent magnet 11 is provided with steps 25 and 26 constituting thereby a set of contiguous adjacent annular permanent magnets. Thus, each step produces an additional displaced point of zero derivative on the z-axis, riding on the ascending or descending parts of the curves describing the field strength generated by other steps. Consequently, the permanent magnet assembly 10 provides to the volume 27 a plurality of points for which dB/dz=0, such that the volume 27 of the magnetic field is substantially uniform.

A circular bore 18, its axis constituting the z-axis of the permanent magnet assembly 10, is formed in the inner annular permanent magnet 11 for allowing access from below therethrough of a medical instrument and for allowing an increased length of the medical instrument to protrude from the first surface 13 of the inner annular permanent magnet 11, when the permanent magnet assembly 10 is used in an iMRI application. The circular bore 18 is provided with a conical recess 33 in the second surface 14 of the inner annular permanent magnet 11 of the permanent magnet assembly 10, for partially accommodating the medical instrument. Complete free access is allowed to the volume 27, when the volume is approached by the medical instrument from above. It is noted that the circular bore 18 is optional and that the inner annular permanent magnet 11 may be substituted or replaced by a solid disc-like permanent magnet (not shown) having a circular cross section in a plane perpendicular to the z-axis. Such a disc-like permanent magnet has no bore therein.

In another embodiment of the invention, the inner annular permanent magnet 11 has a series of continuous steps such that the steps take the form of an incline. The incline is also possible on the steps of the outer annular permanent magnet 12.

Figure 3:
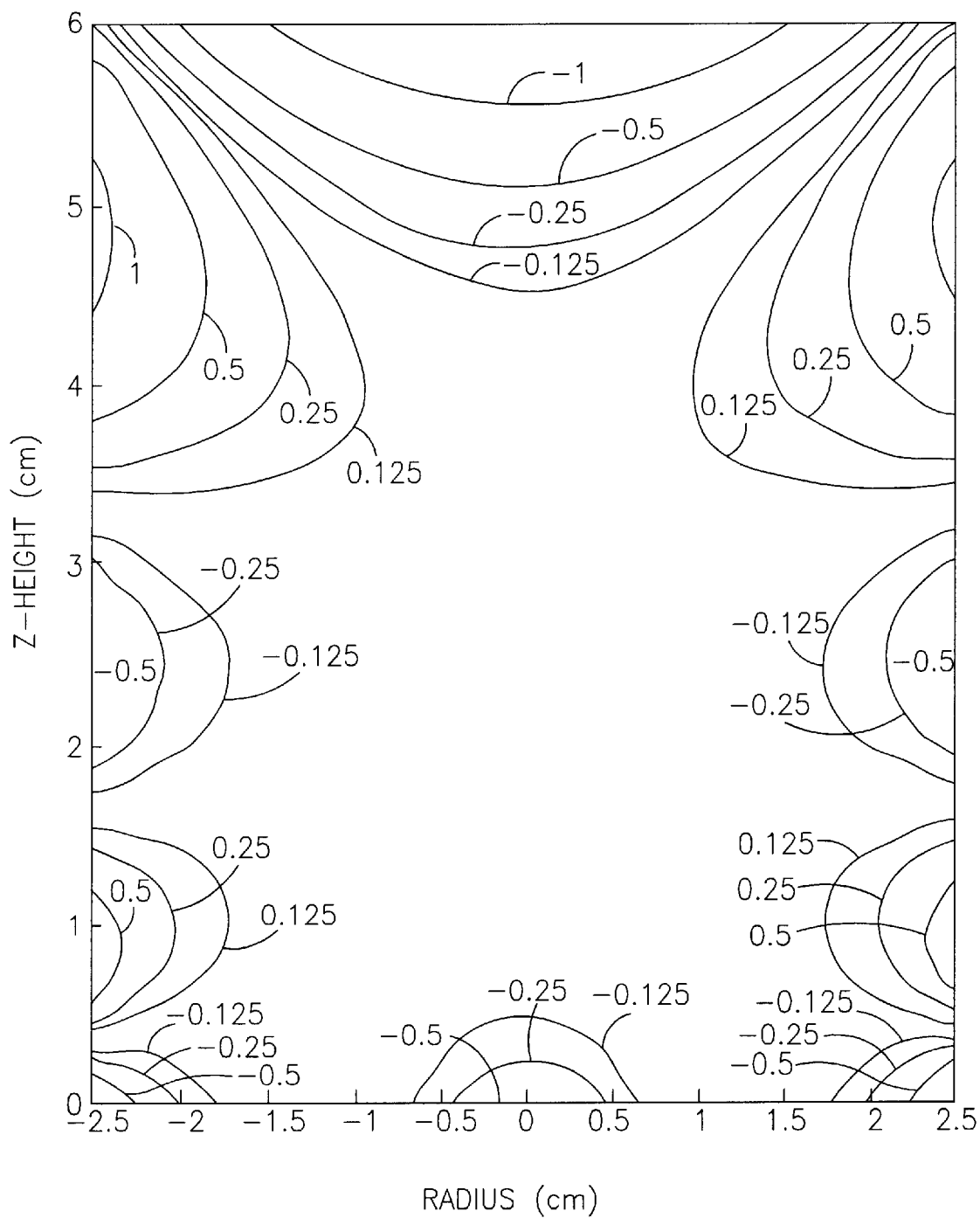
FIG. 3 is a representation of the two dimensional distribution of the magnetic field strength of the permanent magnet assembly of FIG. 1.

It has been found that a magnetic field with a uniformity of approximately 1000 ppm can be achieved prior to shimming, with a permanent magnet assembly 10 as shown in FIGS. 1 and 2. FIG. 3 shows the uniformity (in percentage) of the magnetic field generated by a 30 cm. diameter permanent magnet assembly. The volume 27 in which the uniformity is 1250 ppm or less is a cylinder adjacent to the upper face of the assembly 4.5 cm. in height, with a diameter of 2 cm. The field strength is 785 Gauss.

However, the uniformity of magnetic field strength of the volume 27 can be improved by means of shimming. There are standard shimming techniques, well-known to those skilled in the art of magnet design, referred to as passive shimming and active shimming.

Passive shimming can improve the magnetic field uniformity from orders of approximately 1000 ppm to orders of approximately 100 ppm. Active shimming can improve the magnetic field uniformity from orders of approximately 100 ppm to orders of approximately 10 ppm and less.

Passive shimming is achieved by disposing shaped fragments 30 of magnetic material of various polarities, of mumetal, or of soft iron on, for example, the intermediate portion 26 of the inner annular permanent magnet 11 underneath a multi-layer printed circuit board 32.

Active shimming is achieved by printing shim coils 31 on several layers of the separate layers of the multi-layer printed circuit board 32, the other layers housing the gradient and RF coils, used ordinarily in MRI systems. The multi-layer circuit board is seated in the recess 29, which is defined by the area between the intermediate portion 23 of the outer annular permanent magnet 12, the first surface 28 of the intermediate annular band 17 and above the first surface 13 of the inner annular permanent magnet 11. The multi-layer printed circuit board 32 is thus above the intermediate portion 26 of inner annular permanent magnet 11 and does not touch it. The uniformity of the magnetic field may be further improved by disposing fragments 34 of magnetic material of various polarities, mu-metal or soft iron on, for example, the second surface 14 of the inner annular permanent magnet 11.

In another embodiment of the invention not shown in the drawings, the support annular band 20 and the intermediate annular band 17 are shaped so as to allow the coaxial annular permanent magnets 11 an 12 to be finely displaced and mutually offset along the common z-axis, so as to achieve shimming. In this case, each of the coaxial annular permanent magnets 11 and 12 is connected to a low permeability lower plate via a plurality of radially spaced-apart adjustment screws, attached to and cooperating with the annular permanent magnets 11 and 12. Thus, the turning of the screws a small amount in either clockwise or counterclockwise direction moves the corresponding annular permanent magnet (i.e. 11 or 12) toward or away from the low permeability lower plate and consequently corrects the non-uniformity in the volume 27 of uniform magnetic field to a desired degree.

The permeability of the annular permanent magnets 11 and 12, is temperature dependent so that temperature control can be a method of shimming. A deviation of 1° C. in the magnet temperature generates a change of 1000 ppm in the magnetic field strength. Each annular permanent magnet 11 and 12 has a temperature stabilization means for maintaining a substantially constant temperature of the respective permanent magnet and for varying it thereof for achieving shimming. The means consists of a heater and of a feedback circuit which controls the temperature.

It will be appreciated that modifications to the basic structure of the permanent magnet assembly 10 will be apparent to those skilled in the art, without departing from the spirit of the invention. For example, it is understood that other annular permanent magnet assemblies besides annular permanent magnets 11 and 12 may be employed. Also the size of the annular permanent magnets can vary according to the need.

Additional annular permanent magnets can be inserted between the inner and outer annular permanent magnets 11 and 12, preferably such that an intermediate support means of low permeability material is inserted between each adjacent annular permanent magnet. However, in the extreme embodiment where an external dimension of an internal annular permanent magnet is equal to an internal dimension of an adjacent, external annular permanent magnet, so that the two annular permanent magnets are contiguous, the permanent magnet assembly 10 behaves as though the two contiguous annular permanent magnets are a single structure. In either case, the desired volume 27 of uniform magnetic field is still achieved.

A common problem with magnets is the generation of eddy currents. Eddy currents are induced by momentarily changing the magnetic field as the gradient field is formed. The eddy currents in turn produce a separate magnetic field in the volume 27 of uniform magnetic field. In order to reduce eddy currents, both the inner and outer annular permanent magnets 11 and 12 are formed of segments 19, each of which is permanently magnetized in a known manner and then attached to a neighboring segment, using a non-conductive glue.

Further, it is possible that local heating could be problematic, thus the intermediate annular band 17 may be formed of high thermal conductivity material so as to dissipate heat and reduce heat buildup. In an embodiment where the intermediate annular band 17 is itself formed of electrically conductive material, it too may be slotted radially so as to reduce eddy currents.

Figure 4:
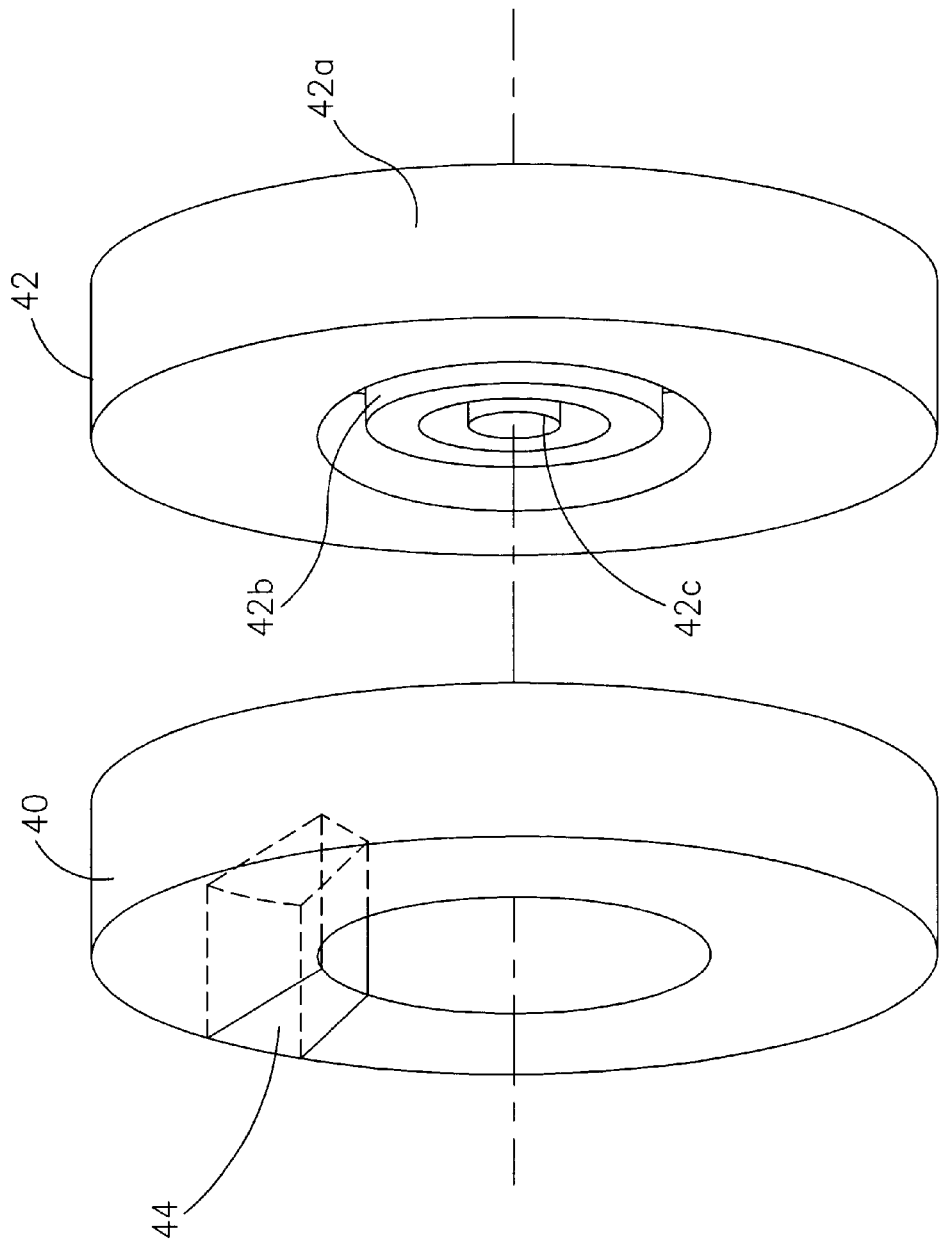
FIG. 4 is a pictorial representation of a first and a second permanent magnet assembly.

Another way to use the permanent magnet assemblies is in opposed pairs, to form the uniform magnetic field therebetween. FIG. 4 is a pictorial representation of a set of first and second permanent magnet assemblies 40 and 42 each consisting of three concentric annular permanent magnets 42a, 42b, 42c and 40a, 40b, 40c (not shown in the drawing). Each permanent magnet assembly is formed of segments 44, electrically insulated from a neighboring segment so as to reduce eddy currents.

Figure 5:
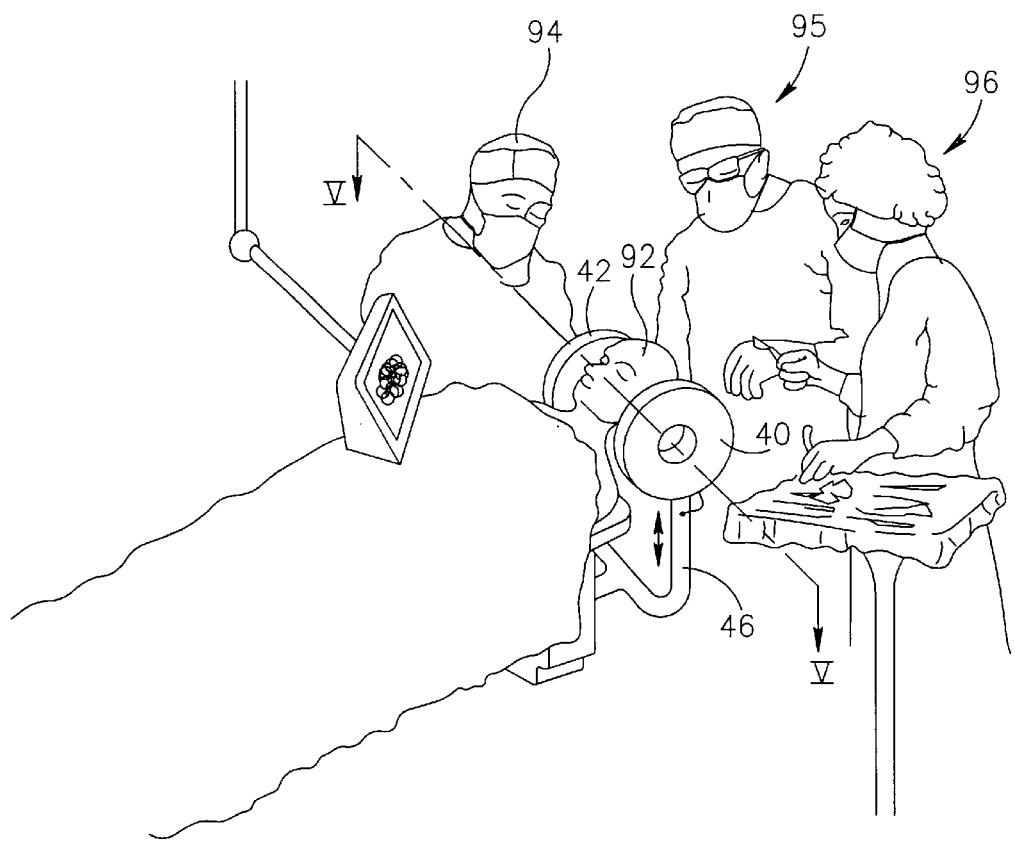
FIG. 5 is a pictorial perspective view of the first and second permanent magnet assemblies connected via a frame used for brain surgery.

FIG. 5 shows pictorially details of the pair of permanent magnet assemblies 40 and 42 joined together via the frame 46 being shaped for imaging a patient's brain 92, as manipulated by a plurality of surgeons 94 and 95 and a nurse 96. The pair of permanent magnet assemblies 40 and 42 joined together via a frame 46 define a region having a volume 27 of substantially uniform magnetic field, between the pair of permanent magnet assemblies 40 and 42.

Figure 6:
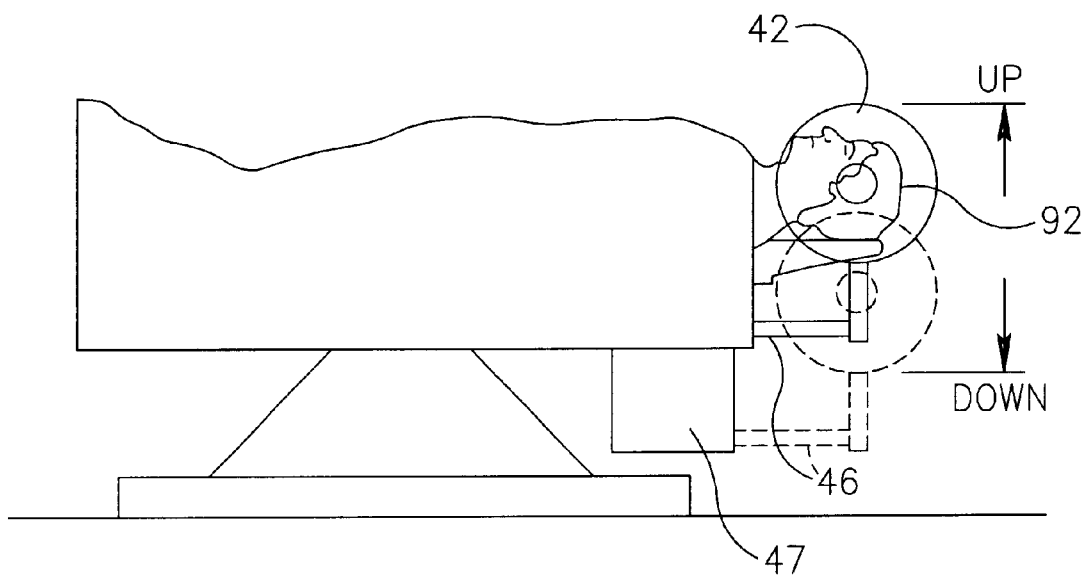
FIG. 6 is a pictorial perspective view of the first and second permanent magnet assemblies shown functionally in FIG. 5, used for performing composite imaging.

FIG. 6 is a pictorial side view of the pair of permanent magnet assemblies 40 and 42 connected via a frame 46, shown pictorially in FIG. 5, used for performing composite imaging. The pair of permanent magnet assemblies 40 and 42 may be moved as a whole in the three directions x, y, and z by a MRI compatible motor control unit 47, to shift the region of volume 27 of uniform magnetic field and thus perform MRI and/or iMRI on different regions of the patient's brain 92. Thus, the volume 27 of uniform magnetic field is shifted in relation to a patient placed between the pair of permanent magnet assemblies 40 and 42. In use, the pair of permanent magnet assemblies 40 and 42 connected via the frame 46 is placed in a first position to produce a first image over a small field of view. The pair of permanent magnet assemblies 40 and 42 connected via the frame 46 is then moved by the motor control unit 47, for example in the up and down directions, so as to produce a series of spatially offset images. These separate spatially offset images are then combined to form a composite image, having a larger field of view.

Figure 7:
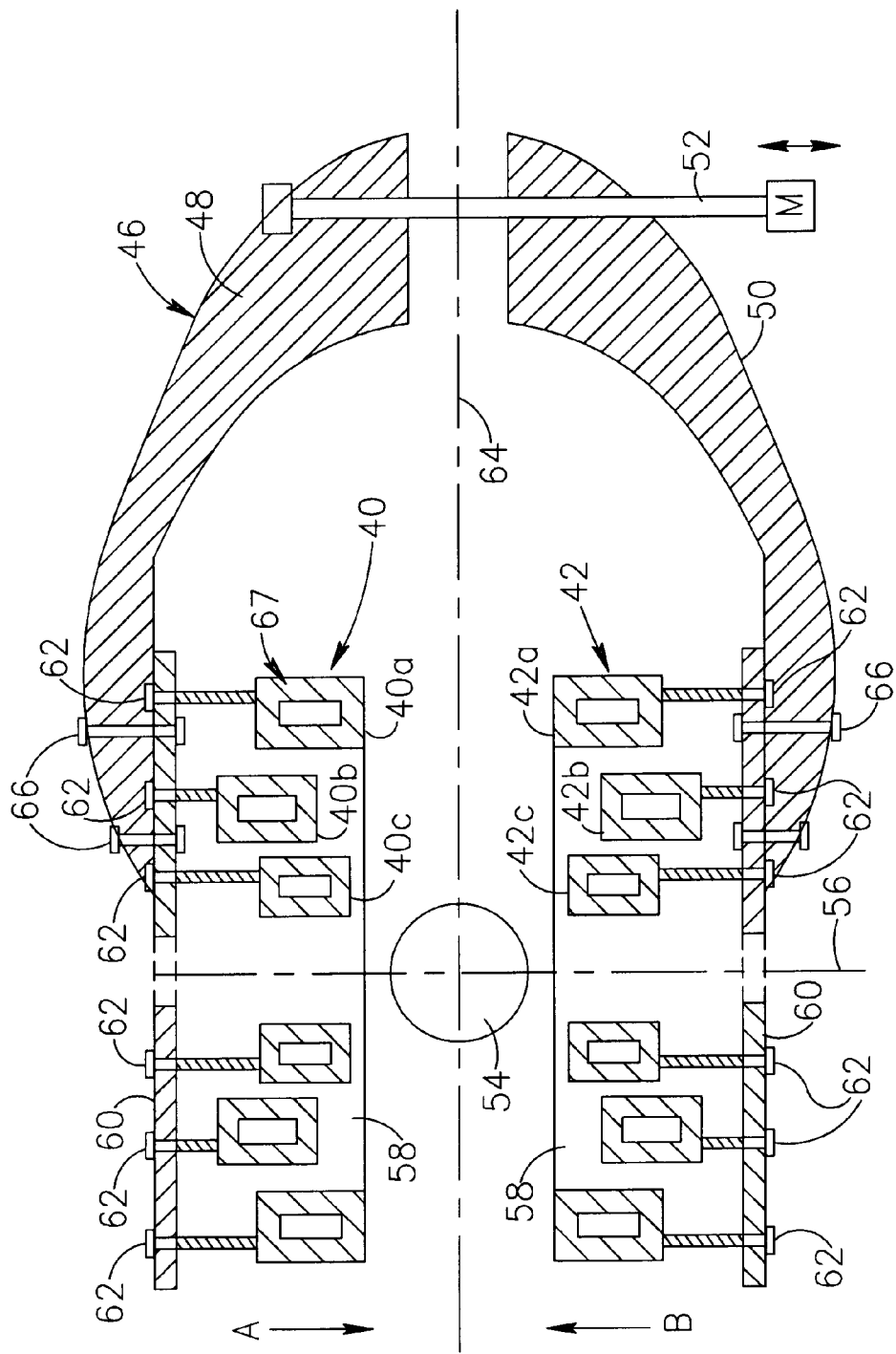
FIG. 7 is a cross-sectional view through the first and second permanent magnet assemblies and connecting means of FIG. 5.

FIG. 7 is a detailed cross-sectional view through the pair of permanent magnet assemblies 40 and 42 along the line V—V in FIG. 5. The frame 46 comprises a set of two symmetrically mounted jaws 48 and 50 joined at an end by a screw 52. An MRI compatible motor designated M is attached to the screw 52 to provide displacement of each of the permanent magnet assemblies 40 and 42 as a whole in an axial direction, to bring the permanent magnet assemblies 40 and 42 either closer together or further apart, for shimming purposes.

Each of the permanent magnet assemblies 40 and 42 includes a plurality of coaxial annular permanent magnets 40a, 40b, 40c and 42a, 42b, 42c which are designed to provide the required volume 27 of uniform magnetic field within a region 54 between the pair of permanent magnet assemblies 40 and 42. Each of the annular permanent magnets 40a, 40b, 40c and 42a, 42b, 42c is enclosed in a low permeability material casing 67. It is noted that FIG. 7 shows only three coaxial annular permanent magnets, for the sake of illustration and description.

Each of the coaxial annular permanent magnets 40a, 40b, 40c and 42a, 42b, 42c is coaxial with a common axis 56 of the corresponding pair of permanent magnet assemblies 40 and 42, respectively. However, the coaxial annular permanent magnets 40a, 40b, 40c and 42a, 42b, 42c themselves are mutually offset along the common axis 56.

The contribution of each annular permanent magnet to the overall field strength combines to generate a plurality of locations of zero derivative in the z-direction allowing the magnetic field in the volume to be made uniform to within a defined tolerance.

The overall field strength along the z-axis 56 of each permanent magnet assembly 40 and 42 is given by:

$$B(z) = \frac{\mu_0 \Phi}{2} \sum_i \mu_i \left( \frac{\Delta z_i + h_i/2}{\sqrt{(\Delta z_i + h_i/2)^2 + b_i^2}} - \frac{\Delta z_i - h_i/2}{\sqrt{(\Delta z_i - h_i/2)^2 + b_i^2}} - \frac{\Delta z_i + h_i/2}{\sqrt{(\Delta z_i + h_i/2)^2 + a_i^2}} + \frac{\Delta z_i - h_i/2}{\sqrt{(\Delta z_i - h_i/2)^2 + a_i^2}} \right)$$

where:

$\Delta z_i = z - z_{0i}$ is the transverse separation, along the symmetry axis 56, of z and $z_{0i}$, a point located midway between the upper and lower surfaces of the $i^{th}$ annular permanent magnet

| | |
|---|---|
| $\Phi$ | is the magnetization |
| $\mu_0$ | the permeability of air |
| $\mu_i$ | is the permeability of the $i^{th}$ annular permanent magnet |
| $a_i$ | is the inner radius of the $i^{th}$ annular permanent magnet |
| $b_i$ | is the outer radius of the $i^{th}$ annular permanent magnet |
| $h_i$ | is the height of the $i^{th}$ annular permanent magnet |

The direction of the z axis for each permanent magnet assembly is towards the volume 27 of uniform magnetic field. The overall field strength is a superposition of the field strengths generated by each assembly.

Each of the coaxial annular permanent magnets 40a, 40b, 40c and 42a, 42b, 42c is fixed to an outer casing 60 via a plurality of radially spaced apart set screws 62, attached to the magnets enclosures 67, cooperating with the respective coaxial enclosures 67 of the annular permanent magnets 42a, 42b, and 42c, for achieving shimming of the permanent magnet assembly 42. It is apparent, as noted above, that the coaxial annular permanent magnets 42a, 42b, 42c are mutually offset along the common axis 56 so as to achieve shimming. Thus, turning of the set screws 62 a small amount in either clockwise or counter-clockwise direction moves the corresponding coaxial annular permanent magnet (i.e. 42a, 42b, 42c etc.) toward or away from the outer casing 60 of the permanent magnet assembly 42 and consequently corrects the non-uniformity in the region 54 of volume 27 of uniform magnetic field to a desired degree.

The free end of the jaws 48 and 50 is fixed to the outer casing 60 of the permanent magnet assemblies 40 and 42 by means of a plurality of fixing bolts 66. The whole structure 46 can be translated along the x, y and z axis by the motor control unit 47 (not shown). Moreover, each of the jaws 48 and 50 may be rotated away from its opposing jaw by the motor control unit 47, around an axis passing along screw 52, to allow the surgeon to have complete free access to one side of the patient. The bolts 66 may also be displaced, so that the respective pair of permanent magnet assemblies 40 and 42 may be moved in the direction of arrows A and B and thus accomplish shimming.

Figure 8:
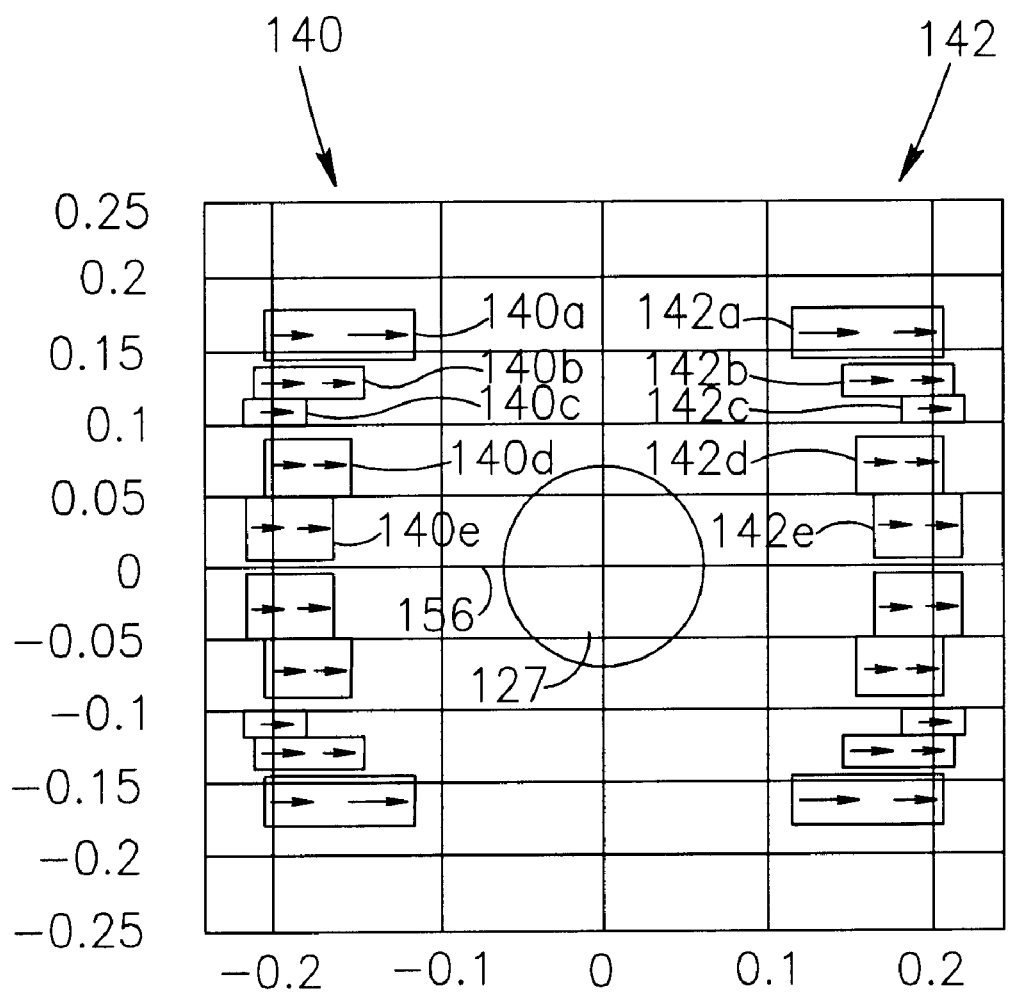
FIG. 8 is a schematic representation of first and second permanent magnet assemblies in which each permanent magnet assembly has five annular ring magnets.

FIG. 8 is a schematic representation of an embodiment of the invention including five coaxial annular permanent magnets 140a, 140b, 140c, 140d, 140e and 142a, 142b, 142c, 142d, 142e of the pair of permanent magnet assemblies 140 and 142. The dimensions of the five coaxial annular permanent magnets are shown in meters. The magnetic polarity of the coaxial annular permanent magnets creates a volume 127 of homogenous magnetic field.

Inasmuch as the pair of permanent magnet assemblies 140 and 142 are identical in the embodiment thus far as described in FIG. 7, only one permanent magnet assembly containing five coaxial annular permanent magnets will be described in detail. However, it is understood that the pair of permanent magnet assemblies 140 and 142 need not be identical. Rather, the pair of permanent magnet assemblies 140 and 142 can have an unequal number of annular permanent magnets.

Thus, in FIG. 8, the coaxial annular permanent magnets 140, 140b, 140c, 140d, 140e in the permanent magnet assembly 140 may be finely displaced for shimming either towards or away from the complementary coaxial annular permanent magnets 142a, 142b, 142c, 142d, and 142e in the opposing permanent magnet assembly 142 along the common axis 156. An air gap of approximately 5 millimeters is provided between the adjacent coaxial annular permanent magnets 140a and 140b with an increased air gap of approximately 10 millimeters provided between the adjacent coaxial annular permanent magnets millimeters 140c and 140d. The remaining adjacent coaxial annular permanent magnets 140b, 140c and 140d, 140e are contiguous. Further, the overall average displacement between the pair of permanent magnet assemblies 140 and 142 is approximately 25 cm. and their approximate radius is 18 cm. The two opposing magnets weigh together 120 kg. The diameter of the spherical volume 127 of uniform magnetic field is 16 cm.

Figure 9:
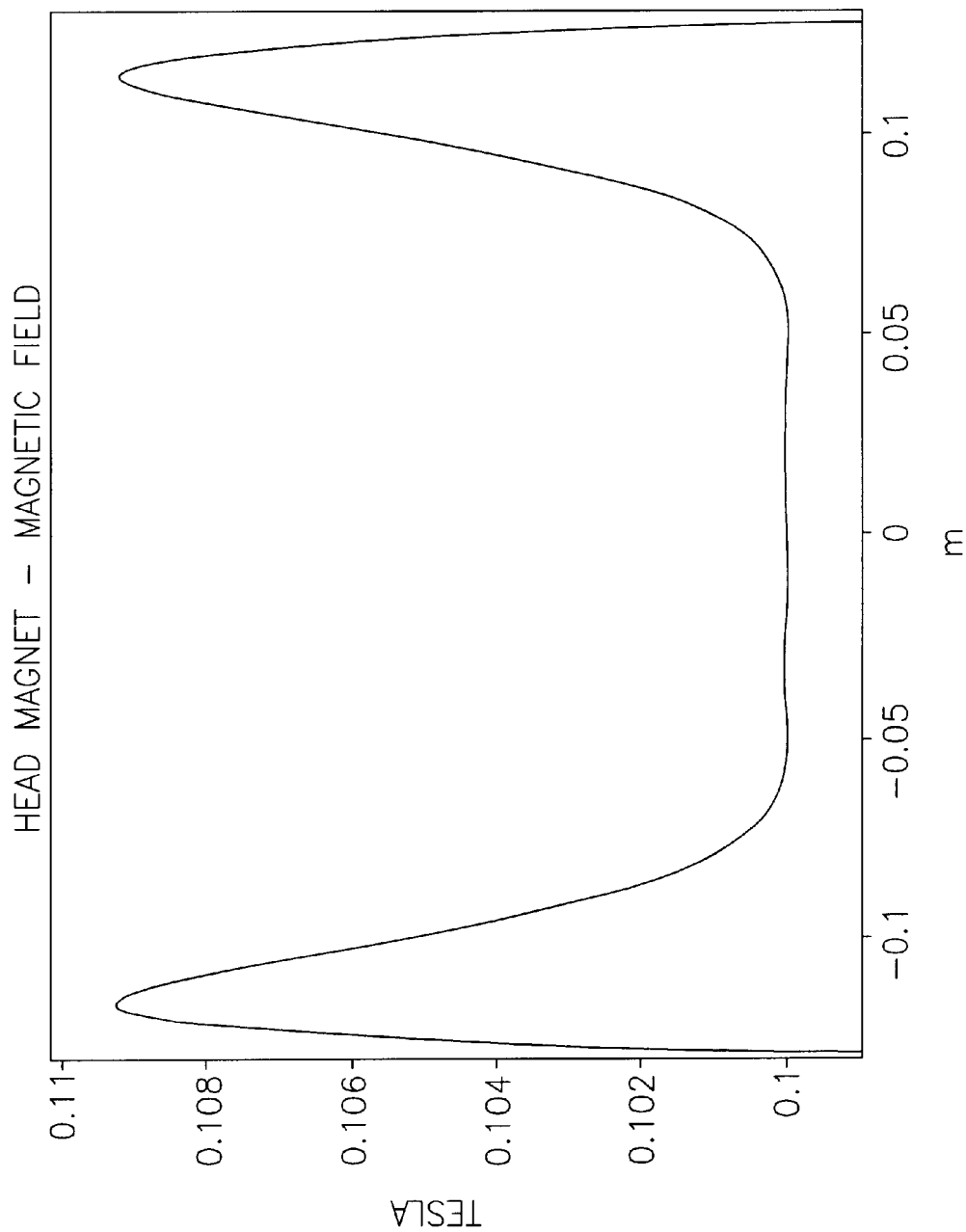
FIG. 9 is a graph showing the magnetic field strength as a function of displacement along the z-axis between the first and second permanent magnet assembly of FIG. 8.
Figure 10:
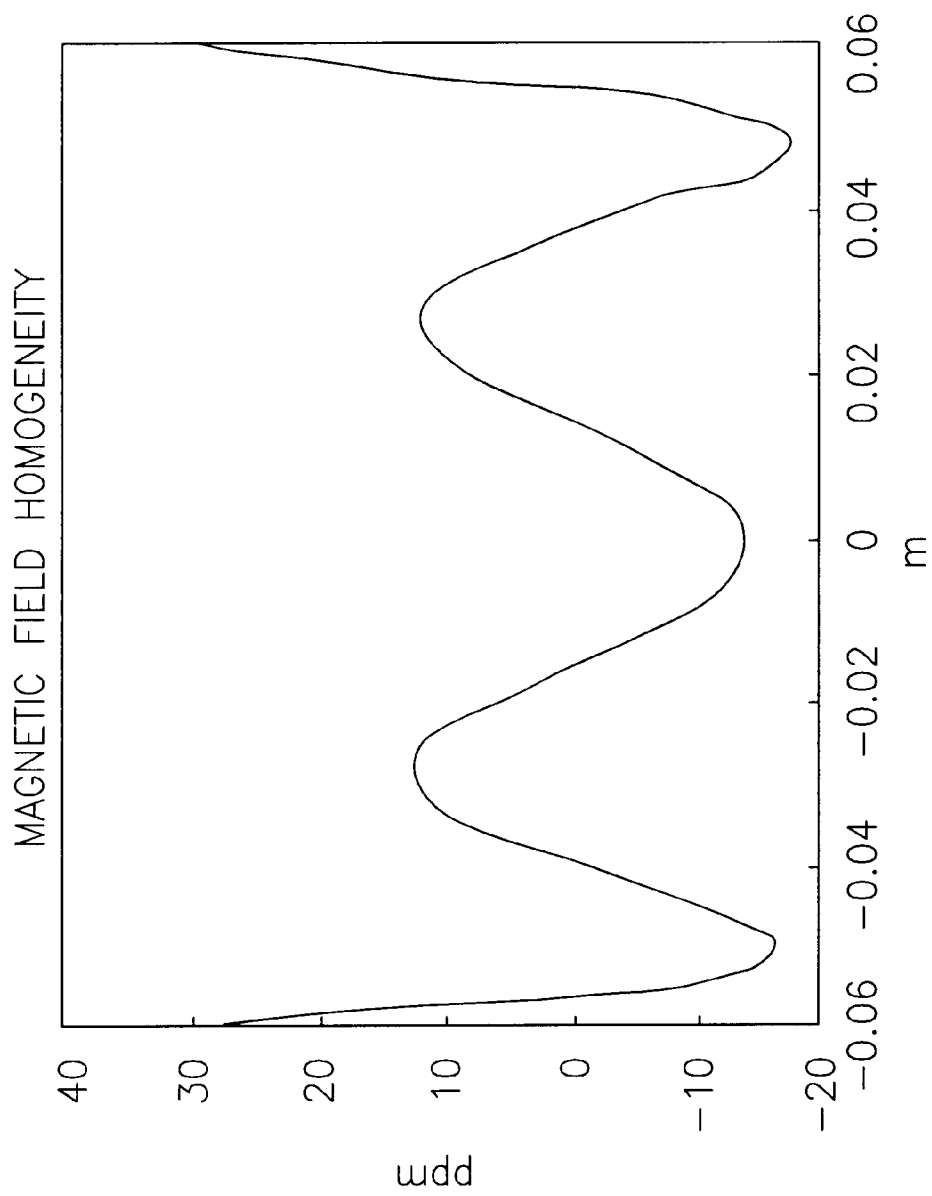
FIG. 10 is a graphical representation showing the deviation from uniform magnetic field along the z-axis between the first and second permanent magnet assembly of FIG. 8.

FIG. 9 is a graph showing magnetic field strength as a function of displacement along the z-axis, at a given value of y. It is seen that the field strengths of the opposing permanent magnet assemblies 40 and 42 superimpose so as to form a region 54 of a volume 27 of substantially homogenous magnetic field having a magnitude of approximately 1000 Gauss. FIG. 10 is a graphical representation of the magnetic field in volume 27 along the z-axis, showing the uniformity in ppm. The effect of superposition of curves having spaced apart maxima is illustrated.

As noted above, a particular design feature of the permanent magnet assembly 10 is the ease with which shimming may be used to achieve a volume 27 of very high magnetic field uniformity typically to within several ppm.

Figure 11:
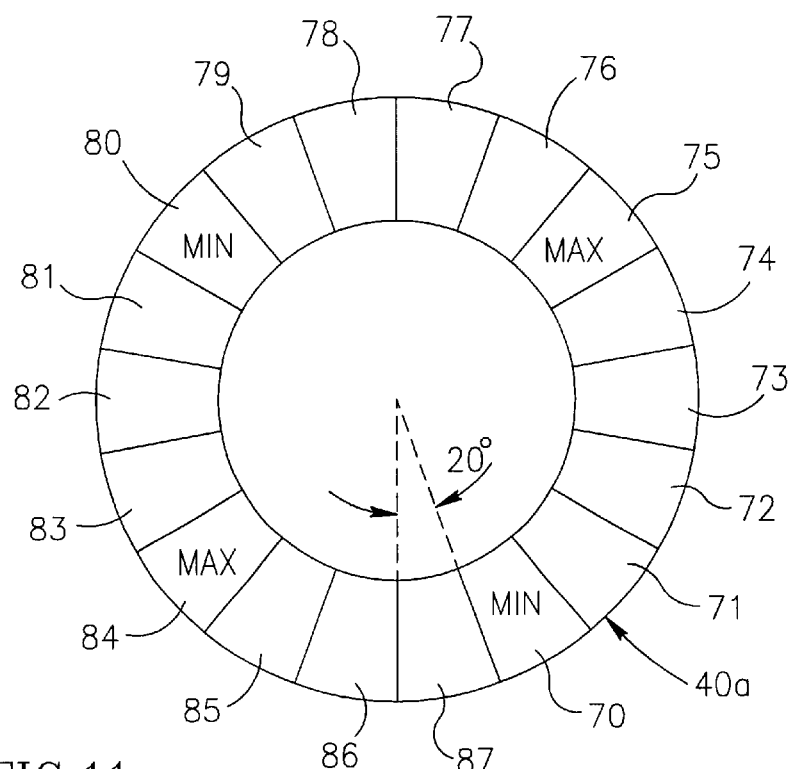
FIG. 11 shows schematically a detail of the segmented construction of the first and second permanent magnet assemblies, according to a preferred embodiment of the invention.

FIG. 11 shows schematically a detail of the construction of the coaxial annular permanent magnet 40a. Each coaxial annular permanent magnet comprises eighteen permanently magnetized segments 70 to 87 which are supplied in batches and are normally guaranteed by the manufacturer to have a peak to peak variation in magnetic field of 1%. The segments 70 to 87 each subtend an angle of 200 at the center of the coaxial annular permanent magnet 40a and are joined by an electrically non-conductive adhesive so as to reduce eddy currents, as explained above.

Owing to the slight difference in magnetic field between different segments 70 to 87 in each batch, it is often difficult to achieve a volume 27 of even a coarse magnetic field uniformity in the region 54 between a pair of opposing permanent magnet assemblies 40 and 42. It will be understood that at least a coarse magnetic field uniformity is a prerequisite to the fine tuning achieved using passive and active shimming.

Figure 12A:
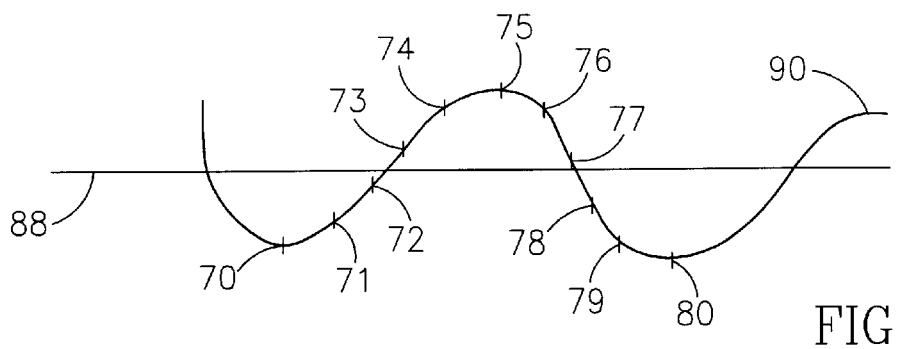
FIGS. 12a and 12b graphically illustrate a preferred mutual disposition of opposing first and second permanent magnet assemblies having complementary magnetic field variations.
Figure 12B:
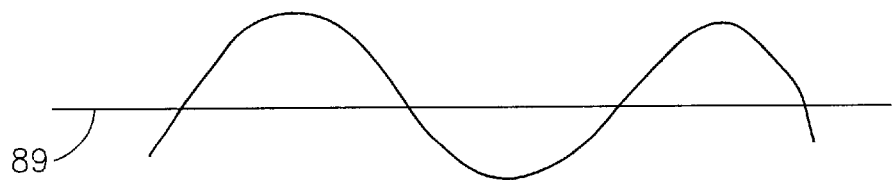

FIGS. 12a and 12b show graphically how such a volume 27 of coarse magnetic field uniformity is achieved, notwithstanding the inherent variation in magnetic field of different segments 70 to 87. The magnetic field of different segments 70 to 87 is measured and adjacent segments are selected from the batch having slightly different field strengths so as to follow a substantially cyclic curve 90. Thus, as shown in FIGS. 11 and 12a, the particular segments 70 and 80 have a minimum magnetic field as compared to segment 85 which has a maximum magnetic field. The segments from 70 to 75 have increasing magnetic fields following the cyclic curve 90 in contrast to segments from 75 to 80 which have decreasing magnetic fields following the cyclic curve 90. Each of the pair of permanent magnet assemblies 40 and 42 is constructed according to this approach and are then opposed to one another in anti-phase such that the relationship of the corresponding magnetic fields of the pair of permanent magnet assemblies 40 and 42 corresponds to the two anti-phase cyclic curves shown in FIGS. 12a and 12b. The variations in magnetic field from its average value as described by lines 88 and 89 along the two cyclic curves then exactly cancel each other out, such that a region 54 between the pair of permanent magnet assemblies 40 and 42 has a volume 27 of uniform magnetic field.

It will be appreciated that, due the limited magnetic field magnitude achievable by using commercially available permanent magnets (such as, for example, Neodymium-Iron-Boron magnets), the magnitude of the substantially uniform magnetic field which is typically achievable within the imaging volume of such permanent magnetic probes is within the range of approximately 0.1–0.3 Tesla (1000–3000 Gauss). However, in many cases it is desirable to increase the magnitude of the magnetic field within the imaging volume. Increasing the magnitude of the magnetic field improves the signal to noise ratio (S/N) which improves image resolution and enables reducing the time required for image acquisition. The latter may be particularly advantageous for inter-operative MRI in which it is desirable to minimize the time required for image acquisition during the performance of surgery on a patient.

Trying to increase the magnitude of the magnetic field within the imaging volume by designing larger permanent magnet assemblies has practical limits since increasing the size of the annular permanent magnets is relatively inefficient because the intensity of the magnetic field is inversely proportional to the third power of the distance of the magnetic material from the imaging volume. Therefore, adding additional annular permanent magnets of larger diameters has a practical limit due to the prohibitive cost of the magnetic material. Additionally, increasing the diameter of the permanent magnet assemblies beyond a certain size is not desirable because it may limit access to the imaged organ or body part during surgery.

Figures 13, 14:
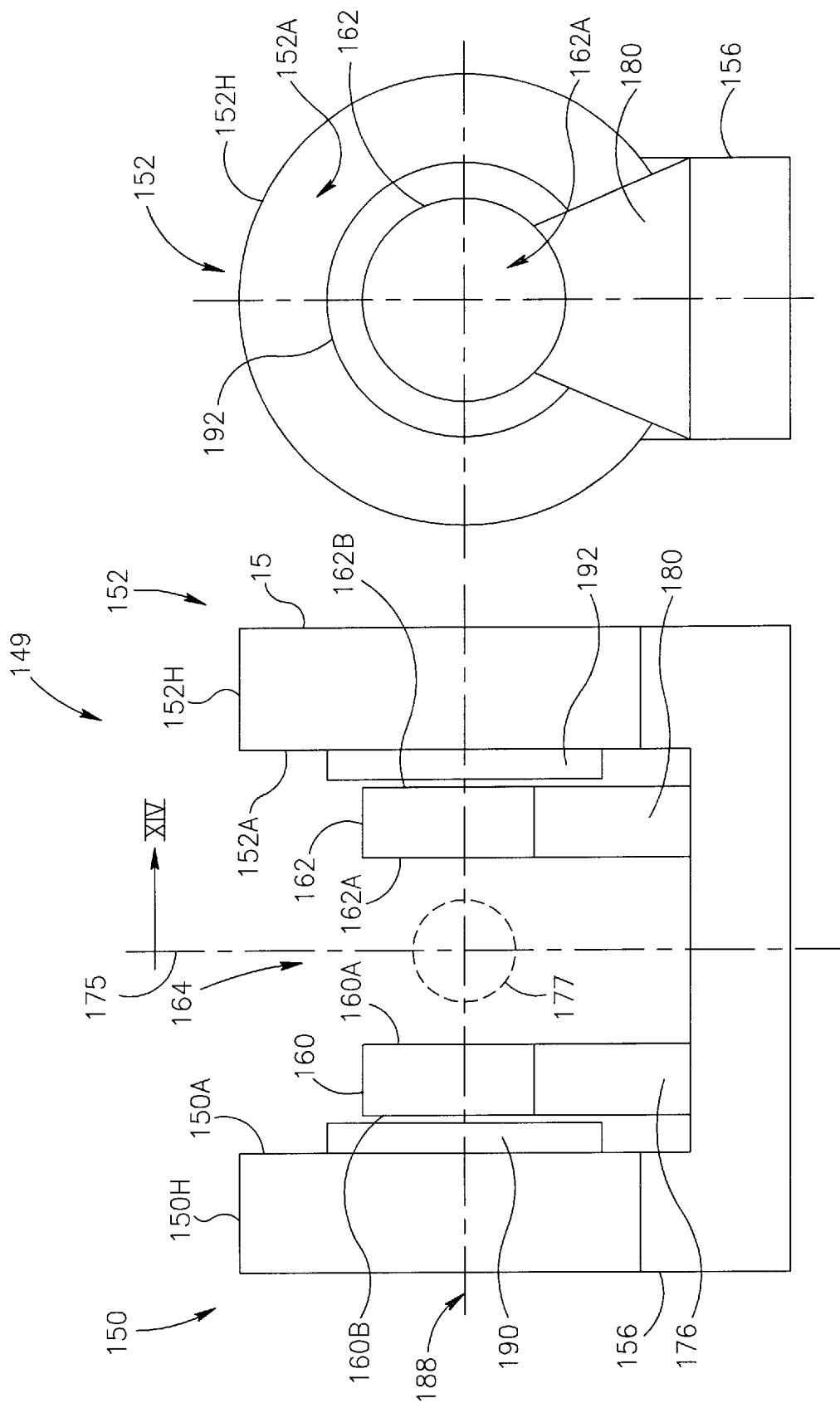
FIG. 13 is a schematic diagram illustrating a front view of an open hybrid magnetic apparatus for MRI/iMRI including an electromagnet flux generator and permanent magnet assemblies, in accordance with another preferred embodiment of the present invention.
FIG. 14 is a cross sectional view of the hybrid magnetic apparatus of FIG. 13, taken along the lines XIV—XIV.
Figure 15:
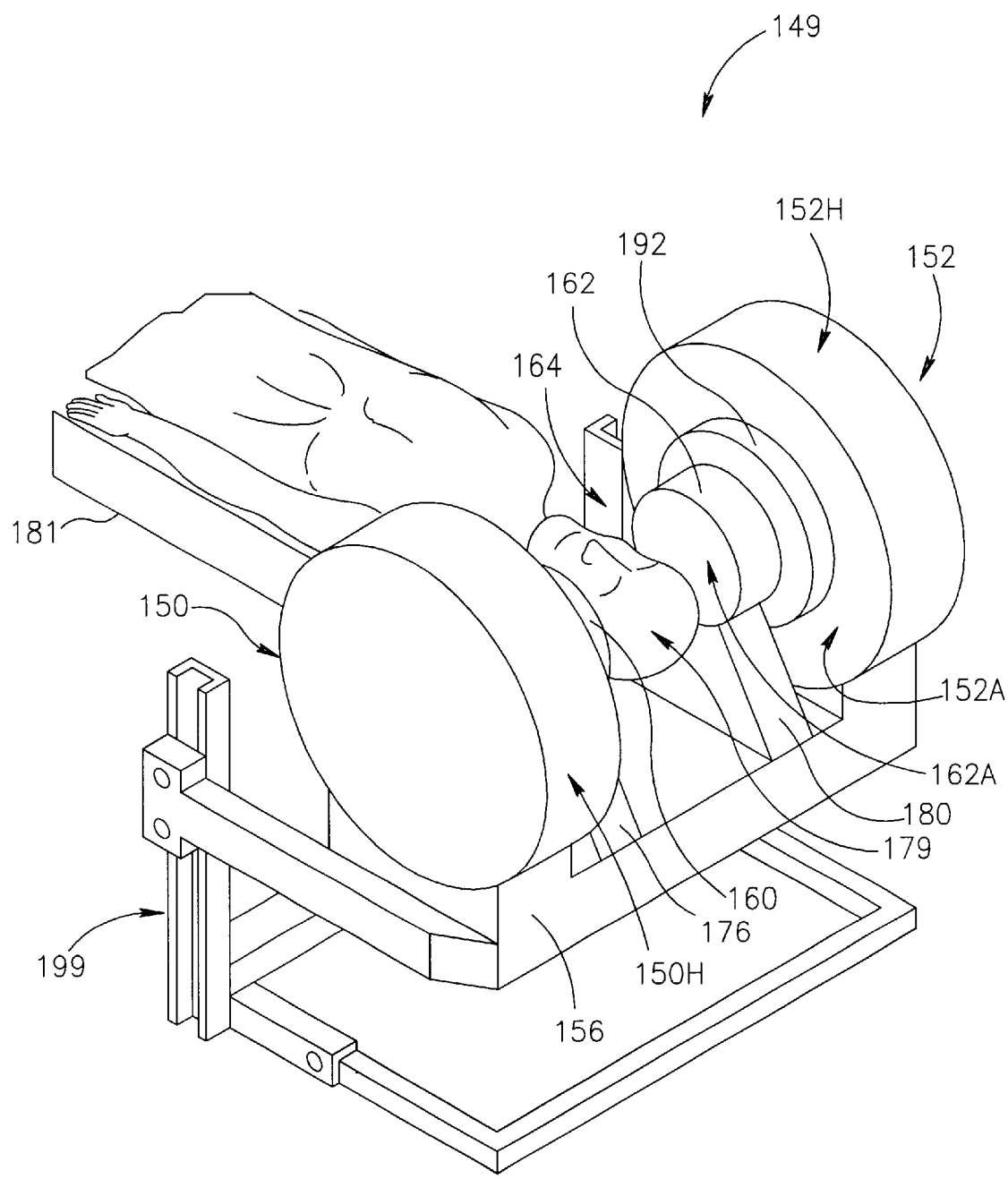
FIG. 15 is an isometric view illustrating the hybrid magnetic apparatus of FIG. 13 attached to a motorized gantry with a head of a patient disposed in the open region of the apparatus in a position suitable for imaging.

Reference is now made to FIGS. 13–15. FIG. 13 is a schematic diagram illustrating a front view of an open hybrid magnetic apparatus for MRI/iMRI including an electromagnet flux generator and permanent magnet assemblies, in accordance with another preferred embodiment of the present invention. FIG. 14 is a cross sectional view of the hybrid magnetic apparatus of FIG. 13, taken along the lines XIV—XIV. FIG. 15 is an isometric view illustrating the hybrid magnetic apparatus of FIG. 13 attached to a motorized gantry with a head of a patient disposed in the open region of the apparatus in a position suitable for imaging.

The magnetic apparatus 149 of FIG. 13 includes an electromagnetic flux generator including two opposing electromagnet assemblies 150 and 152. The electromagnet assemblies 150 and 152 include housings 150H and 152H, respectively. The housings 150H and 152H are attached to a base member 156. The electromagnet assemblies 150 and 152 are generally cylindrically shaped and are spaced apart from each other, However, the electromagnet assemblies 150 and 152 may have any other suitable shape depending, inter alia, on the type and detailed design of the electromagnet assemblies used, the type and arrangement of electromagnet coils (not shown) included in the electromagnet assemblies 150 and 152 and on the detailed design of the housings 150H and 152H as disclosed in detail hereinafter. The housing 150H has an internal, surface 150A and the housing 152H has an internal surface 152A. The internal surface 150A faces the internal surface 152A.

The magnetic apparatus 149 further includes two opposing permanent magnet assemblies 160 and 162. The permanent magnet assemblies 160 and 162 are attached to the base 156 by two mounting members 176 and 180, respectively. The permanent magnet assembly 160 has an inner surface 160A and an outer surface 160B. The permanent magnet assembly 162 has an inner surface 162A and an outer surface 162B. The inner surfaces 160A and 162A define an open region 164 therebetween, an imaging volume 177 is positioned within the open region 164. The dashed line 175 represents the line of intersection of a mid-plane (not shown) with the plane in which the cross section of FIG. 13 lies (represented by the plane of the page of the drawing of FIG. 13). The mid-plane is equidistant from the surfaces 160A and 162A. The mid-plane is also equidistant from the surfaces 150A and 152A of the housings 150H and 152H, respectively.

The magnetic apparatus 149 further includes two opposing gradient coil assemblies 190 and 192. The gradient coil assembly 190 is disposed between the surface 150A of the housing 150H and the outer surface 160B of the permanent magnet assembly 160. The gradient coil assembly 192 is disposed between the surface 152A of the housing 152H and the outer surface 162B of the permanent magnet assembly 162. Each of the gradient coil assemblies 190 and 192 may include an x-gradient coil a y-gradient coil and a z-gradient coil and may be constructed similar to the multi-layer printed circuit assemblies disclosed in detail by Zuk et al. and illustrated in FIGS. 5–8 of U.S. patent application Ser. No. 09/161,336. The gradient coil assemblies 190 and 192 are disposed outside of the open region 164 which increases the space available within the open region 164 as disclosed in detail in U.S. patent application Ser. No. 09/161,336.

It is noted that, the gradient coil assembly's structure and positioning may be any suitable structure and positioning which is known in the art including, but not limited to, all the different structures and arrangements of gradient coils or gradient coil combinations (or gradient coil pair arrangements) disclosed in detail in U.S. patent application Ser. No. 09/161,336 to Zuk et al.

Similarly, the transmitting and receiving RF coils (not shown) which are used for imaging with the magnetic apparatus 149 of the present invention, may have any suitable known structure and spatial position which is known in the art of RF coils including, but not limited to, all the different structures and arrangements of RF coils disclosed in detail in U.S. patent application Ser. No. 09/161,336 to Zuk et al.

Each of the permanent magnet assemblies 160 and 162 includes a plurality of generally annular or disc-like permanent magnets (not shown in FIG. 13 for the sake of clarity of illustration). The line 188 of FIG. 13 represents the common axis passing through the geometrical center of all the annular permanent magnets of the permanent magnet assemblies 160 and 162 (and through the geometrical center of the disc-like permanent magnets if they are included in the permanent magnet assemblies 160 and 162) as disclosed in detail hereinbelow (see FIG. 16). The axis 188 is also defined as the z-axis of the hybrid magnetic apparatus 149. The main magnetic field generated by the magnetic apparatus 149 within the imaging volume 177 is directed in parallel to the z-axis 188.

The structure and arrangement of the permanent magnets composing the permanent magnet assemblies 160 and 162 has been disclosed in detail hereinabove and in U.S. patent application Ser. No. 09/161,336, to Zuk et al. In accordance with a preferred embodiment of the present invention, the shape and arrangement of the annular permanent magnets of permanent magnet assembly 160 may be similar to the shape and arrangement of the annular permanent magnets 40a, 40b and 40c of permanent magnet assembly 40 of FIGS. 4–7 and the shape and arrangement of the annular permanent magnets of permanent magnet assembly 162 may be similar to the arrangement of the annular permanent magnets 42a, 42b and 42c of permanent magnet assembly 42 of FIGS. 4–7.

In accordance with another preferred embodiment of the present invention, the shape and arrangement of the annular permanent magnets of permanent magnet assembly 160 may be similar to the shape and arrangement of the annular permanent magnets 140a, 140b and 140c of permanent magnet assembly 140 of FIG. 8 and the shape and arrangement of the annular permanent magnets of permanent magnet assembly 162 may be similar to the arrangement of the annular permanent magnets 142a, 142b and 142c of permanent magnet assembly 142 of FIG. 8.

In accordance with yet another preferred embodiment of the present invention, each of the permanent magnet assemblies 160 and 162 may be constructed similar to the permanent magnet assembly 10 of FIGS. 1–2, with the proviso that the permanent magnet assemblies 160 and 162 are arranged within the apparatus 149 such that the permanent magnet assembly 160 is oriented as a mirror image of the permanent magnet assembly 162 with respect to the mid-plane (not shown) equidistant from the surfaces 150A and 152A of the electromagnet assemblies 150 and 152, respectively. However, the orientation of magnetization of the two annular permanent magnets included within any of the complementary opposing pairs of the annular permanent magnets of the permanent magnet assemblies 160 and 162 are identical, while different pairs of opposing complementary annular permanent magnets may have their magnetization directions oriented parallel or anti parallel to each other, depending on the specific design of the magnetic assemblies as disclosed in detail hereinabove and illustrated in FIG. 8. And as disclosed in detail by Zuk et al. in U.S. patent application Ser. No. 09/161,336.

In accordance with yet another preferred embodiment of the present invention, the permanent magnet assemblies 160 and 162 may be constructed similar to the permanent magnet assemblies disclosed in U.S. patent application Ser. No. 09/161,336, to Zuk et al.

Figure 16:
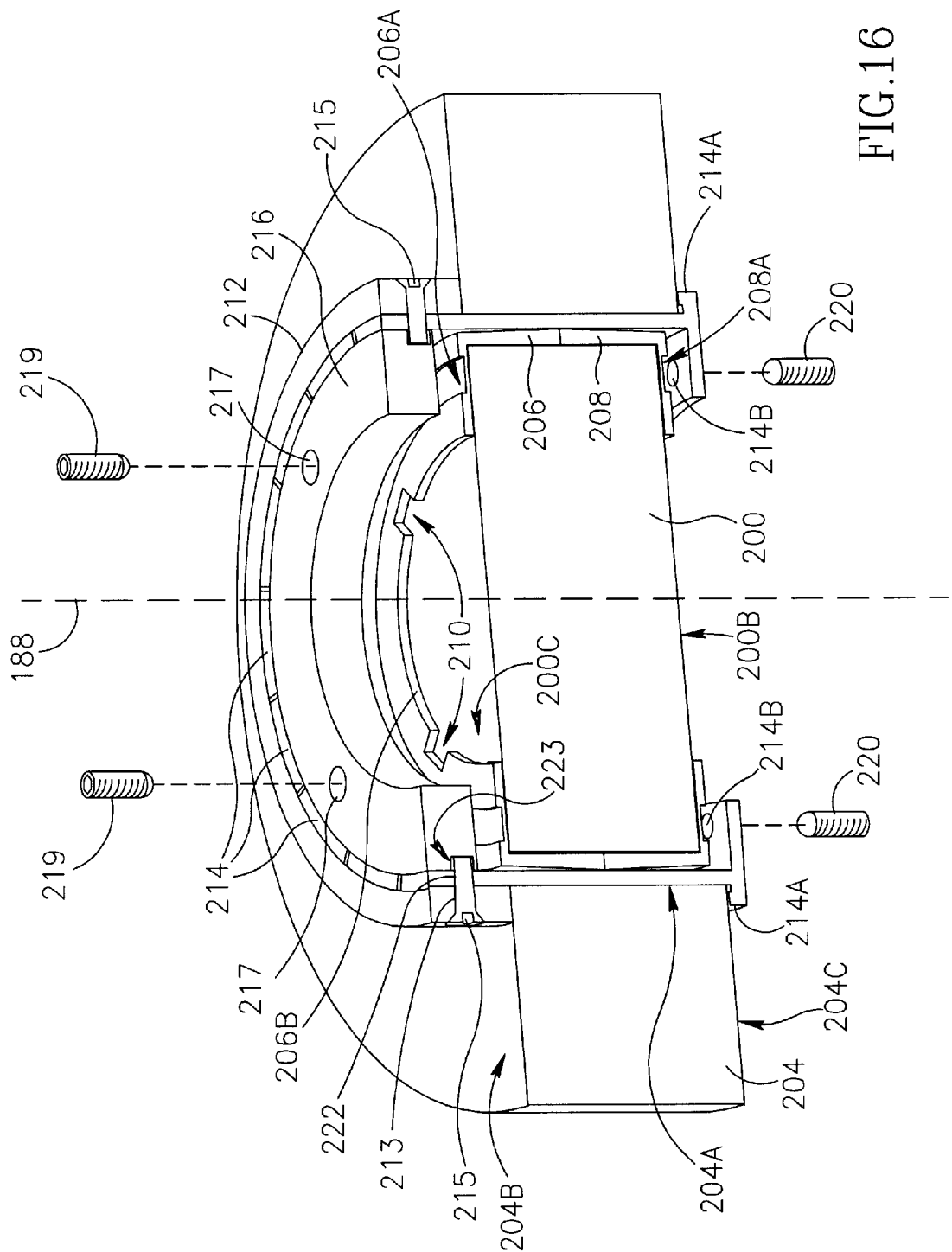
FIG. 16 is a part isometric, part cross-sectional exploded diagram illustrating a part of one of the permanent magnet assemblies of FIG. 13 in detail.

Reference is now made to FIG. 16 which is a part isometric, part cross-sectional exploded diagram illustrating a part of the permanent magnet assembly 160 of FIG. 13 in detail. The magnet assembly 160 includes a first disc-like permanent magnet 200 having an inner surface 204B and an outer surface 204C, and a second annular permanent magnet 204 having an inner surface 200B and an outer surface 200C. The z-axis 188 passes through the geometrical center of the permanent magnets 200 and 204 which are concentrically arranged with respect to the z-axis 188. The surfaces 200B and 200C are parallel surfaces and are substantially perpendicular to the z-axis 188. The surfaces 204B and 204C are parallel surfaces and are also substantially perpendicular to the z-axis 188. The magnet assembly 160 also includes two magnet protecting members 206 and 208. The magnet protecting members 206 and 208 are attached or glued to the first permanent magnet 200 and are preferably made from a non-ferromagnetic, and preferably non-electrically conducting material such as plastic, fiberglass or the like, but other suitable materials may also be used. The magnet protecting members 206 and 208 have annular notches 206A and 208A, respectively, therewithin. The magnet protecting member 206 has a plurality of rectangular notches 210 therein which are distributed along the inner circumference 206B thereof.

The magnet assembly 160 also includes an outer supporting ring-like member 212 and an inner ring-like supporting member 216. The supporting members 212 and 216 are preferably made from non-ferromagnetic, electrically non-conducting material such as, plastic, fiberglass or the like, but other suitable materials may also be used. The outer supporting member 212 is attached to the annular permanent magnet 204 by a suitable glue or by other suitable attaching means known in the art. The outer supporting member 212 has a plurality of circumferential threaded holes 213 therewithin. The holes 213 are adapted to receive a plurality of retaining screws 215 therein. The outer supporting member 212 has a second plurality of threaded holes 217 therewithin. The threaded holes 217 are adapted to receive a plurality of upper offsetting screws 219 therewithin.

The magnet assembly 160 further includes a plurality of L-shaped members 214 and 214A. The L-shaped members 214 and 214A are disposed between. A portion of each one of the L-shaped members 214 and 214A is disposed between the outer supporting member 212 and the inner supporting member 216. The retaining screws 215 are used to firmly attach the L-shaped members 214 and 214A to the outer and inner supporting members 212 and 216, respectively by screwing them into the threaded holes 213 and into suitable threaded holes 222 passing within the L-shaped members 214 and 214A, and through suitable threaded holes 223 within the inner supporting member 216.

Another different portion of each one of the L-shaped members 214 and 214A is disposed between the inner surface 204A of the annular permanent magnet 204 and the magnet protecting members 206 and 208. The L-shaped members 214 and 214A are preferably made from a non-ferromagnetic, electrically non-conducting material such as, plastic, fiberglass or the like, but other suitable materials may also be used. Each of the of L-shaped members 214A has a threaded hole 214B therein. Each of the threaded holes 214B is adapted to receive a lower offsetting screw 220 therein. In a preferred embodiment of the present invention, the inner supporting ring 216 has four threaded holes 217 therein, and the number of the L-shaped members 214A is four, but other different numbers of holes 217 and of L-shaped members 214A may also be used.

The upper offsetting screws 219 are screwed into the threaded holes 217 until they are in contact with the surface of the magnet protecting member 206 within the annular notch 206A. The lower offsetting screws 220 are screwed into the threaded holes 214B of the L-shaped members 214A until they are in contact with the surface of the magnet protecting member 208 within the annular notch 208A. By suitably adjusting the position of one or more of the upper offsetting screws 219 and/or the lower adjusting screws 220, the position of the inner disc-like permanent magnet 200 along the z-axis may be offset in a direction towards or away from the inner supporting member 216. This serves to fine-tune the homogeneity of the main magnetic field within the imaging volume 177 as is disclosed in detail hereinafter.

It is noted that, suitable adjustment of one or more of the upper offsetting screws 219 and/or the lower offsetting screws 220 may also be used to tilt the surfaces 200B and 200C with respect to the z-axis 188, such that the surface 200B of the disc-like permanent magnet 200 is tilted at an angle, referred to as the tilt angle hereinafter (not shown), with respect to the surface 204B of the annular permanent magnet 204. Such tilting may also be used for fine tuning the homogeneity of the main magnetic field within the imaging volume 177.

Additionally, in accordance with other preferred embodiments of the present invention, the position and the tilt angle of the annular permanent magnet 204 with respect to the z-axis 188 may also be varied by using a similar tilting and/or position adjusting mechanism (not shown) for adjusting the tilt angle of the annular permanent magnet 204 with respect to the z-axis 188. Such a mechanism may be constructed by using adjusting screws (not shown) for changing the tilt and position of the annular permanent magnet 204 relative to an external housing or frame (not shown) within which the permanent magnet assembly is mounted.

It will be appreciated by those skilled in the art that, in permanent magnet assemblies having more than two permanent magnets, the position and/or tilt adjustment mechanisms may be adapted to enable individual adjustment of the position and/or the tilt angle of one or more of the permanent magnets of the permanent magnet assemblies. Such adaptations to the adjustment mechanisms are well known in the art and are not be disclosed in detail herein.

It is further noted that, the disc-like permanent magnet 200 may also be rotated around the z-axis 188 with respect to the annular permanent magnet 204. The rotation is performed by loosening the offsetting screws 219 and/or 220 and rotating the disc-like permanent magnet 200 and the magnet protecting members 206 and 208 attached thereto around the z-axis 188. The rotation may be performed by inserting into some of the rectangular notches 210 prongs (not shown) of an adapted turning tool (not shown) and rotating the tool. After the rotation is performed, the offsetting screws 219 and 220 may be readjusted and the offsetting or tilting procedures disclosed hereinabove may then be performed if further fine tuning is required.

It is yet further noted that, the permanent magnet assembly 160 of FIG. 16 may also include an external housing (not shown) preferably made from a non-ferromagnetic material having low electrical conductivity such as plastic, fiberglass or the like. This housing may be used for protecting the permanent magnets 204 and 206 and for attaching the permanent magnet assemblies 160 and 162 to the mounting members 176 and 180 of FIG. 13.

It is still further noted that, while the permanent magnet 200 is shown as a disc-like permanent magnet, in may also be an annular permanent magnet having a hole (not shown) therewithin, such as, for example, the annular permanent magnet 11 of FIG. 1. Additionally, while the permanent magnet assembly 160 of FIG. 16 is shown to have two permanent magnets, other preferred embodiments may have other larger numbers of concentric permanent magnets. Typically, the permanent magnet assemblies 160 and 162 may each include 2–6 concentric permanent magnets as disclosed hereinabove and in U.S. patent application Ser. No. 09 161,336, to Zuk et al.

Furthermore, it will be appreciated by those skilled in the art that, the particular mechanical design of the parts for holding together and tuning the magnetic assemblies of FIG. 16 are given by way of example only and that many other arrangements for adjusting the position and the tilt angle of the permanent magnets with respect to the z-axis may be used which are within the scope and spirit of the present invention.

Briefly returning to FIG. 15, the magnetic apparatus 149 is shown attached to a motorized gantry 199. The base 156 is rigidly attached to the gantry 199. A patient is shown lying on a surgical table 181 and the head of the patient 179 is disposed in the region 164 between the permanent magnet assemblies 160 (not shown) and 162. In this position, part of the brain (not shown) of the patient may be placed within the imaging volume 177 (not shown for the sake of clarity of illustration) for imaging thereof. The details of the gantry 199 are not the subject of the present invention and are not disclosed hereinafter.

Turning back to FIG. 13, the electromagnet assemblies 150 and 152 may be any suitable type of electromagnet known in the art. In accordance with one preferred embodiment of the present invention the electromagnet assemblies 150 and 152 may be resistive electromagnets each including one or more resistive coils for generating a magnetic field in the imaging volume 177. The structure and design of resistive electromagnets is well known in the art and will not be disclosed in detail hereinafter. Preferably, the resistive electromagnets 150 and 152 may be implemented using a Helmholtz coil pair (not shown). One of the coils of the Helmholtz pair (not shown) is disposed within the housing 150H of the electromagnet assembly 150 and the other coil (not shown) of the Helmholtz pair is disposed within the housing 152H of the electromagnet assembly 152. The Helmholtz coil pair is arranged such that the z-axis passes through the center of each of the coils (not shown) of the Helmholtz pair. The structure and design considerations of Helmholtz pair electromagnets is well known in the art and will not be disclosed in detail hereinafter. Briefly, the structure and geometrical parameters of a Helmoltz coil pair are defined in page 919of "THE McGRAW-HILL DICTIONARY OF SCIENTIFIC AND TECHNICAL TERMS" Fifth edition, Edited by Sybil P. Parker (1994). An advantage of the Helmholtz pair electromagnet is that it is relatively simple and inexpensive to implement while providing a fairly uniform magnetic field which may be further corrected and tuned by the permanent magnet assemblies 160 and 162.

Figure 17:
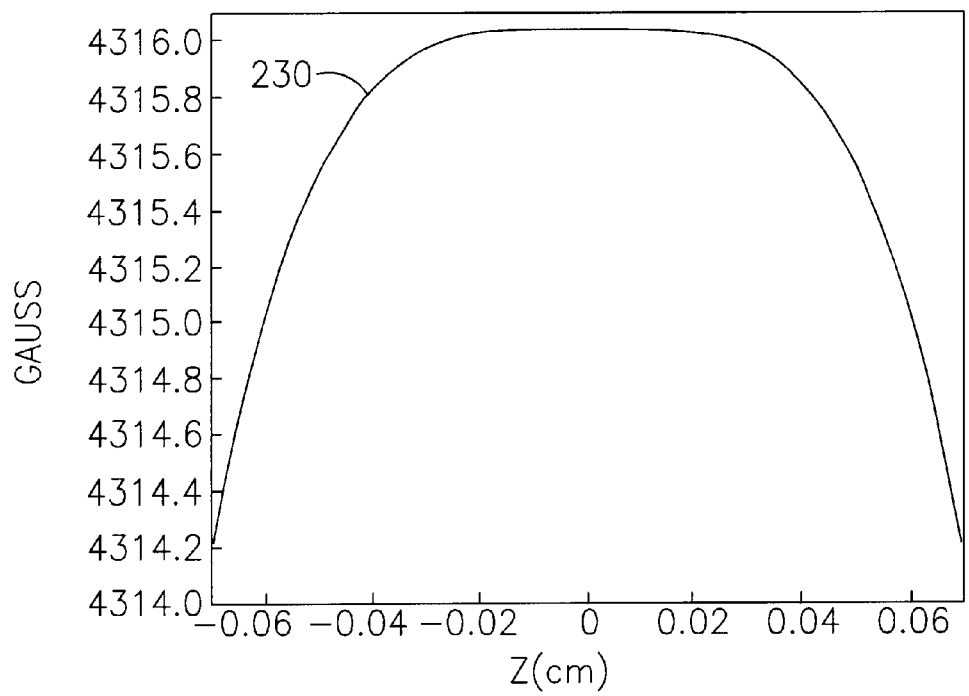
FIG. 17 is a schematic graph illustrating the computed magnitude of the magnetic field along the z-axis of an electromagnetic flux generator using a Helmholtz pair electromagnet.

Reference is now made to FIG. 17 which is a schematic graph illustrating the computed magnitude of the magnetic field along the z-axis of an electromagnetic flux generator using Helmholtz pair electromagnets. The vertical axis of the graph represent the magnitude of the magnetic field generated by a Helmholtz pair electromagnet along the z-axis which is the common axis passing through the center of both of the coils (not shown) of the Helmholtz pair electromagnet The horizontal axis represents the distance in centimeters along the z-axis of the magnetic flux generator.

The zero point on the horizontal axis represents the midpoint of the z-axis, negative distance represent points on the z-axis left of the zero point and positive distance values represent points on the z-axis right of the zero point. The computation was performed for a Helmholtz pair having a coil radius of approximately 50 centimeter. The distance between the centers of the coils (not shown) of the Helmholtz pair is therefore approximately 50 centimeters. The curve 230 represents the computed magnitude of the magnetic field at the z-axis as a function of the position along the z-axis 188. The graph shows a magnetic field magnitude of approximately 4316 Gauss at the zero point of the z-axis. At the distances of +5.0 centimeters and −5.0 centimeters on the z-axis the computed magnitude of the magnetic field drops to a value of approximately 4315.5 Gauss which is a drop of 0.5 Gauss for a 5 centimeter distance from the zero point. By itself, this field homogeneity is not adequate for conventional MRI imaging.

Figure 18:
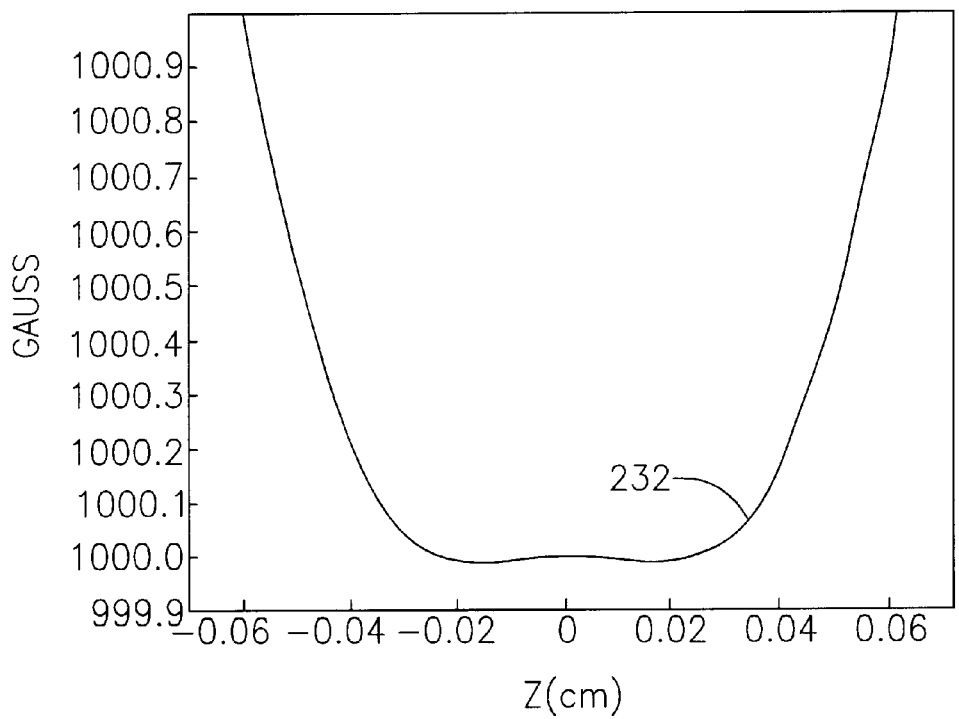
FIG. 18 is a schematic graph illustrating the computed magnitude of the magnetic field along the z-axis common to a pair of permanent magnet assemblies designed for generating a permanent magnetic field useful for improving the magnetic field homogeneity of the magnetic field of the Helmholtz pair electromagnets used in the computation illustrated in FIG. 17.

Reference is now made to FIG. 18 which is a schematic graph illustrating the computed magnitude of the magnetic field along the z-axis common to a pair of permanent magnet assemblies designed for generating a permanent magnetic field useful for improving the magnetic field homogeneity of the magnetic field of the Helmholtz pair electromagnets whose magnetic field is computed in FIG. 17. The vertical axis of the graph represent the computed magnitude of the magnetic field generated the pair of permanent magnet assemblies along the z-axis which is the common axis passing through the center of both permanent magnet assemblies (not shown). The horizontal axis represents the distance in centimeters along the z-axis common to both of the permanent magnet assemblies. Each of the two permanent Magnet assemblies for which the computation was performed included three concentric annular permanent magnets (not shown). The outer diameter of the largest outermost annular permanent magnet of each of the permanent magnet assemblies was approximately 19 centimeters.

The zero point on the horizontal axis represents the midpoint of the z-axis, negative distance represent points on the z-axis left of the zero point and positive distance values represent points on the z-axis right of the zero point. The curve 232 represents the computed magnitude of the magnetic field at the z-axis as a function of the position along the z-axis 188. The computation shows a magnetic field magnitude of approximately 1000 Gauss at the zero point of the z-axis. At the distances of +5.0 centimeters and −5.0 centimeters on the z-axis the magnitude of the magnetic field rises to a value of approximately 1000.5 Gauss which is an increase of 0.5 Gauss for a 5 centimeter distance from the zero point.

Figure 19:
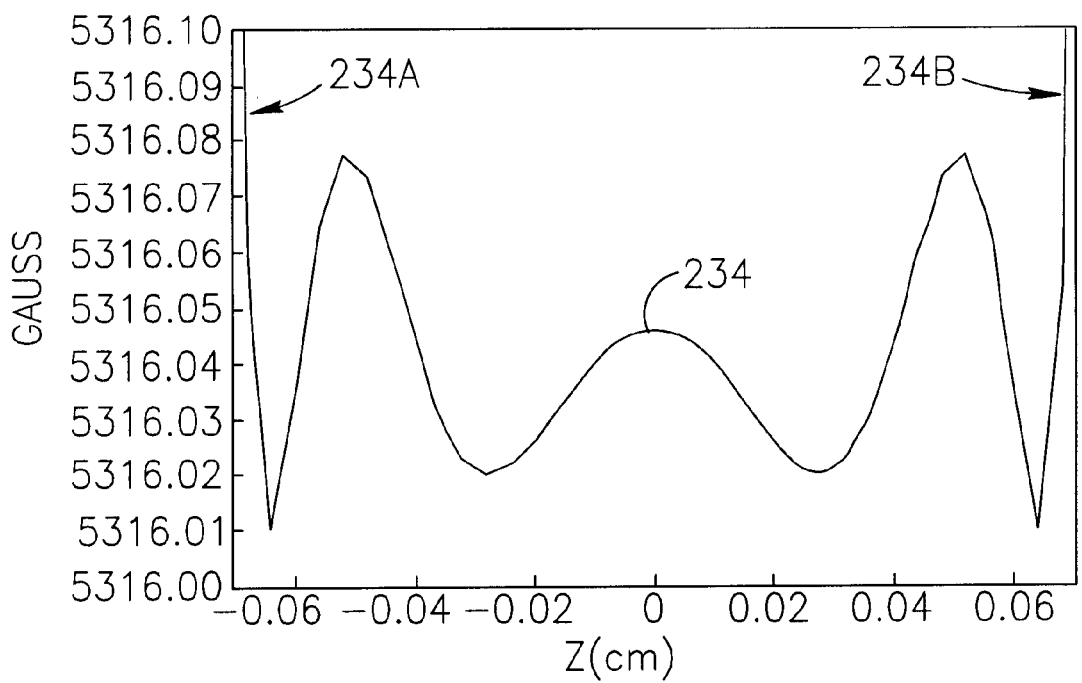
FIG. 19 is a schematic graph illustrating the computed magnitude of the magnetic field resulting from the superposition of the computed magnetic fields illustrated in FIGS. 17 and 18.

Reference is now made to FIG. 19 which is a schematic graph illustrating the computed magnitude of the magnetic field resulting from the superposition of the computed magnetic fields illustrated in FIGS. 17 and 18. The vertical axis of the graph of FIG. 19 represent the magnitude at the z-axis of the superimposed computed magnetic fields represented by the curves 230 and 232 of FIGS. 17 and 18, respectively. The horizontal axis represents the distance in centimeters along the z-axis common to the permanent magnet assemblies and to the Helmholtz pair electromagnet.

The curve 234 represents the computed magnitude at the z-axis of the superimposed magnetic fields represented by the curves 230 and 232 as a function of the position along the z-axis 188. The computed curve 234 shows a mean magnetic field magnitude along the z-axis of approximately 5316 Gauss with a homogeneity of approximately ±10 parts per million (ppm) within a distance of approximately ±7 centimeters from the zero point of the z-axis.

It is noted that, the computed superimposed magnetic field magnitude represented by the curve 234 exhibits a very steep rate of rise at distances of approximately 7 centimeters or higher from the zero point of the z-axis. These "shoulders" with steep rate of rise of the curve 234 are labeled 234A and 234B. This feature is advantageous since it prevents magnetic field folding during imaging when the linear magnetic field gradients generated by the gradient coil assemblies 190 and 192 of FIG. 13 are superimposed on the main magnetic field of the hybrid magnetic apparatus 149. Magnetic field folding typically results in deterioration of image quality and resolution induced by the defocusing effects of RF signals which are generated in tissue regions outside of the FOV but adjacent thereto. Such regions may experience magnetic field values which are identical to the values of the magnetic field experienced by tissue regions within the field of view. Therefore, the RF signals generated by tissue regions inside and outside the FOV will have identical frequencies which results in pixel folding and defocusing of the image within the FOV. This problem is particularly aggravated in imaging situations, such as, for example, in restricted organ or body part imaging in which the local receiving RF coils used may be positioned close to tissue regions disposed outside of the FOV.

Therefore, the steep rate of change of the magnetic field at the curve shoulders 234A and 234B advantageously results in an improved focused field of view (FOV) due to elimination or reduction of pixel folding.

Another advantage of the main magnetic fields generated by the hybrid magnetic apparatus of the present invention is that the magnitude of the main magnetic field is substantially higher than the magnetic field achieved by using only the permanent magnet assemblies disclosed hereinabove, while still having an acceptable degree of homogeneity. This advantage results from the method of designing of the hybrid magnetic apparatus 149 of the present invention. In the design method of the present invention the electromagnet coils of the electromagnet assemblies 150 and 152 and the permanent magnet assemblies 160 and 162 are designed together such that the permanent magnet assemblies 160 and 162 are adapted to improve the homogeneity of the overall resulting magnetic field and to provide a steep rate of change of the magnetic field magnitude at the edges of the FOV.

It is noted that, while the particular computed example of the magnetic field curve 234 includes shoulders 234A and 234B having a steep rate of rise of the magnetic field amplitude, the present invention may also be practiced by generating magnetic field curves having shoulder curve portions with a steep rate of decrease of magnetic field magnitude. Thus, the curve shoulders of the magnetic field curves useful in the present invention are generally characterized by a steep rate of change, irrespective of the change direction.

It is further noted that, in accordance with another preferred embodiment of the present invention, the electromagnet assemblies 150 and 152 may be super-conducting electromagnet assemblies. The design and operation of super-conducting magnets is well known in the art and will not be disclosed in detail hereinafter. Any suitable design of super-conducting electromagnets known in the art may be adapted for implementing the hybrid magnetic apparatus 149 of the present invention. For example, the electromagnet assemblies 150 and 152 may be implemented as super-conducting magnets having a single or multiple super-conducting coils. The electromagnet assemblies 150 and 152 may also be implemented as super-conducting magnets configured as a super-conducting Helmholtz pair.

It is still further noted that if the electromagnets used in the construction of the electromagnet assemblies 150 and 152 are resistive electromagnets, any suitable coil configuration known in the art may be used, including, but not limited to, designs having multiple electromagnet coils which are disposed within each of the electromagnet assemblies 150 and 152.

It will be appreciated that the MRI and/or interventional magnetic resonance imaging (iMRI) systems (not shown) which include the hybrid magnetic apparatus include additional parts and components which are necessary to the operation of such systems for imaging. Such components may include power supplies, receiving and transmitting RF coils and RF signal generator and receiver circuitry, active shimming coils, passive shimming members, gradient amplifiers, and various components for controlling the operation of the system for acquiring and processing imaging data and for displaying and storing MRI images. Additionally, the systems may include temperature stabilization systems for regulating the temperature of various system components such as the permanent magnet assemblies, the electromagnet assemblies. Furthermore, if the electromagnet assemblies 150 and 152 are of the super-conducting electromagnet type, the system may include all the necessary components such as cryogenic Dewars and the like for cooling the super-conducting coils to the required temperature and for maintaining the required temperature. The construction and operation of such components is well known in the art and is therefore not disclosed herein in detail.

It will be appreciated by those skilled in the art that the number, shape and arrangement of the annular permanent magnets of the permanent magnet assemblies 160 and 162 of FIGS. 13–15 are not limited to the shapes and arrangements disclosed hereinabove and that the number, shapes and arrangement of the annular permanent magnets included in the permanent magnet assemblies 160 and 162 of FIGS. 13–15 may be varied and modified in accordance with factors such as, inter alia, the required magnitude and degree of homogeneity of the main magnetic field within the imaging volume 177, the desired dimensions of the permanent magnet assemblies 160 and 162, the required size of the imaging volume 177, the degree of homogeneity of the magnetic field provided by the electromagnetic flux generator, the magnetization value of the permanent magnet material available for constructing the annular permanent magnets and a variety of other manufacturing considerations such as the weight and cost of construction of the permanent magnetic assemblies.

Furthermore, while the preferred embodiments of the permanent magnet assemblies disclosed hereinabove illustrate annular or disc-like permanent magnets shaped as structures which are circularly symmetric with respect to the z-axis 188 of the magnetic apparatus 149, other preferred embodiments of the present invention may use other suitable shapes of permanent magnet assemblies, provided that the shapes of the permanent magnet assemblies are radially symmetric with respect to the z-axis 188. For example, the disc-like permanent magnet 200 of FIG. 16 which has a circular cross-section in a plane (not shown) perpendicular to the z-axis 188 may be replaced by a permanent magnet shaped as a right regular polygonal prism having N sides, wherein the number of sides N is large enough to provide the magnetic field homogeneity requested within the imaging volume 177 for imaging. Preferably, the number of sides is $N \geq 8$, but other numbers may be used depending, inter alia, on the requested degree of homogeneity of the magnetic field within the imaging volume 177, and on the number, geometrical shape and the dimensions of the permanent magnets within the permanent magnet assemblies 160 and 162. In another non-limiting example, the annular permanent magnet 204 of FIG. 16 may be replaced by a right regular polygonal ring structure having N sides, wherein the number of sides N is large enough to provide the magnetic field homogeneity requested within the imaging volume 177 for imaging. Preferably, the number of sides of the right regular polygonal ring structure is N≧8, but other different numbers may be used depending, inter alia, on the requested degree of homogeneity of the magnetic field within the imaging volume 177, and on the number, geometrical shape and dimensions of the permanent magnets within the permanent magnet assemblies 160 and 162. Typically, but not necessarily, the shapes of the permanent magnets included in the permanent magnet assemblies 160 and 162 may be similar to the shapes disclosed for the magnetic structures, pole-pieces and collimators illustrated in FIGS. 19A, 19B, 20A, 20B, 20C, 20D, 20E 20F, 21, 22 and 23 of International Patent Application, International Publication No. WO 99/40593, incorporated herein by reference in its entirety for all purposes.

Furthermore, while the electromagnet coils within the electromagnet assemblies are preferably coils having a circular cross-section, in accordance with another preferred embodiment of the present invention any suitable coil shape may be used as long as the finally achieved degree of homogeneity of magnetic field within the imaging volume 177 is sufficient for performing MRI. For example, the electromagnet coils (not shown) may have a regular polygonal ring like structure having N sides, wherein the number of sides N is large enough to provide the magnetic field homogeneity requested within the imaging volume 177 for imaging. Preferably, the number of sides is N≧8, but other numbers of sides may be used depending, inter alia, on the requested degree of homogeneity of the magnetic field within the imaging volume 177, and on the, number, dimensions and geometrical shape of the electromagnet coils included within the electromagnet assemblies 150 and 152.

It is noted that in the preferred embodiments of the hybrid magnetic apparatus illustrated in FIGS. 13–14 and 15, the electromagnet assemblies 150 and 152 are fixed in position relative to the permanent magnet assemblies 160 and 162. Thus, shimming of the magnetic field in these embodiments may be performed by adjusting the positions of the permanent magnets within the permanent magnet assemblies, such as for example, by adjusting the position of the permanent magnet 200 relative to the annular permanent magnet 204 of the exemplary permanent magnet assembly 160 of FIG. 16. If the permanent magnet assemblies include more than two permanent magnets, such as in the exemplary permanent magnet assemblies disclosed in U.S. Pat. No. 5,900,793, shimming of the magnetic field in these embodiments may be performed by adjusting the position of any of the plurality of permanent magnets included within the permanent magnet assemblies.

Alternatively or additionally, passive shimming may be performed. For example, attaching one or more pieces of magnetic material or ferromagnetic material or the like to the hybrid magnetic apparatus, may be used for passive shimming, as is well known in the art. Alternatively, or additionally, active shimming methods may be used by passing suitable shimming currents through active shimming coils (not shown) or through one or more gradient coils (not shown), as is well known in the art. In accordance with non-limiting examples of the invention, such shim coils (not shown in detail) may be included, within the gradient coil assemblies 190 and 192 of FIG. 13, or may be included in the multi-layer printed circuit assemblies as disclosed in detail and illustrated in FIGS. 5–8 of U.S. patent application Ser. No. 09/161,336, referenced hereinabove.

However, in accordance with other preferred embodiments of the present invention, it is also possible to perform shimming and/or fine tuning of the magnetic field in the FOV of the hybrid magnetic apparatus of the present invention by moving one or more of the electromagnet assemblies with respect to the permanent magnet assemblies, mutatis mutandis. It may also be possible to perform shimming and/or fine tuning of the magnetic field in the FOV of the hybrid magnetic apparatus of the present invention by moving one or more of the electromagnet assemblies and/or the permanent magnet assemblies with respect to the center of the FOV of the hybrid magnetic apparatus of the present invention. Thus, the hybrid magnetic apparatuses of the present invention may also include mechanisms for adjusting the position or the orientation or the position and the orientation of one or more of the electromagnet assemblies or one or more of the permanent magnet assemblies within the hybrid magnetic apparatuses of the invention.

Figure 20:
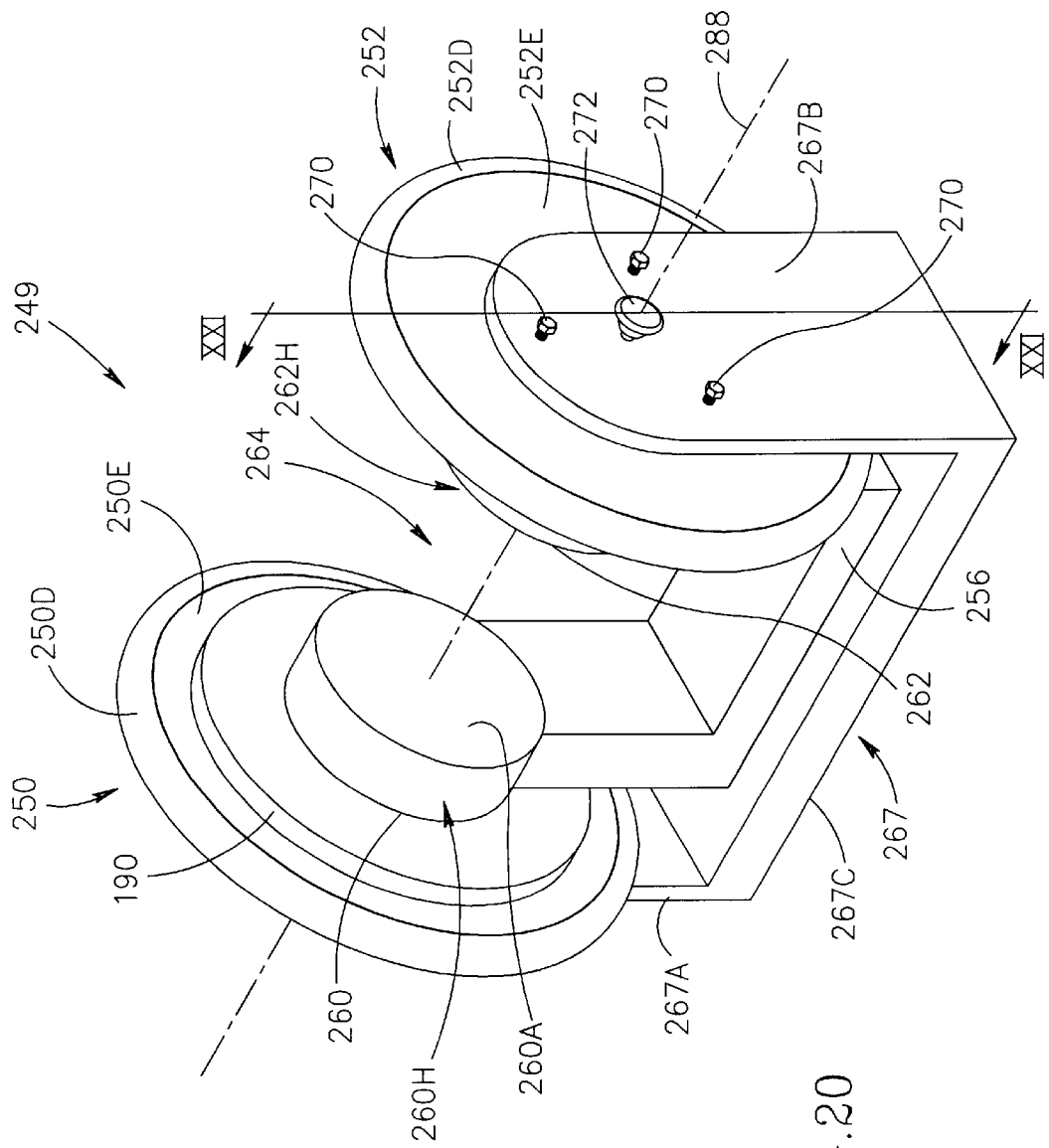
FIG. 20 is a schematic isometric view illustrating an open hybrid magnetic apparatus having an adjustable electromagnet flux generator and permanent magnet assemblies, in accordance with yet another preferred embodiment of the present invention.
Figure 21:
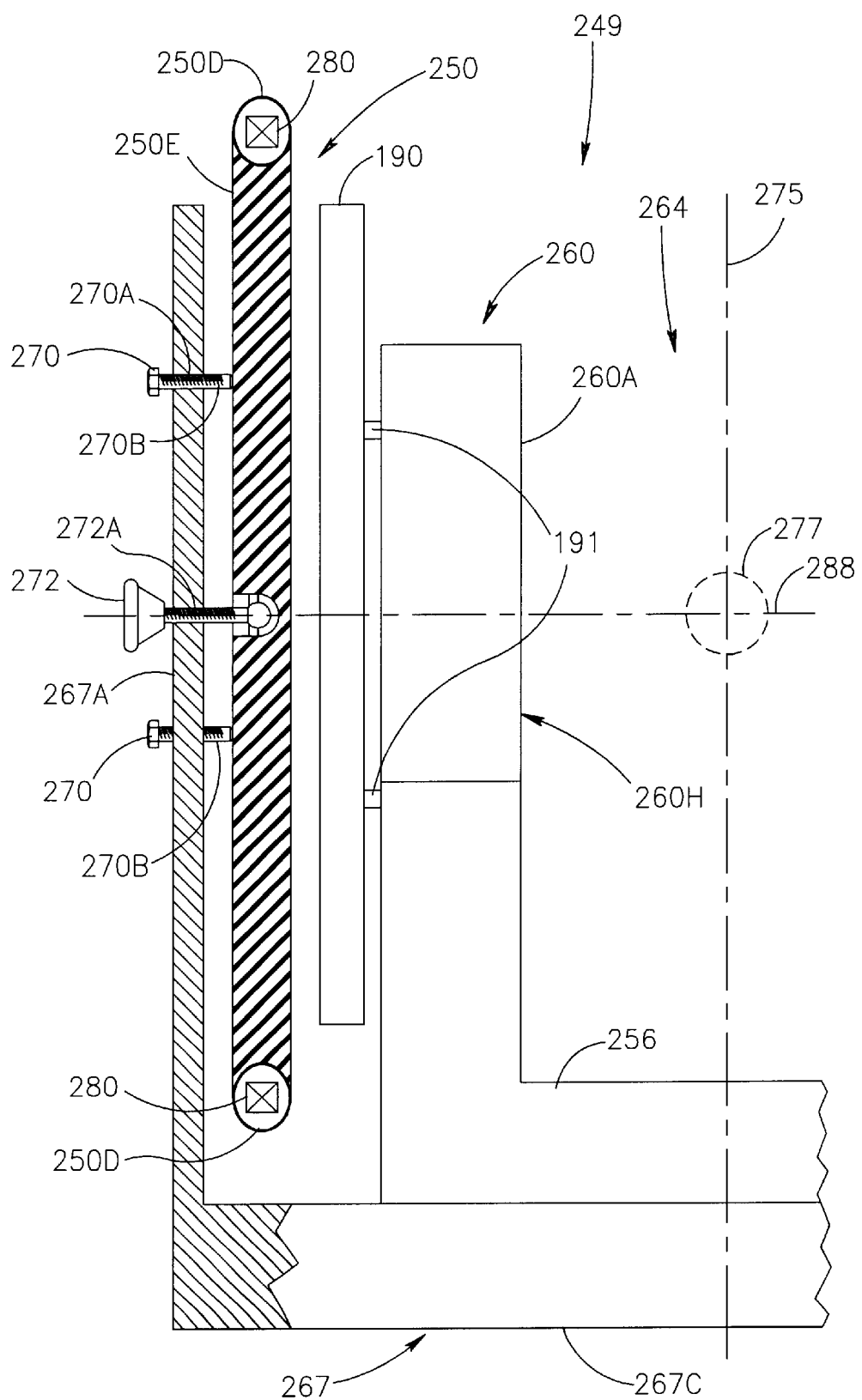
FIG. 21 is a schematic part cross-sectional, part side view illustrating a part of the hybrid magnetic apparatus of FIG. 20, taken along the lines XXI—XXI.

Reference is now made to FIGS. 20 and 21. FIG. 20 which is a schematic isometric view illustrating an open hybrid magnetic apparatus having an adjustable electromagnet flux generator and permanent magnet assemblies, in accordance with yet another preferred embodiment of the present invention. FIG. 21 is a schematic part cross-sectional view, part side view illustrating part of the hybrid magnetic apparatus of FIG. 20, taken along the lines XXI—XXI.

The magnetic apparatus 249 of FIGS. 20 and 21 includes an electromagnetic flux generator including two opposing electromagnet assemblies 250 and 252. The electromagnet assemblies 250 and 252 include Dewars 250D and 252D, respectively. The Dewars 250D and 252D are attached or suitably mounted on supporting members 250E and 252E, respectively. The supporting members 250E and 252E may be made from stainless steel or from any other suitable material having low magnetic permeability and sufficient structural rigidity such as, for example, fiberglass, a reinforced plastic material or the like. The Dewars 250D and 252D may be generally toroidally shaped hollow Dewar cryogenic bottles or Dewar containers, or Cryostats having a circular or ellipsoidal or other cross-section, but any other suitable Dewar bottle form or other cryostat form or type known in the art may also be used. It is noted that the construction of cryogenic Dewar bottles or cryostats for maintaining low temperatures of super-conducting electromagnets is well known in the art, is not the subject matter of the present invention, and is therefore not disclosed in detail hereinafter. Each of the Dewars 250D and 252D includes a super-conducting coil 280. Preferably, the super conducting coils 280 may be similar to each other in their dimensions, approximate number of windings and the material or materials from which they are constructed. The super conducting coils 280 may be electrically connected in series (the connection is not shown for the sake of clarity of illustration) such that they form together a Helmholtz pair, as is known in the art.

It is noted that only the super-conducting coil 280 included within the Dewar 250D is shown in FIG. 21. The complementary super-conducting coil included in the Dewar 252D is not shown (for the sake of clarity of illustration). However it will be appreciated by those skilled in the art that the two super-conducting coils 280 are preferably similar to each other as disclosed hereinabove and that they are preferably electrically connected to each other to form a Helmholtz coil pair such that when a current flows through the coils 280 of the complementary electromagnet assemblies 250 and 252, the resulting magnetic field is generally directed within the FOV in approximately the same direction of the magnetic field produced within the FOV by the permanent magnet assemblies 260 and 262.

It is further noted that, while the embodiments of the invention disclosed herein and illustrated in the drawing figures, are adapted for using cryogenic Dewar bottles or containers for maintaining a suitable low temperature of the super-conducting coils 280, other preferred embodiments of the present invention may use other temperature control and maintenance means, such as for example, active cryo-cooling devices, gas cooling devices (using low temperature nitrogen, helium or other gasses for cooling), liquid cooling devices using a low temperature liquefied gas which is cooled below the boiling point of the gas (by evaporative cooling at low pressure or other methods) such as, for example, low temperature liquid nitrogen, low temperature liquid helium, or any other suitable temperature control and maintenance means and cooling methods which are known in the art.

The electromagnet assemblies 250 and 252 are spaced apart from each other. A suitable super-conducting coil 280 is disposed within the Dewar 250D as is known in the art. Similarly, another similar super-conducting coil (not shown) is disposed within the Dewar 252D. Preferably, but not necessarily, the two super-conducting coils are configured as a Helmholtz coil pair, as is known in the art. However, other suitable arrangements of coils or coil pairs may be used. Additionally, more than one pair of coils may be used as disclosed hereinabove and as is known in the art of electromagnet construction. For example, nested or non-nested Helmholtz coil pairs may be used, or any other suitable coil arrangement known in the art. Preferably, the electromagnet coils are cooled by liquid nitrogen disposed in the Dewars 250D and 252D, but other coolants known in the art may also be used, such as, for example liquid helium. The choice of coolant may be determined by the type of superconductor used in the construction of the electromagnet coils of the electromagnet assemblies 250 and 252. Preferably, the coil 280 and the complementary coil (not shown) are high temperature super-conducting (HTS) coils, and the coolant is liquid nitrogen. However, low temperature super-conducting (LTS) coils may also be used in conjunction with liquid helium as a coolant.

The magnetic apparatus 249 further includes two opposing permanent magnet assemblies 260 and 262. The permanent magnet assembly 260 may include a housing 260H, and the permanent magnet assembly 262 may include a housing 262H. The permanent magnet assemblies 260 and 262 or the housings 260H and 262H, respectively, may be attached to a supporting member 256. An open region 264 is defined between the permanent magnet assemblies 260 and 262. The dashed line 275 represents the line of intersection of a mid-plane (not shown) with the plane in which the cross section of FIG. 21 lies (represented by the plane of the page of the drawing of FIG. 21). The mid-plane is equidistant from the inner surface 260A of the permanent magnet assembly 260 and the corresponding opposed inner surface (not shown) of the permanent magnet assembly 262, respectively. The mid-plane also symmetrically bisects the FOV 277 of the magnetic apparatus 249.

The hybrid magnetic apparatus 249 further includes two opposing gradient coil assemblies similar to the gradient coil assemblies 190 and 192 disclosed hereinabove and illustrated in FIG. 13. The gradient coil assembly 190 (FIG. 20) is disposed between the permanent magnet assembly 260 and the electromagnet assembly 250. It is noted that the second gradient coil assembly of the hybrid magnetic apparatus 249 is not shown in FIG. 20 since FIG. 20 illustrates an isometric view of the hybrid magnetic apparatus 249. The second gradient coil assembly of the hybrid magnetic apparatus 249 is not shown in FIG. 21 since FIG. 21 illustrates a cross-sectional view of a part of the hybrid magnetic apparatus 249. However, the other complementary parts and components of the hybrid magnetic apparatus 249 which are not shown in FIG. 21 are constructed as a mirror image of the shown parts and components with respect to the mid-plane intersecting the plane of the sheet of drawing FIG. 21 at the dashed line 275, which mid-plane is orthogonal to the plane of the drawing sheet of FIG. 21. Thus, for example, the Dewar 250D is shaped as a mirror image of the Dewar 252D, the second gradient coil (not shown) is shaped as a mirror image of the complementary gradient coil 190 of FIGS. 20 and 21.

It is noted that while the permanent magnet assemblies 260 and 262 are shaped as mirror images with respect to the mid-plane of the hybrid magnetic apparatus 249, the direction of magnetization of each of the opposing complementary permanent magnet pairs included within the permanent magnet assemblies 260 and 262 as disclosed hereinabove are not arranged as mirror images of each other but are rather directed in the same direction within each pair of opposing complementary permanent magnets. However, the direction of magnetization of different complementary pairs of permanent magnets may or may not be directed in the same direction, depending, inter alia, on the specific design, type and number of complementary pairs of the annular or disc-like, polygonal-annular or polygonal prismatic permanent magnets, as disclosed in detail hereinabove, and in the above referenced, commonly assigned co-pending U.S. patent applications and their corresponding PCT applications.

The gradient coil assembly 190 may be suitably attached to the permanent magnet assembly 260 or to the housing 260H of the permanent magnet assembly 260 by suitable attaching members 191. The attaching members 191 may be attached to the gradient coil assembly 190 and to the permanent magnet assembly 260 by suitable glue or by screws (not shown), nuts and bolts (not shown) or by any other suitable attaching means or attaching methods known in the art. However, the gradient coil assembly 190 may also be suitably attached to the supporting member 256 (not shown in FIG. 21), or to any other suitable non-moving structural part of the hybrid magnetic apparatus 249.

The gradient coil assembly 190 may be suitably attached to the permanent magnet assembly 260 or to a housing (not shown for the sake of clarity of illustration) included in the permanent magnet assembly 260 by suitable attaching members 191. The attaching members 191 may be attached to the gradient coil assembly 190 and to the permanent magnet assembly 260 by suitable glue or by screws (not shown), nuts and bolts (not shown) or by any other suitable attaching means or attaching methods known in the art. However, the gradient coil assembly 190 may also be suitably attached to the supporting member 256 (not shown in FIG. 21), or to any other suitable non-moving structural part of the hybrid magnetic apparatus 249.

The attaching members 191 may be any suitable attaching members. For example, the attaching members 191 may be members made from a material or materials having low magnetic permeability, such as but not limited to plastic, fiberglass, stainless steel, or the like. The attaching members 191 may be attached to the gradient coil assembly 190 and to the permanent magnet assembly 260 by a suitable glue or by screws or bolts or by any other suitable attachment method. The attaching members 191 may also be movably or adjustably attached to the gradient coil assembly 190 and/or to the permanent magnet assembly 260 such as to enable fine tuning of the distance of the gradient coil assembly 190 from the permanent magnet assembly 260, and/or tilting angle of the gradient coil assembly 190 with respect to the permanent magnet assembly 260. For example, each of the attaching members 191 may include two parts (not shown in detail) which may be moved with respect to each other or with respect to a suitable housing (not shown) by a suitable coupling mechanism (not shown). If the attaching members 191 are adjustable attaching members, the distance between the permanent magnet assembly 260 and the gradient coil assembly 190 may be controlled or fine tuned by suitably tuning the attaching members 191. Similarly, the tilt angle of the gradient coil assembly 190 with respect to the permanent magnet assembly 260 may be adjusted by suitably tuning one or more of the attaching members 191.

It is noted that, in accordance with another preferred embodiment of the present invention, the gradient coil assembly 190 may be directly attached (not shown) or glued or suitably connected to the permanent magnet assembly 260 or to the housing 260H thereof, obviating the need for the attaching members 191.

It is noted that, the gradient coil assembly's structure and positioning may be any suitable structure and positioning which is known in the art including, but not limited to, all the different structures and arrangements of gradient coils or gradient coil combinations (or gradient coil pair arrangements) disclosed in detail in U.S. patent application Ser. No. 09/161,336 to Zuk et al., and the corresponding International Publication No. WO 99/15914.

Similarly, the transmitting and receiving RF coils (not shown) which are used for imaging with the magnetic apparatus 249 of the present invention, may have any suitable known structure and spatial position which is known in the art of RF coils including, but not limited to, all the different structures and arrangements of RF coils disclosed in detail in U.S. patent application Ser. No. 09/161,336 to Zuk et al., and the corresponding International Publication No. WO 99/15914.

Each of the permanent magnet assemblies 260 and 262 may includes a plurality of generally annular or disc-like permanent magnets (not shown in FIG. 20 for the sake of clarity of illustration), as disclosed in detail hereinabove. The dashed line 288 of FIGS. 20 and 21 represents the common axis passing through the geometrical center of all the annular permanent magnets of the permanent magnet assemblies 260 and 262 (and through the geometrical center of the disc-like permanent magnets if they are included in the permanent magnet assemblies 260 and 262) as disclosed in detail hereinbelow (see FIG. 16). The axis 288 is also defined as the z-axis of the hybrid magnetic apparatus 249. The main magnetic field generated by the magnetic apparatus 249 is directed in parallel to the z-axis 288.

The structure and arrangement of the permanent magnets composing the permanent magnet assemblies 260 and 262 has been disclosed in detail hereinabove and in U.S. patent application Ser. No. 09/161,336, to Zuk et al., and the corresponding International Publication No. WO 99/15914. In accordance with a preferred embodiment of the present invention, the shape and arrangement of the annular permanent magnets of permanent magnet assembly 260 may be similar to the shape and arrangement of the annular permanent magnets 40a, 40b and 40c of permanent magnet assembly 40 of FIGS. 4–7 and the shape and arrangement of the annular permanent magnets of permanent magnet assembly 262 may be similar to the arrangement of the annular permanent magnets 42a, 42b and 42c of the permanent magnet assembly 42 of FIGS. 4–7.

In accordance with another preferred embodiment of the present invention, the shape and arrangement of the annular permanent magnets of permanent magnet assembly 260 may be similar to the shape and arrangement of the annular permanent magnets 140a, 140b and 140c of permanent magnet assembly 140 of FIG. 8 and the shape and arrangement of the annular permanent magnets of permanent magnet assembly 262 may be similar to the arrangement of the annular permanent magnets 142a, 142b and 142c of the permanent magnet assembly 142 of FIG. 8.

In accordance with yet another preferred embodiment of the present invention, each of the permanent magnet assemblies 260 and 262 may be constructed similar to the permanent magnet assembly 10 of FIGS. 1–2, with the proviso that the permanent magnet assemblies 260 and 262 are arranged within the hybrid magnetic apparatus 249 such that the permanent magnet assembly 260 is oriented as a mirror image of the permanent magnet assembly 262 with respect to the mid-plane (not shown) equidistant from the electromagnet assemblies 250 and 252 and from the permanent magnet assemblies 260 and 262. However, the orientation of magnetization of the two annular permanent magnets included within any of the complementary opposing pairs of the annular permanent magnets of the permanent magnet assemblies 260 and 262 are identical, while different pairs of opposing complementary annular permanent magnets may have their magnetization directions oriented parallel or anti-parallel to each other, depending on the specific design of the magnetic assemblies 260 and 262 as disclosed in detail hereinabove and illustrated in FIG. 8. And as disclosed in detail by Zuk et al. in U.S. patent application Ser. No. 09/161,336, and the corresponding International Publication No. WO 99/15914.

In accordance with yet another preferred embodiment of the present invention, the permanent magnet assemblies 260 and 262 may be constructed similar to the permanent magnet assemblies disclosed in U.S. patent application Ser. No. 09/161,336, to Zuk et al., and the corresponding International Publication No. WO 99/15914.

The hybrid magnet assembly 249 further includes a supporting member 267. The supporting member 267 has a base portion 267C and two side portions 267A and 267B. The supporting member 267 may be made from stainless steel or from any other suitable material or materials having low magnetic permeability and suitable structural rigidity such as, for example, fiberglass, a reinforced plastic material or the like. The supporting member 256 is suitably attached to the supporting member 267.

The hybrid magnet assembly 249 also includes a mechanism for adjusting or changing the position or the orientation, or the position and the orientation within the hybrid magnet assembly 249 of one or more of the electromagnet assemblies 250 and 252. Each of the side portions 267A and 267B of the supporting member 267 includes three peripheral adjusting members 270 and an axial adjusting member 272. Preferably, the three peripheral adjusting members 270 of the side portion 267B are arranged such that the distances between each of the peripheral adjusting members 270 and the axial adjusting member 272 of the side portion 267B are equal to each other, and that all of the peripheral adjusting members 270 are disposed equidistantly from each other within the side portion 267B. Similarly, preferably, the three peripheral adjusting members 270 of the side portion 267A are arranged such that the distances between each of the peripheral adjusting members 270 and the axial adjusting member 272 of the side portion 267A are equal to each other, and that all of the peripheral adjusting members 270 are disposed equidistantly from each other within the side portion 267B. However, this arrangement of the adjusting members 270 and 272 is not obligatory and various other different arrangements of the adjusting members 270 and 272 may be used in the present invention. The adjusting members 270 may be made from stainless steel or may be made from any other suitable metal or material, preferably, but not necessarily, having suitably low magnetic permeability.

The peripheral adjusting members 270 are threaded and may be shaped like screws. The peripheral adjusting members 270 are movably disposed within suitable threaded passages 270A formed within the side portions 267A and 267B. The ends 270B (FIG. 21) of the peripheral adjusting members 270 which are movably disposed within the supporting member 250E may or may not be in contact with the supporting member 250E, depending, inter alia, on the exact position of each of the peripheral adjusting members 270 which are disposed within the supporting member 250E. Similarly, the ends 270B (not shown in FIG. 21) of the peripheral adjusting members 270 which are movably disposed within the supporting member 252E may or may not be in contact with the supporting member 252E, depending, inter alia, on the exact position of each of the peripheral adjusting members 270 which are disposed within the supporting member 252E.

Figure 22:
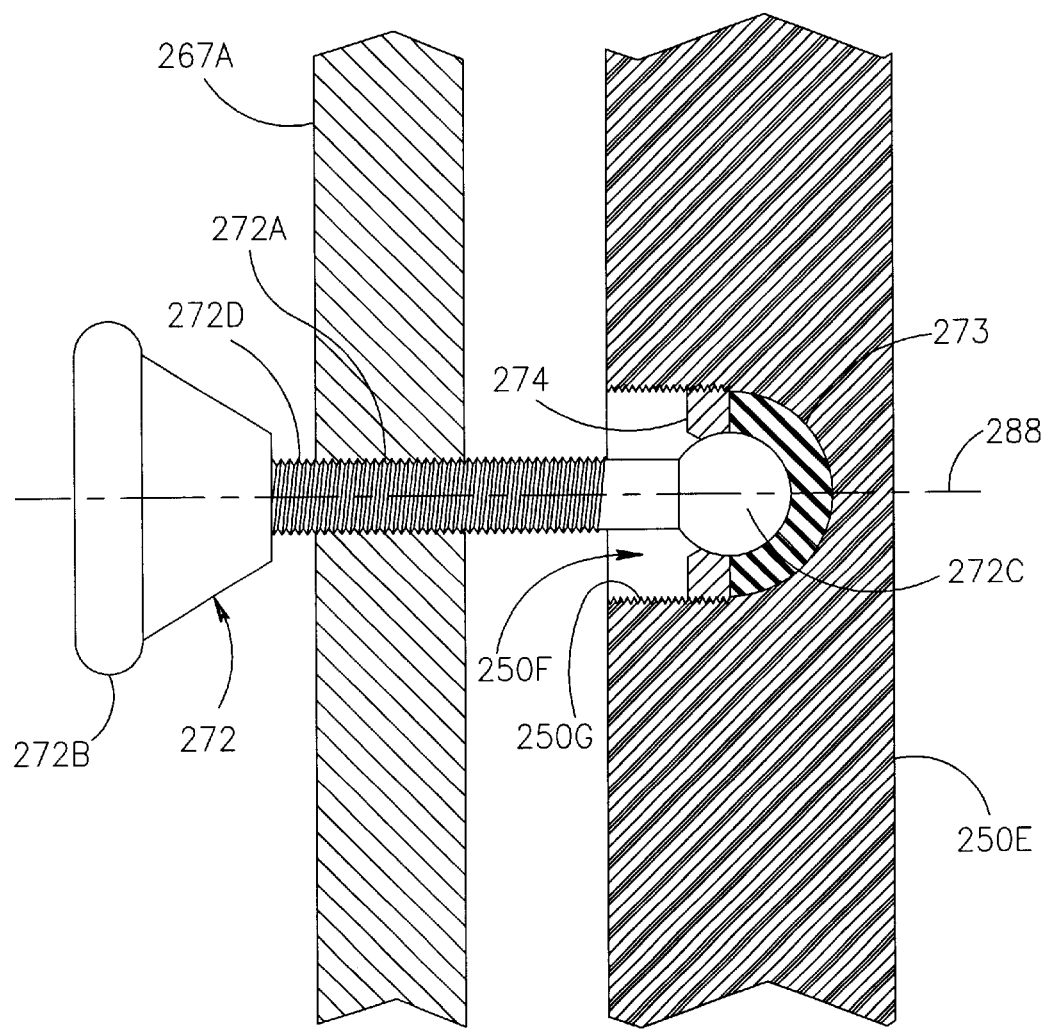
FIG. 22 is a schematic part cross sectional view illustrating in detail part of the hybrid magnetic apparatus of FIG. 21.

Reference is now made to FIG. 22 which is a schematic part cross sectional view illustrating in detail part of the hybrid magnetic apparatus of FIG. 21. The axial adjusting member 272 has a threaded portion 272D, and a spherically shaped portion 272C. The axial adjusting member 272 are movably disposed within suitable threaded passages 272A formed within the side portions 267A and 267B. The axial adjusting member 272 includes a turning knob 272D detachably attached to the end of the threaded portion 272D. The turning knob 272D may be attached to the threaded portion 272D by a suitable glue (not shown) or by any other suitable attaching means such as by screwing the threaded portion 272D into a suitable threaded passage (not shown) formed within the turning knob 272D, or by any other suitable attaching methods or attaching means. The axial adjusting member 272 may be made from stainless steel or may be made from any other suitable metal or material, preferably, but not necessarily, having suitably low magnetic permeability. Similarly, the turning knob 272D may be made from stainless steel or may be made from any other suitable metal, or plastic or other suitable material or suitable composition of different materials, preferably, but not necessarily, having suitably low magnetic permeability.

The spherically shaped portion 272C of the axial adjusting member 272 is disposed within a suitable partially threaded depression 250F formed within the supporting member 250E. A socket 273 is disposed within the depression 250F and held in place by a suitable threaded nut 274. The nut 274 is screwed into a suitably threaded portion 250G of the depression 250F. Preferably, the socket 273 is made from teflon® or from any other suitable low friction plastic material, but other different suitable materials may also be used. The nut 274 may made from a plastic material such as, but not limited to teflon®, or from a metal, such as for example stainless steel or from any other suitable low friction plastic material or the like, but other different suitable materials may also be used.

Thus, the electromagnet assembly 250 may be controllably moved and/or tilted or inclined within the hybrid magnetic apparatus 249 by suitably turning or rotating one or more of the adjusting members 270 and 272. The rotating of the adjustable members 270 and 272 may be performed manually with or without the use of suitable tools (not shown) such as, for example, a suitable manual wrench or a suitable power tool (not shown). For example, the electromagnet assembly 250 may be controllably moved along the axis 288 in a direction towards or away from the gradient coil assembly 190 by turning all the adjusting members 270 and 272 in a suitable direction such that all the adjusting members 270 and 272 move the same distance in the same direction. The direction of movement of the electromagnet assembly 250 along the axis 288 may depend, inter alia, on the direction of turning (clockwise or anti-clockwise) of the adjusting members 270 and 272 and on the type of threading of the adjusting members 270 and 272 (Left handed or right handed threading).

The electromagnet assembly 250 may be independently controllably tilted or inclined at an angle (not shown) with respect to the mid-plane bisecting the FOV 277 of the hybrid magnetic apparatus 249 by suitably turning or rotating one or more of the adjusting members 270 and 272. This tilting or inclining may be performed in different ways. A first way of tilting may be performed by suitably advancing or retracting one or more of the peripheral adjusting members 270 by rotating or turning one or more of the peripheral adjusting members 270 in a desired direction, without changing the position of the axial adjusting member 272, such tilting may change the inclination of the electromagnet assembly 250 with respect to the mid-plane of the hybrid magnetic apparatus 249 without moving the center-point of the electromagnet assembly 250 (which coincides with the center of the spherically shaped portion 272C of the axial adjusting member 272) along the axis 288. Another different way of tilting may be performed by suitably advancing or retracting one or more of the peripheral adjusting members 270 within their corresponding threaded passages 270A and advancing or retracting the axial adjusting member 272 within the threaded passage 272A within which it is disposed, by rotating or turning the selected peripheral adjusting members 270 and the axial adjusting member 272 in selected directions. Such tilting may change the inclination of the electromagnet assembly 250 with respect to the mid-plane of the hybrid magnetic apparatus 249, and also move the center-point of the electromagnet assembly 250 (which coincides with the center of the spherically shaped portion 272C of the axial adjusting member 272) along the axis 288.

The electromagnet assembly 252 may also be independently controllably moved along the axis 288 within the hybrid magnetic apparatus 249, and/or tilted or inclined with respect to the mid-plane of the hybrid magnetic apparatus 249, by suitably turning or rotating one or more of the adjusting members 270 and 272 disposed in the side portion 267B of the supporting member 267, as disclosed hereinabove in detail for the electromagnet assembly 250.

It is noted that, in order to perform the moving and/or tilting of the electromagnet assembly 250, it may or may not be necessary to coordinate the moving (the advancing or retracting as disclosed hereinabove) of some or all of the adjusting members 270 and 272 which are disposed within the side portion 267A of the supporting member 267. Similarly, in order to perform of the moving and/or tilting of the electromagnet assembly 252, it may or may not be necessary to coordinate the moving (the advancing or retracting as disclosed hereinabove) of some or all of the adjusting members 270 and 272 which are disposed within the side portion 267B of the supporting member 267.

Thus, in accordance with one non-limiting example, for tilting the electromagnet assembly 250 at a certain angle with respect to the mid-plane of the hybrid magnetic apparatus 249 it may be sufficient to turn one of the peripheral adjusting members 270 a certain number of turns, or fractions of turns, or a combination thereof, clockwise or counter-clockwise. However, in accordance with another non-limiting example, for tilting the electromagnet assembly 250 at other different angles with respect to the mid-plane of the hybrid magnetic apparatus 249 it may be necessary to turn one of the peripheral adjusting members 270 a certain number of turns, or fractions of turns, or a combination thereof, clockwise and to turn another one of the peripheral adjusting members 270 a certain number of turns, or fractions of turns, or a combination thereof, counter-clockwise.

In yet another, non-limiting example, for achieving the tilting of the electromagnet assembly 250 at other angles with respect to the mid-plane of the hybrid magnetic apparatus 249 and the moving the center-point of the electromagnet assembly 250 along the axis 288, it may be necessary to turn the corresponding axial adjusting member 272 a certain number of turns, or fractions of turns, or a combination thereof, clockwise, to turn one of the peripheral adjusting members 270 a certain number of turns, or fractions of turns, or a combination thereof, clockwise and to turn another one of the peripheral adjusting members 270 a certain number of turns, or fractions of turns, or a combination thereof, counter-clockwise.

It is noted that in performing some of the types of tilts or axial movements or combinations of tilts and axial movements disclosed hereinabove, there may be a predetermined relation between the amount of turning of one or more of the adjusting members 270 and 272 and the amount of turning required for one or more of the remaining adjusting members 270 and 272 in order to achieve a desired tilt angle. Such relations are well known in the mechanical arts, are not the subject matter of the present invention and are not therefor disclosed in detail hereinafter.

Those skilled in the art will appreciate that the disclosed arrangement of the adjusting members 270 and 272 on each of the side portions 267A and 267B of the supporting member 267, is a preferred arrangement, having the advantage of enabling a large number of possible tilting angles, axial movements and combinations of tilting and axial movements of the electromagnet assemblies 250 and 252. However, many other arrangements and modifications of the adjusting mechanism for adjusting the tilting and/or axial moving or displacement of the electromagnet assemblies 250 and 252 are known in the art. Such adjusting mechanisms may be used in the present invention, and are deemed to be within the scope of the present invention. For example, different types of moving and displacement and/or tilting mechanisms which may be used in the hybrid apparatus of the present invention may include, but are not limited to, rack and pinion mechanisms, various different gear mechanisms, and the like.

The preferred embodiment of the adjustable hybrid magnetic apparatus 249 of FIGS. 20 and 21 has the advantage that each of the electromagnet assemblies 250 and 252 may be individually and independently axially moved (along the axis 288) and/or tilted, and/or tilted and moved. These axial movements and tilts may be useful in shimming the magnetic field within the FOV 277. These movements and tilts may be useful in shimming magnetic field inhomogeneities resulting from asymmetries in the magnetic field of the super-conducting coil 280 of the electromagnet assembly 250, and of the corresponding opposing super-conducting coil (not shown) of the electromagnet assembly 252, which forms a Helmholtz coil pair with the super-conducting coil 280. Such asymmetries may result, inter alia, from shape or dimensional differences between the different coils of the Helmholtz coil pair included within the electromagnet assemblies 250 and 252, or from an inequalities or other asymmetries in the number, arrangement, and spatial distribution of the superconductor windings within the coils of the Helmholtz coil pair included within the electromagnet assemblies 250 and 252, which may arise due to inter alia, materials' and manufacturing tolerances.

An additional advantage of the preferred embodiment of the adjustable hybrid magnetic apparatus 249 of FIGS. 20 and 21 is that each of the electromagnet assemblies 250 and 252 may be individually and independently axially moved (along the axis 288) and/or tilted, and/or tilted and moved with respect to the permanent magnet assemblies 260 and 262, respectively. This may be advantageous in allowing the adjusting or tuning of the superposing of the magnetic fields generated by a permanent magnet assembly and the electromagnet assembly on each of the sides of the hybrid magnetic apparatus 249. Such tuning of the superposition of the magnetic fields has the advantage that it may be used to increase rate of rise (or the slope) of the magnetic field magnitude at the "shoulders" of the magnetic field curves representing the magnetic field intensity in the imaging volume, such as, for example, at the shoulders 234A and 234B of the magnetic field curve 234 illustrated in FIG. 19. This feature is advantageous since it reduces magnetic field folding (also known as "pixel folding" in the art) during imaging. Thus, if the rate of rise of the magnetic field magnitude at one such "shoulder" of the field is lower than the rate of rise of the other "shoulder" of the magnetic field magnitude curve associated with the hybrid magnetic apparatus 249, it may be possible to increase this lower rate of rise by moving or tilting or adjusting the position of the appropriate electromagnet assembly at the side in which the shoulder (not shown) has the lower rate of rise, without unduly degrading the homogeneity of the magnetic field within the FOV 277. It may also be possible to adjust the positions of both of the electromagnet assemblies 250 and 252, to achieve a desired compromise between the degree of homogeneity of the magnetic field within the FOV 277 and an acceptable degree of pixel folding.

A further advantage of the hybrid magnetic apparatus 249, is that the above disclosed adjustment of the electromagnet assemblies 250 and 252 may also be used to shim for other types of magnetic field inhomogeneities resulting from, inter alia, differences in the magnetic field strength of the permanent magnet assemblies 260 and 262 due to construction tolerances and/or positioning or alignment tolerances of the permanent magnet assemblies 260 and 262, and inaccuracies in the superposition of the magnetic fields of the two opposing complementary permanent magnet assemblies 260 and 262 due to mechanical bending of the arms of the U-shaped supporting member 256 by the forces acting thereupon due to the magnetic attraction between the permanent magnet assembly 260 and the permanent magnet assembly 262.

It will be appreciated by those skilled in the art that while the adjusting mechanism of the hybrid magnetic apparatus 249 is configured to be adjusted manually, or by using suitable manual tools or power tools, it may also be possible to construct motorized embodiments of the invention, in which suitable motors are used for controllably moving or tilting the electromagnet assemblies of the hybrid magnetic apparatus.

Figure 23:
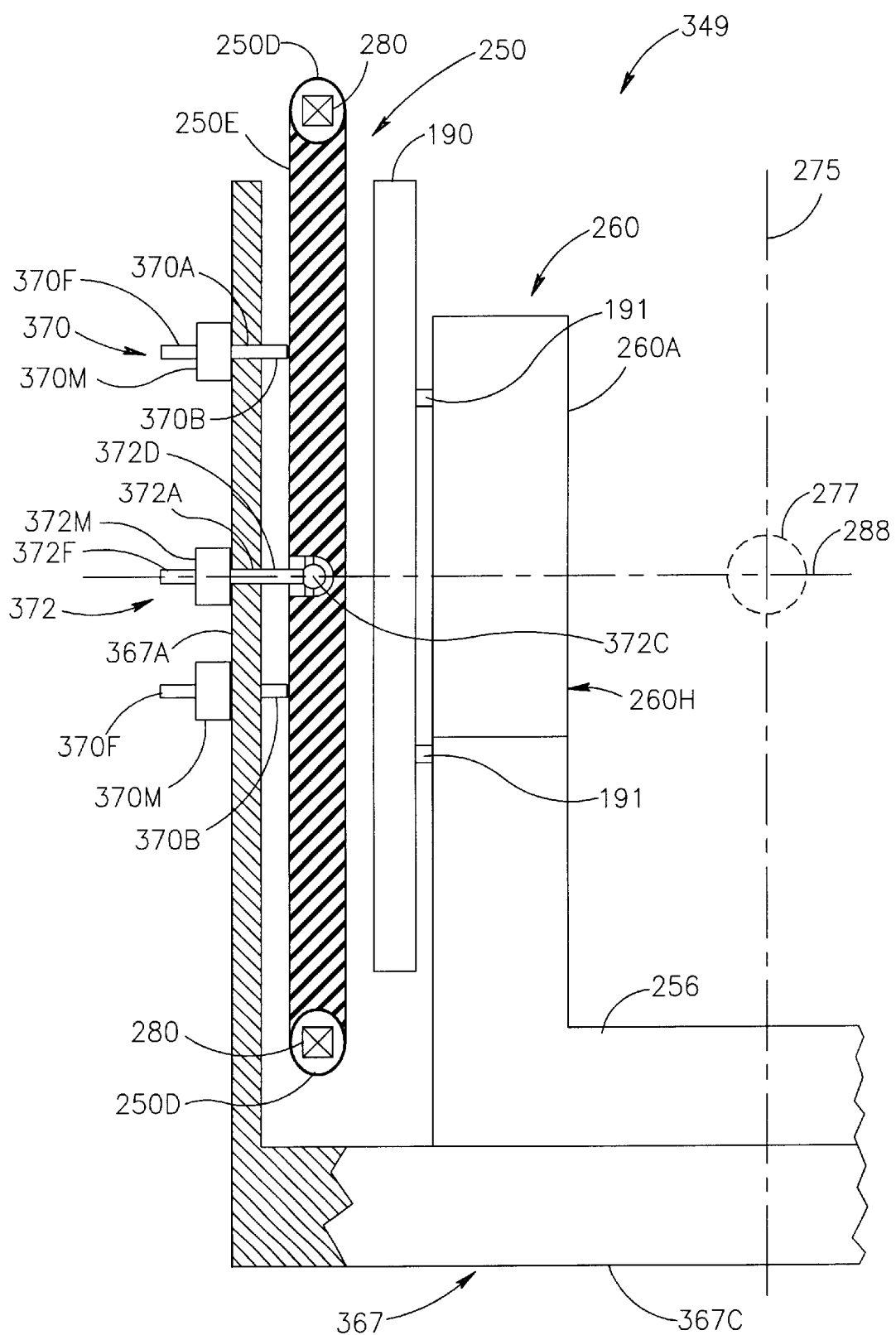
FIG. 23 is a schematic part cross-sectional, part side view illustrating a part of a hybrid magnetic apparatus, having motorized movable electromagnet assemblies, in accordance with another preferred embodiment of the present invention.

Reference is now to FIG. 23 which is a schematic, part cross-sectional, part side view illustrating a part of a motorized adjustable hybrid magnetic apparatus, in accordance with another preferred embodiment of the present invention. The components of the hybrid magnetic apparatus 349 are similar to the components of the hybrid magnetic apparatus 249 (FIG. 21), except that the supporting member 367 and the adjusting members 370 and 372 of the hybrid magnetic apparatus 349 are different from the supporting member 267 and the adjusting members 270 and 272 of the hybrid magnetic apparatus 249, respectively, to allow motorized adjustment of the position and inclination of the electromagnet assemblies of the hybrid magnetic apparatus 349, as disclosed in detail hereinafter. The supporting member 256 of FIG. 23 is suitably attached to the supporting member 367 of FIG. 23.

The supporting member 367 has hollow passages 370A and 372A passing therethrough. Preferably, the hollow passages 370A and 372A are not threaded and have a circular cross-section. However, the hollow passages 370A and 372A may also have other non-circular cross sections. Preferably, the arrangement and positioning of the hollow passages 370A and 372A within the supporting member 367 are similar to the arrangement and positioning of the hollow passages 270A and 272A within the supporting member 267. However, other different suitable arrangements and positioning of the hollow passages 370A and 372A within the supporting member 367 may also be used as disclosed hereinabove.

Each of the three peripheral adjusting members 370 (only two of which are seen in FIG. 23) includes a cylindrically shaped movable rod 370F and a piezoelectrically actuated motor 370M. The motors 370M are suitably attached to the side portion 367A of the supporting member 367, by suitable attaching means (not shown) such as, for example, a suitable glue, rivets, screws, suitable nuts and bolts, or the like. The movable rods 370F are suitably disposed within the hollow passages 370A, such that each of the rods 370F may be moved within the respective hollow passage 370A within which it is disposed in a direction towards or away from the supporting member 250E of the electromagnet assembly 250.

The axial adjusting member 372 includes a part cylindrical, part spherical shaped movable member 372F and a piezoelectrically actuated motor 370M. The motor 370M is suitably attached to the side portion 367A of the supporting member 367, as disclosed in detail hereinabove. The cylindrical part 372D of the movable member 370F is suitably disposed within the hollow passages 370A, such that it may be moved within the hollow passage 370A within which it is disposed in a direction towards or away from the permanent magnet assembly 250 along the axis 288.

Linear controllable moving of the rods 370F in directions parallel to the axis 288 may be performed by the respective piezoelectric motors 370M as is known in the art of piezoelectric motors. For example, the piezoelectric motor model HR-8, commercially available from Nanomotion Ltd. Yokneam, Israel, may be used as the motors 370M by suitably mechanically coupling it to the adjusting members 370 and 372 as is known in the art. However, it will be appreciated by those skilled in the art that other types of suitable motors known in the art may also be used for implementing the motors 370M. Preferably, the motors 370M should be MRI compatible motors, capable of withstanding external magnetic field and of operating within an external magnetic field. Preferably, the motors 370M have no intrinsic magnetic field of a magnitude which may undesirably interfere with the MRI imaging by introducing inhomogeneity in the magnetic field within the imaging volume or FOV.

All the motors 370M of the adjusting members 370 and 372 attached to the side portion 367A, may be suitably operatively connected to a suitable electrical power source (not shown) and to a common controller (not shown) for controlling the linear moving of the axial adjusting member 372 and of the peripheral adjusting members 370. The controller may be any type of suitable controller which is capable of programmably coordinating the moving of multiple parts, in accordance with preprogrammed data. In a non-limiting example, if the motors 370M are the HR-8 model piezoelectric motor, or any of the other piezoelectric motors currently commercially available from Nanomotion Ltd., the controller may be the model AB-1 Digital Driver Box, commercially available from Nanomotion Ltd., Yokneam, Israel, in communication with a computer. However other suitable controllers and motors may be also used to implement the present invention with the proviso that they are electrically and magnetically compatible for use with MRI or MRT or iMRI devices.

Such a computer controlled controller is required since the motorized moving of one or more of the adjusting members 370 and 372, may require coordinated moving of one or more of the remaining adjusting members, in order to prevent blocking of or interference with the movement of any of the adjusting members 370 and 372 caused by the change in position of the supporting member 250E resulting from the moving of the supporting member 250E by another of the adjusting members 370 and 372. Methods for the coordination of the moving of a plurality of actuators to move an object is well known in the art, is not the subject matter of the present invention and is therefore not disclosed in detail hereinafter.

Thus, the performing of certain types of axial moving, tilting and axial moving and tilting of the electromagnet assembly 250 by the adjusting members 370 and 372 may be similar to the respective moving or tilting or moving and tilting which have been disclosed for the electromagnet assembly 250 of the hybrid magnetic apparatus 249, with the exception that the axial moving, tilting, and axial moving and tilting may be controlled and coordinated by a suitable controller.

It is noted that, while the embodiments of the hybrid magnetic apparatus illustrated in FIGS. 20 and 21 the permanent magnet assemblies 260 and 262 are statically attached to the supporting member 256 such that the permanent magnet assemblies 260 and 262 cannot be moved with respect to the supporting member 256 (also referred to as static permanent assemblies hereinafter), this arrangement is not obligatory and other preferred embodiments of the present invention may be implemented in which the electromagnet assemblies (not shown) are non-movable with respect to a supporting member (not shown) which supports the electromagnet assemblies within the hybrid magnetic apparatus (also referred to as static electromagnet assemblies hereinafter), and the permanent magnet assemblies (not shown) are movable or adjustable with respect to a supporting member (not shown) which supports the permanent assemblies within the hybrid magnetic apparatus (also referred to as adjustable permanent magnet assemblies hereinafter), as is disclosed in detail hereinafter. Additionally, other preferred embodiments of the present invention may include adjustable electromagnet assemblies and adjustable permanent magnet assemblies, as is disclosed in detail hereinafter.

It is further noted that the term static permanent magnet assembly or assemblies is used to indicate that the entire permanent magnet assembly is not movable or adjustable with respect to a supporting member (not shown) which supports the permanent assemblies within the hybrid magnetic apparatus. However, one or more of the individual components included within the permanent magnet assembly, such as, but not limited to the permanent magnets included in the permanent magnet assembly, and various other components of the permanent magnet assembly, such as but not limited to offsetting screws or other offsetting members or other components may be adjustable, and/or movable, and/or rotatable, and/or tunable with respect to the entire permanent magnet assembly, or with respect to each other, or with respect to a housing (not shown) included in the permanent magnet assembly. Thus, for example, the permanent magnet 200 of FIG. 16 is movable, rotatable, and tiltable, with respect to the annular permanent magnet 204 (FIG. 16) and with respect to the entire permanent magnet assembly 150 (best seen in FIG. 13). Similarly, the offsetting screws 219 are rotatably movable within the inner ring-like supporting member 216 (FIG. 16), and the offsetting screws 220 are rotatably movable within the L-shaped members 214A (FIG. 16).

Similarly, the use of the term static electromagnet assembly or assemblies indicates that the entire electromagnet assembly or electromagnet assemblies are not movable with respect to a supporting member (not shown) which supports the electromagnet assembly or assemblies within the hybrid magnetic apparatus, and does not mean that various components within the electromagnet assembly are not movable within the electromagnet assembly. Thus, for example, the coil 280 (FIG. 21) may or may not be movable, and/or adjustable, and/or rotatable with respect to the Dewar 250D (FIG. 21), the Dewar 250 may or may not be movable, and/or adjustable, and/or rotatable with respect to the supporting member 250E (FIG. 21). The adjustable aspect of the various components of the permanent magnet assemblies and the electromagnet assemblies of the invention has the advantage of providing additional tuning capability of the permanent magnet assemblies and/or the electromagnet assemblies of the hybrid magnetic apparatus of the present invention. Such tuning may be performed at desired stages of the construction and/or operation of the hybrid magnetic apparatus of the present invention, such as but not limited to during or after construction of the permanent magnet assemblies or of the electromagnet assemblies, enabling separately and independently tuning the magnetic field of the permanent magnet assemblies and/or of the electromagnet assemblies prior to the assembling of the entire hybrid magnetic apparatus, and also enabling the fine tuning the magnetic field of the permanent magnet assemblies and/or of the electromagnet assemblies, or of the entire hybrid magnetic apparatus during or after the assembling of the entire hybrid magnetic apparatus.

Figure 24:
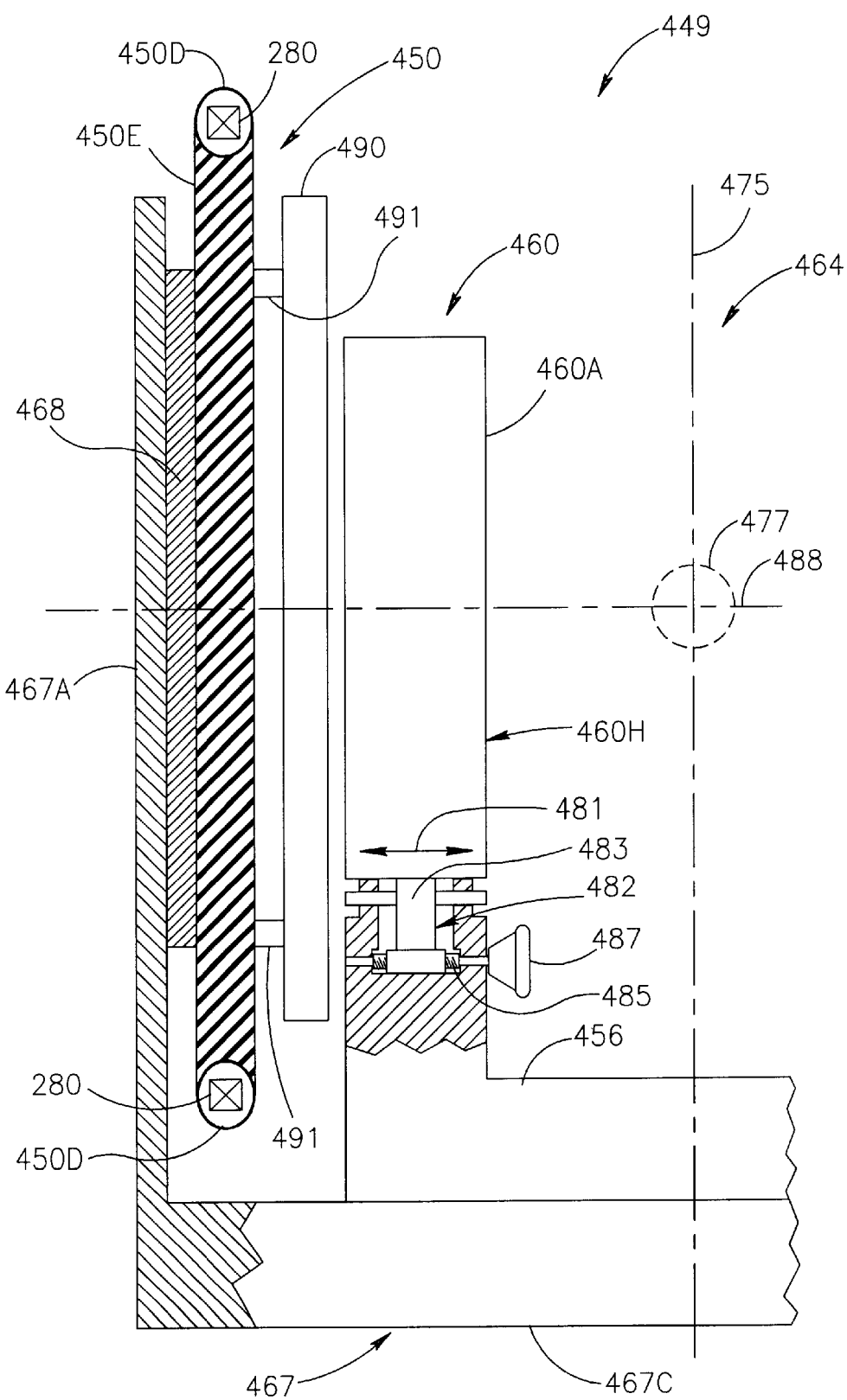
FIG. 24 is a schematic, part cross-sectional, part side-view illustrating part of a hybrid magnetic apparatus having static electromagnet assemblies and movable permanent magnet assemblies, in accordance with another preferred embodiment of the present invention.

Reference is now made to FIG. 24 which is a schematic, part cross-sectional, part side-view illustrating part of a hybrid magnetic apparatus having static electromagnet assemblies and adjustable permanent magnet assemblies, in accordance with another preferred embodiment of the present invention.

The hybrid magnetic apparatus 449 of FIG. 24 includes an electromagnetic flux generator including two opposing static electromagnet assemblies, a static electromagnet assembly 450 and an opposing complementary static electromagnet assembly (not shown in FIG. 24). The static electromagnet assembly 450 includes a Dewar 450D. The Dewar 450D is attached or suitably mounted on a supporting member 450E. The supporting member 450E may be made from stainless steel or from any other suitable material or materials or composite material having low magnetic permeability and sufficient structural rigidity such as, for example, fiberglass, a reinforced plastic material or the like. The Dewar 450D may be a generally toroidally shaped hollow Dewar cryogenic bottle or container having a circular or ellipsoidal or other cross-section, but any other suitable Dewar bottle form known in the art may also be used. The Dewar 480D includes a super-conducting coil 280 therewithin.

The hybrid magnet assembly 449 may further include a supporting member 467. The supporting member 467 has a base portion 467C and two side portions. The side portion 467A is shaped as illustrated in FIG. 24, and the other complementary side portion (not shown in FIG. 24) is shaped as a mirror image of the side portion 467A. The supporting member 467 may be made from stainless steel or from any other suitable metal or material or materials having low magnetic permeability and suitable structural rigidity such as, for example, fiberglass, a reinforced plastic material or the like.

The supporting member 450E may be suitably attached to the side portion 467A of the supporting member 467. The attachment of the supporting member 450E to the side portion 467A may be through a spacer member 468. The spacer member 468 may be a disk-like member or may have any other suitable shape. The spacer member 468 may be attached to the supporting member 450E and to the side portion 467A by glued or by bolts or rivets or screws or by any other suitable attachment method or attaching devices which are known in the art.

Preferably, the spacer member 468 may include or be constructed from a material or materials or a composition which has low magnetic permeability. However, the spacer member 468 may include or be mage from other types of materials including a material or materials having high magnetic permeability, such as soft iron or the like.

Alternatively, in accordance with another preferred embodiment of the invention, the supporting member 450E may be directly attached or bonded to the side portion 467A by a suitable glue or by other means of attaching such as, but not limited to, screws, bolts and/or nuts, rivets or the like.

It is further noted that, while the embodiments of the invention disclosed herein and illustrated in the drawing figures, are adapted for using cryogenic Dewar bottles or containers for maintaining a suitable low temperature of the super-conducting coils 280, other preferred embodiments of the present invention may use other temperature control and maintenance means known in the art as disclosed hereinabove.

The static electromagnet assembly 450 and the other complementary opposing static electromagnet assembly (not shown in FIG. 24) are spaced apart from each other, and may be generally equidistant from the center of the FOV 477, along a common axis 488 disposed and arranged similar to the electromagnet assemblies 150 and 152 of FIGS. 13 and 15. The super-conducting coil 280 is disposed within the Dewar 450D as is known in the art. Similarly, another similar super-conducting coil (not shown) is disposed within the complementary opposing Dewar (not shown in FIG. 24). Preferably, but not necessarily, the two super-conducting coils 280 are configured as a Helmholtz coil pair, as is known in the art. The electrical connections of the coils 280 forming the Helmholtz pair are not shown in detail for the sake of clarity of illustration, such connections are well known in the art, are not the subject matter of the present invention, and are therefore not disclosed in detail hereinafter. However, other suitable arrangements of coils or coil pairs which are known in the art of electromagnet designing may also be used in other preferred embodiments of the present invention, and are considered to be within the scope of the present invention. Additionally, more than one pair of coils may be used as disclosed hereinabove and as is known in the art of electromagnet construction. For example, a plurality of nested or non-nested Helmholtz coil pairs may be used, or any other suitable coil arrangement known in the art. Preferably, the electromagnet coils 280 are cooled by liquid nitrogen disposed in the Dewar 450D and in the opposing complementary Dewar (not shown), but other coolants known in the art may also be used such as, for example liquid helium. The choice of coolant may be determined by the type of superconductor used in the construction of the electromagnet coils 280 of the hybrid magnetic apparatus 449. Preferably, the coil 280 and the complementary coil (not shown) forming the Helmholtz coil pair of the hybrid magnetic apparatus 449 may be high temperature super-conducting (HTS) coils, and the cooling method may be liquid nitrogen cooling (Passive cooling in a liquid nitrogen Dewar), or nitrogen gas cooling, or evaporative cooling of liquid nitrogen, or cryo-cooling or the like. However, low temperature super-conducting (LTS) coils may also be used and the cooling method may be liquid helium cooling (passive cooling in a liquid helium Dewar), or helium gas cooling, or evaporative cooling of liquid helium, or cryo-cooling, or the like as is known in the art.

The super-conducting coils may be made of any suitable super-conducting material known in the art. For example, the super-conducting coils, such as for example the coils 280 may be made from niobium-titanium compositions (NbTi), or from niobium-tin-technetium compositions such as $Nb_3SnTc$, or from ceramic superconductor compositions such as but not limited to bismuth-strontium-calcium-cobalt oxides, such as $Bi_2Sr_2Ca_{2\ Co2}O_3$, or the like. However, any other suitable superconductor materials or compositions known in the art may be used to implement LTS coils or HTS coils suitable for use in the present invention.

The magnetic apparatus 449 further includes two opposing movable adjustable opposing permanent magnet assemblies (of which only the movable permanent magnet assembly 460 is illustrated in FIG. 24, for the sake of clarity of illustration). The movable permanent magnet assembly 460 is movably attached to a supporting member 456. The supporting member 456 of FIG. 24 is suitably attached to the supporting member 467 of FIG. 24.

In the non-limiting example illustrated in FIG. 24, the movable permanent magnet assembly 460 may be moved with respect to the supporting member 456 in the directions indicated by the double headed arrow 481 by a moving mechanism 482. The moving mechanism 482 is suitably attached to the supporting member 456 and to the movable permanent magnet assembly 460. The moving mechanism 482 includes a connecting member 483 which is attached to the housing 460H of the movable permanent magnet assembly 460. The moving mechanism 482 also includes a helical screw member 485 which is rotatably disposed within the supporting member 456. The helical screw member 485 is also rotatably disposed within a suitable threaded passage (not shown in detail) formed within the connecting member 483. The moving mechanism 482 also includes a handle 487 which is attached to the helical screw member 485.

When the handle 487 is rotated, the helical screw member 485 rotates causing the connecting member 483 and the movable permanent magnet assembly 460 attached thereto to move in a direction parallel to the axis 488. In a non-limiting example, when the handle 487 is rotated clockwise the movable permanent magnet assembly 450 is moved towards the center of the FOV 477, when the handle 487 is rotated counterclockwise, the movable permanent magnet assembly 450 is moved away from the center of the FOV 477. However, the relation between the direction of rotation of the handle 487 and the direction of the movement of the movable permanent magnet assembly 460 depends on the pitch of the helical part of the helical screw member 485.

The rotating of the handle 487 may be performed manually, or by using a suitable power tool (not shown) detachably coupled to the handle 487, or by a suitable motor (not shown) operatively coupled to the handle 487. Such a motor needs to be an MRI compatible motor, such as but not limited to, an MRI compatible piezoelectric motor as is known in the art and disclosed hereinabove, or any other suitable type of MRI compatible motor known in the art.

It is noted that the particular structure and operating method of the moving mechanism 482 illustrated in FIG. 24 are not obligatory to the invention. It will be appreciated by those skilled in the mechanical arts that many different moving mechanisms may be implemented for moving the movable permanent magnet assembly 460 along the axis 488. Such moving mechanisms may include, but are not limited to, rack and pinion based mechanisms, mechanical gear based mechanisms, linear actuators including but not limited to hydraulic, pneumatic or electrical actuators, various screw driven mechanisms, vibration positioning mechanisms, belt driven mechanisms, bearing screw drive mechanisms, and the like.

It is also noted that while the moving mechanism 482 is attached to the lower end of the movable permanent magnet assembly 460 as illustrated in FIG. 24, other preferred embodiments of the invention may use supporting members (not shown) which are configured differently than the supporting member 456, and which may provide one or more moving mechanisms (not shown) and/or one or more guiding members (not shown) which may be suitable attached to or in contact with the housing 460H of the movable permanent magnet assembly 460 at more than one point on the housing 460H. Thus, any other suitable type of moving mechanism known in the art may be used for moving the movable permanent magnet assembly 460 along the axis 488.

An open region 464 is defined between the movable permanent magnet assembly 460 and the complementary opposing movable permanent magnet assembly (not shown) of the hybrid magnetic apparatus 449. The dashed line 475 represents the line of intersection of a mid-plane (not shown) with the plane in which the cross section of FIG. 24 lies (represented by the plane of the page of the drawing of FIG. 24). The mid-plane is equidistant from the inner surface 460A of the movable permanent magnet assembly 460 and the corresponding opposed inner surface (not shown) of the complementary opposing movable permanent magnet assembly (not shown). The mid-plane also symmetrically bisects the FOV 477 of the magnetic apparatus 449.

The hybrid magnetic apparatus 449 may further include two opposing gradient coil assemblies similar to the gradient coil assemblies 190 and 192 disclosed hereinabove and illustrated in FIG. 13. The gradient coil assembly 190 of FIG. 24 is disposed between the movable permanent magnet assembly 460 and the static electromagnet assembly 450. The gradient coil assembly 190 may be attached to the static electromagnet assembly 450 by suitable attaching members 491. The attaching members 491 may be any suitable attaching members. For example, the attaching members 491 may be members made from a material or materials having low magnetic permeability, such as but not limited to plastic, fiberglass, stainless steel, or the like. The attaching members 491 may be attached to the gradient coil assembly 190 and to the supporting member 450E by a suitable glue or by screws or by any other suitable attachment method. The attaching members 491 may also be movably or adjustably attached to the gradient coil assembly 190 and/or to the supporting member 450E such as to enable fine tuning of the distance of the gradient coil assembly 190 from the supporting member 450E, and/or tilting angle of the gradient coil assembly 190 with respect to the supporting member 450E. For example, each of the attaching members 491 may include two parts (not shown) which may be moved with respect to each other or with respect to a suitable housing (not shown) by a suitable coupling mechanism (not shown). If the attaching members 491 are adjustable attaching member, the distance between the supporting member 450E and the gradient coil assembly 190 may be controlled or fine tuned by suitably tuning the attaching members 491. Similarly, the tilt angle of the gradient coil assembly 190 with respect to the supporting member 450E may be adjusted by suitably tuning one or more of the attaching members 491.

It is noted that, in accordance with another preferred embodiment of the present invention, the gradient coil assembly 190 may be directly attached (not shown) or glued or suitably connected to the supporting member 450E, obviating the need for the attaching members 491.

It is noted that the second gradient coil assembly of the hybrid magnetic apparatus 449 is not shown in FIG. 24 since FIG. 24 illustrates a cross-sectional view of a part of the hybrid magnetic apparatus 249. However, the other complementary parts and components of the hybrid magnetic apparatus 449 which are not shown in FIG. 24 are constructed as a mirror image of the shown parts and components with respect to the mid-plane intersecting the plane of the sheet of drawing FIG. 24 at the dashed line 475, which mid-plane is orthogonal to the plane of the drawing sheet of FIG. 24. Thus, for example, the complementary Dewar (not shown) opposed to the Dewar 450D may be shaped as a mirror image of the Dewar 450D, and the second gradient coil (not shown) of the hybrid magnetic apparatus 449 may be shaped as a mirror image of the complementary gradient coil 190 of FIG. 24.

It is noted that while the movable permanent magnet assembly 460 and the opposing complementary movable permanent magnet assembly (not shown) are shaped as mirror images with respect to the mid-plane of the hybrid magnetic apparatus 449, the directions of magnetization of the opposing complementary permanent magnet pairs included within the movable permanent magnet assembly 460 and within the opposing complementary movable permanent magnet assembly (not shown) of the hybrid magnetic apparatus 449, as disclosed hereinabove, are not arranged as mirror images of each other but are rather directed in the same direction within each pair of opposing complementary permanent magnets (the permanent magnets are not shown in FIG. 24). However, the direction of magnetization of different complementary pairs of permanent magnets may or may not be directed in the same direction, depending, inter alia, on the specific design, type and number of complementary pairs of the annular or disc-like, polygonal-annular or polygonal prismatic permanent magnets, as disclosed in detail hereinabove, and in the above referenced, commonly assigned U.S. Pat. No. 5,900, 793, co-pending U.S. patent applications and their corresponding PCT applications.

It is noted that the attaching members 491 may be attached to the gradient coil assembly 190 and to the supporting member 450E by a suitable glue or by screws (not shown), nuts and bolts (not shown) or by any other suitable attaching means or attaching methods known in the art. However, the gradient coil assembly 190 may also be suitably attached to the supporting member 456, or to the supporting member 467 or to any other suitable non-moving structural part or member of the hybrid magnetic apparatus 449.

It is noted that, the structure and positioning of the gradient coil assembly 190 of the hybrid magnetic apparatus 449 may be any suitable structure and positioning which is known in the art, including, but not limited to, all the different structures and arrangements of gradient coils or gradient coil combinations (or gradient coil pair arrangements) disclosed in detail in U.S. patent application Ser. No. 09/161,336 to Zuk et al., and the corresponding International Publication No. WO 99/15914.

Similarly, the transmitting and receiving RF coils (not shown) which are used for imaging with the magnetic apparatus 449 of the present invention, may have any suitable known structure and spatial position which is known in the art of RF coils, including, but not limited to, all the different structures and arrangements of RF coils disclosed in detail in U.S. patent application Ser. No. 09/161, 336 to Zuk et al., and the corresponding International Publication No. WO 99/15914.

Each of the movable permanent magnet assembly 460 and the complementary opposing movable permanent magnet assembly (not shown in FIG. 24) included in the hybrid magnetic apparatus 449 may include a plurality of generally annular or disc-like permanent magnets (not shown in FIG. 24 for the sake of clarity of illustration), as disclosed in detail hereinabove. The line 488 of FIG. 24 represents the common axis passing through the geometrical center of all the annular permanent magnets (not shown) of the permanent magnet assemblies 260 and 262 (and through the geometrical center of the disc-like permanent magnets if they are included in the movable permanent magnet assembly 460 and the complementary opposing movable permanent magnet assembly included in the hybrid magnetic apparatus 449, as disclosed in detail hereinabove (see FIG. 16). The axis 488 is also defined as the z-axis of the hybrid magnetic apparatus 449. The main magnetic field generated by the magnetic apparatus 449 is directed in parallel to the z-axis 488.

The structure and arrangement of the permanent magnets which may be included in the movable permanent magnet assemblies of the hybrid magnetic apparatus 449 has been disclosed in detail hereinabove and in U.S. patent application Ser. No. 09/161,336, to Zuk et al., and the corresponding International Publication No. WO 99/15914. In accordance with a preferred embodiment of the present invention, the shape and arrangement of the annular permanent magnets of movable permanent magnet assembly 460 may be similar to the shape and arrangement of the annular permanent magnets 40a, 40b and 40c of the permanent magnet assembly 40 of FIGS. 4–7 and the shape and arrangement of the annular permanent magnets included in the complementary movable permanent magnet assembly (not shown) which opposes the movable permanent magnet assembly 460 within the hybrid magnetic apparatus 449 may be similar to the arrangement of the annular permanent magnets 42a, 42b and 42c of the permanent magnet assembly 42 of FIGS. 4–7.

In accordance with another preferred embodiment of the present invention, the shape and arrangement of the annular permanent magnets (not shown) included in the movable permanent magnet assembly 460 may be similar to the shape and arrangement of the annular permanent magnets 140a, 140b and 140c of the permanent magnet assembly 140 of FIG. 8 and the shape and arrangement of the annular permanent magnets included in the complementary movable permanent magnet assembly (not shown) which opposes the movable permanent magnet assembly 460 within the hybrid magnetic apparatus 449 may be similar to the arrangement of the annular permanent magnets 142a, 142b and 142c of the permanent magnet assembly 142 of FIG. 8.

It is noted that the arrangement or configuration of the direction and orientation of the magnetic fields of the various permanent magnets included in the movable permanent magnet assemblies of the hybrid magnetic apparatus 449 may include any suitable arrangement and configuration known in the art, including but not limited to the specific configurations and arrangements disclosed herein or in any of the above referenced co-assigned patents or co-pending cop-assigned patent applications and their corresponding international publications.

In accordance with yet another preferred embodiment of the present invention, the movable permanent magnet assembly 460 and the other complementary opposing movable permanent magnet assembly (not shown) included in the hybrid magnetic apparatus 449 may be constructed similar to the permanent magnet assemblies disclosed in U.S. patent application Ser. No. 09/161,336, to Zuk et al., and the corresponding International Publication No. WO 99/15914.

The preferred embodiment of the adjustable hybrid magnetic apparatus 449 of FIG. 24 has the advantage that each of the movable permanent magnet assemblies of the hybrid magnetic apparatus 449, including the movable permanent magnet assembly 460 of FIG. 24, and the complementary opposed movable permanent magnet assembly (not shown) may be individually and independently axially moved along the axis 288. These axial movements may be useful in shimming the magnetic field within the FOV 477. These movements may be useful in shimming magnetic field inhomogeneities resulting from asymmetries in the magnetic field of the super-conducting coil 280 of the static electromagnet assembly 450, and of the corresponding opposing super-conducting coil (not shown in FIG. 24) of the complementary static electromagnet assembly (not shown) included in the hybrid magnetic apparatus 449, which forms a Helmholtz coil pair with the super-conducting coil 280 of the Dewar 450D. Such asymmetries may result, inter alia, from shape or dimensional differences between the different coils of the Helmholtz coil pair, or from an inequalities or other asymmetries in the number, arrangement, and spatial distribution of the superconductor windings within the coils 280 of the Helmholtz coil pair included within the electromagnet assemblies of the hybrid magnetic apparatus 449, which inequalities may arise due to inter alia, materials' and manufacturing tolerances.

An additional advantage of the preferred embodiment of the adjustable hybrid magnetic apparatus 449 is that each of the movable permanent assemblies included in the hybrid magnetic apparatus 449 may be individually and independently axially moved along the axis 288 with respect to the static electromagnet assemblies included in the hybrid magnetic apparatus 449. This may be advantageous in allowing the adjusting or tuning of the superposing of the magnetic fields generated by a permanent magnet assembly and the electromagnet assembly on each of the sides of the hybrid magnetic apparatus 449. Such tuning of the superposition of the magnetic fields has the advantage that it may be used to increase rate of rise (or the slope) of the magnetic field magnitude at the "shoulders" of the magnetic field curves representing the magnetic field intensity in the imaging volume, as disclosed in detail hereinabove. This feature is advantageous since it reduces magnetic field folding (also known as "pixel folding" in the art) during imaging. Thus, if the rate of rise of the magnetic field magnitude at one such "shoulder" of the field is lower than the rate of rise of the other "shoulder" of the magnetic field magnitude curve associated with the hybrid magnetic apparatus 449, it may be possible to increase this lower rate of rise by moving the appropriate movable permanent magnet assembly at the side in which the shoulder (not shown) has the lower rate of rise, without unduly degrading the homogeneity of the magnetic field within the FOV 477. It may also be possible to adjust the positions of both of the movable permanent magnet assemblies of the hybrid magnetic apparatus 449, to achieve a desired compromise between the degree of homogeneity of the magnetic field within the FOV 477 and an acceptable degree of pixel folding.

A further advantage of the hybrid magnetic apparatus 449, is that the above disclosed adjustment of the movable permanent magnet assemblies of the hybrid magnetic apparatus 449 may also be used to shim for other types of magnetic field inhomogeneities resulting from, inter alia, differences in the magnetic field strength of the movable permanent magnet assemblies included in the hybrid magnetic apparatus 449 due to construction tolerances and/or positioning or alignment tolerances of the permanent magnet assemblies, and inaccuracies in the superposition of the magnetic fields of the two opposing complementary electromagnet assemblies of the hybrid magnetic apparatus 449 due to mechanical bending of the side portion 467A and of the complementary side portion (not shown in FIG. 24) of the supporting member 467 by the forces acting thereupon due to the magnetic attraction between the electromagnet assembly 450 and the permanent magnet assembly 262 and/or between the two electromagnet assemblies included in the hybrid magnetic apparatus 449.

Figure 25:
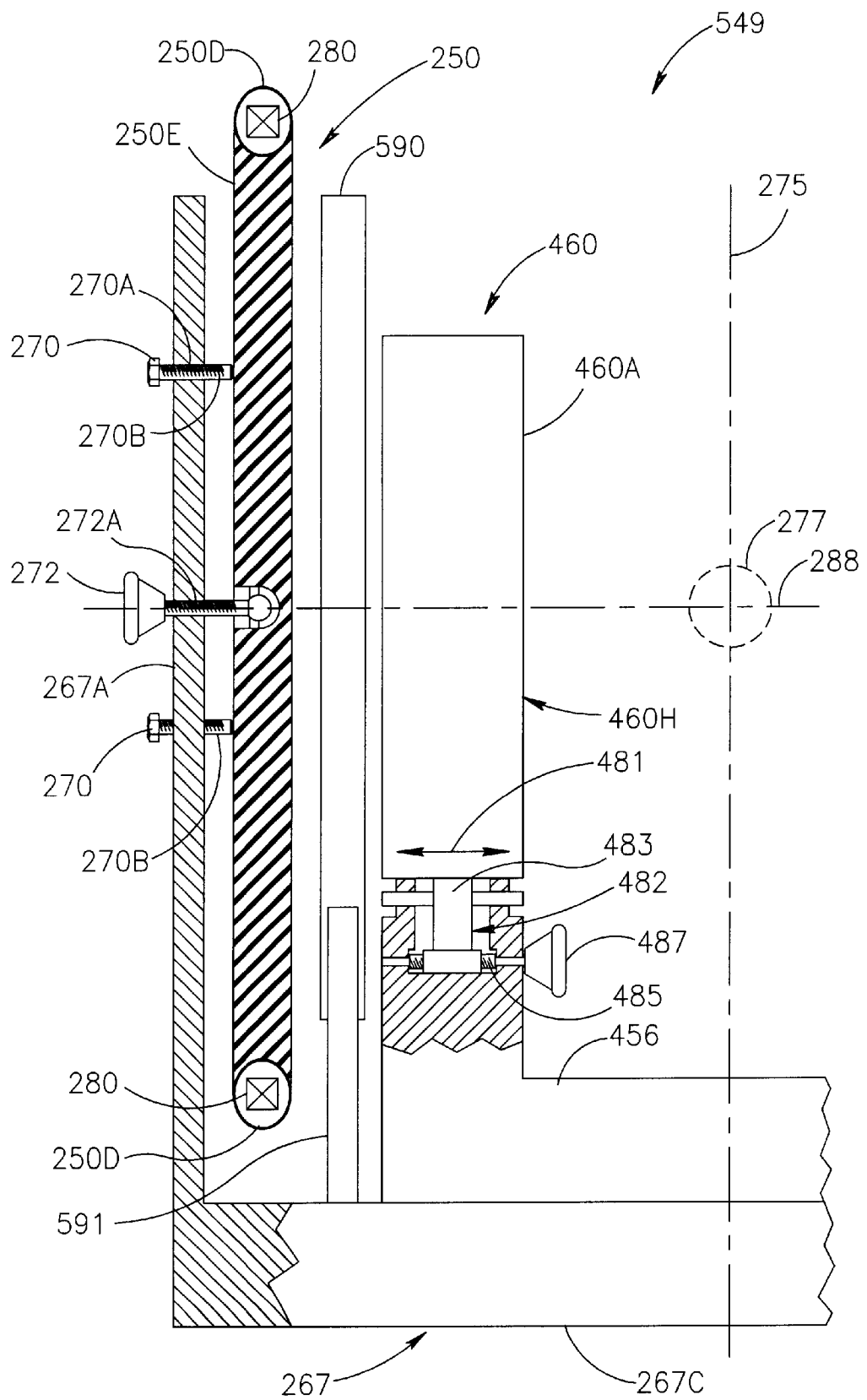
FIG. 25 is a schematic, part cross-sectional, part side-view illustrating part of a hybrid magnetic apparatus having movable electromagnet assemblies and motorized movable permanent magnet assemblies, in accordance with yet another preferred embodiment of the present invention.

Reference is now made to FIG. 25 which is a schematic, part cross-sectional, part side-view illustrating part of an adjustable hybrid magnetic apparatus having movable electromagnet assemblies and movable permanent magnet assemblies, in accordance with yet another preferred embodiment of the present invention.

In the hybrid magnetic apparatus 549 is constructed such that each of the two movable electromagnet assemblies included therein and each of the two movable permanent magnet assemblies included therein are independently movable and/or adjustable.

The hybrid magnetic apparatus 549 includes the movable electromagnet assembly 250 which is constructed and operative as illustrated in FIG. 21 and disclosed in detail hereinabove, and a complementary movable electromagnet assembly (not shown in FIG. 25) which is shaped as a mirror image of the movable electromagnet assembly 250 and which opposes the movable electromagnet assembly 250, as disclosed in detail hereinabove. The movable electromagnet assemblies of the hybrid magnetic apparatus 549 are each movably and tiltably attached to the supporting member 267, as disclosed in detail hereinabove, and may be moved along the common axis 288, with respect to the mid-plane of the hybrid magnetic apparatus 549, as disclosed in detail hereinabove. The mid-plane (not shown in FIG. 25) intersects the plane of the drawing FIG. 25 at the dashed line 275. The movable electromagnet assemblies of the hybrid magnetic apparatus 549 may also be tilted at various angles with respect to the mid-plane intersecting the plane of the drawing FIG. 25 at the dashed line 275, and may also be moved and tilted, as disclosed in detail hereinabove.

The hybrid magnetic apparatus 549 also includes the movable permanent magnet assembly 460 which is constructed and operative as illustrated in FIG. 24 and disclosed in detail hereinabove, and a complementary movable permanent magnet assembly (not shown in FIG. 25) which is physically (but not magnetically) configured as a mirror image of the movable permanent magnet assembly 460 and which opposes the movable electromagnet assembly 460, as disclosed in detail hereinabove. The movable permanent magnet assemblies of the hybrid magnetic apparatus 549 are movably and adjustably attached to the supporting member 456 as disclosed in detail hereinabove. The supporting member 456 of FIG. 25 is suitably attached to the supporting member 267 of FIG. 25.

It in noted that as disclosed in detail hereinabove, the direction of magnetization of any of the permanent magnets (not shown) included in the movable permanent magnet assembly 460 is identical to the direction of magnetization of the complementary opposed permanent magnet (not shown) included in the complementary opposed movable permanent magnet assembly of the hybrid magnetic apparatus 549.

It is further noted that this identity of the direction of magnetization within such complementary opposed permanent magnets of opposed permanent magnet assemblies generally applies to all of the embodiments of the hybrid magnetic apparatus of the present invention, irrespective of whether the permanent magnet assemblies are static permanent magnet assemblies or movable permanent magnet assemblies.

The movable permanent magnet assemblies of the hybrid magnetic apparatus 549 are each movably attached to the supporting member 456, as disclosed in detail hereinabove, and may be moved along the common axis 288, with respect to the mid-plane of the hybrid magnetic apparatus 549, as disclosed in detail hereinabove. The mid-plane (not shown in FIG. 25) intersects the plane of the drawing FIG. 25 at the dashed line 275.

The hybrid magnetic apparatus 549 also includes a gradient coil assembly 590 which is similar in construction and operation to the gradient coil assemblies 190 and 490 of FIGS. 21 and 24, respectively, with the exception that the gradient coil assembly 590 is to a suitable supporting member 591. The supporting member 591 is attached to the supporting member 267 of FIG. 25. However, the gradient coil assembly 590 may also be attached to a non-moving or other static, non-movable parts of the supporting member 456, or to any alternative non-moving structural member (not shown) of the hybrid magnetic assembly 549.

The above disclosed alternative methods of attaching the gradient coil assembly within the hybrid magnetic apparatus have the common feature that they ensure that the gradient coil assembly 590 is not moved and is in a fixed position with respect to the FOV 277, irrespective of the adjustments of the position of the movable permanent magnet assembly 460, or of the adjustments, movements or angle of tilt of the movable electromagnet assembly 250.

The hybrid magnetic apparatus 549 of FIG. 25 has all the above disclosed advantages of the hybrid magnetic apparatus 249 and 449 of FIGS. 21 and 24, respectively, and an additional advantage of having increased flexibility in enabling more alternatives for adjusting and fine tuning the parameters of the magnetic field within the FOV 277, such as, for example, the degree of homogeneity of the magnetic field within the FOV 277, and the rate of change of the magnetic field curve at the shoulders of the magnetic field curve as disclosed in detail hereinabove, thus providing a higher degree of freedom in tuning and adjusting the magnetic field. This flexibility may enable the achievement of better tuning or shimming of the magnetic field properties and may also shorten the time required to achieve satisfactory shimming.

It is noted that many permutations and combinations of the various preferred embodiments of the hybrid magnetic apparatus of present invention may be made. For example, various combinations of static, manually movable and motorized permanent magnet assemblies and electromagnet assemblies may be used.

Figure 26:
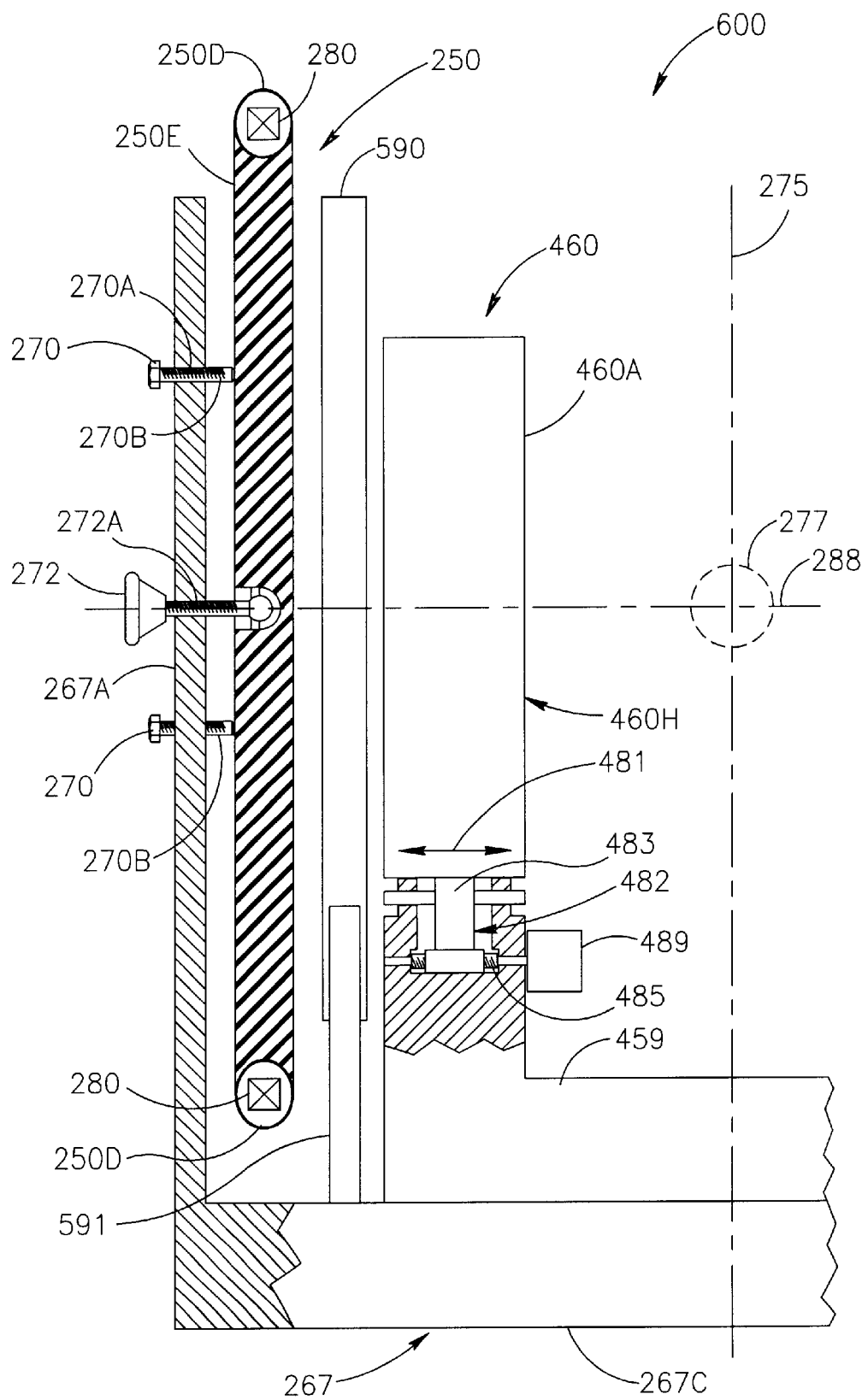
FIGS. 26–28 are schematic, part cross-sectional part side view diagrams illustrating portions of different motorized hybrid magnetic apparatus, in accordance with additional preferred embodiments of the present invention.
Figure 27:
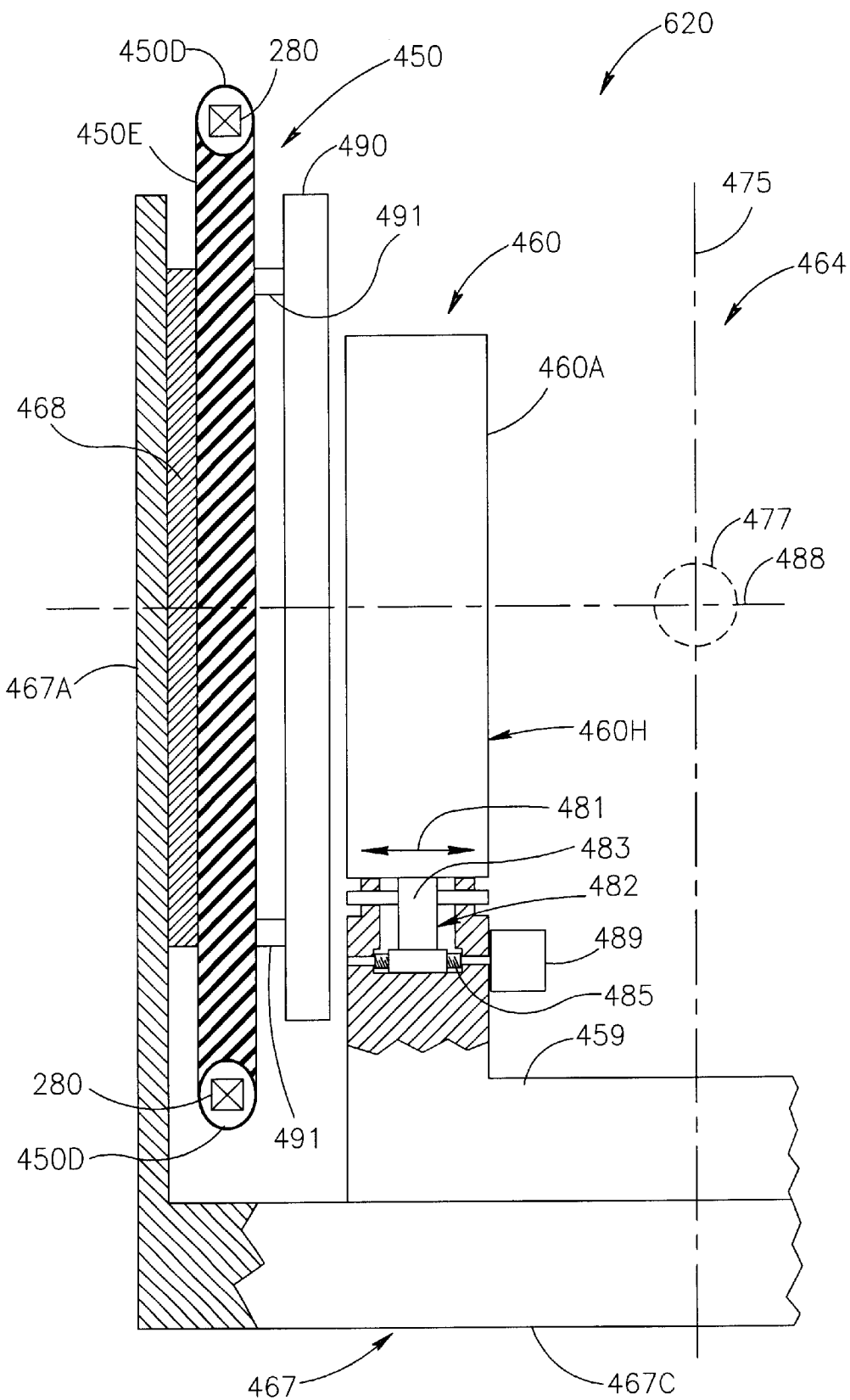
Figure 28:
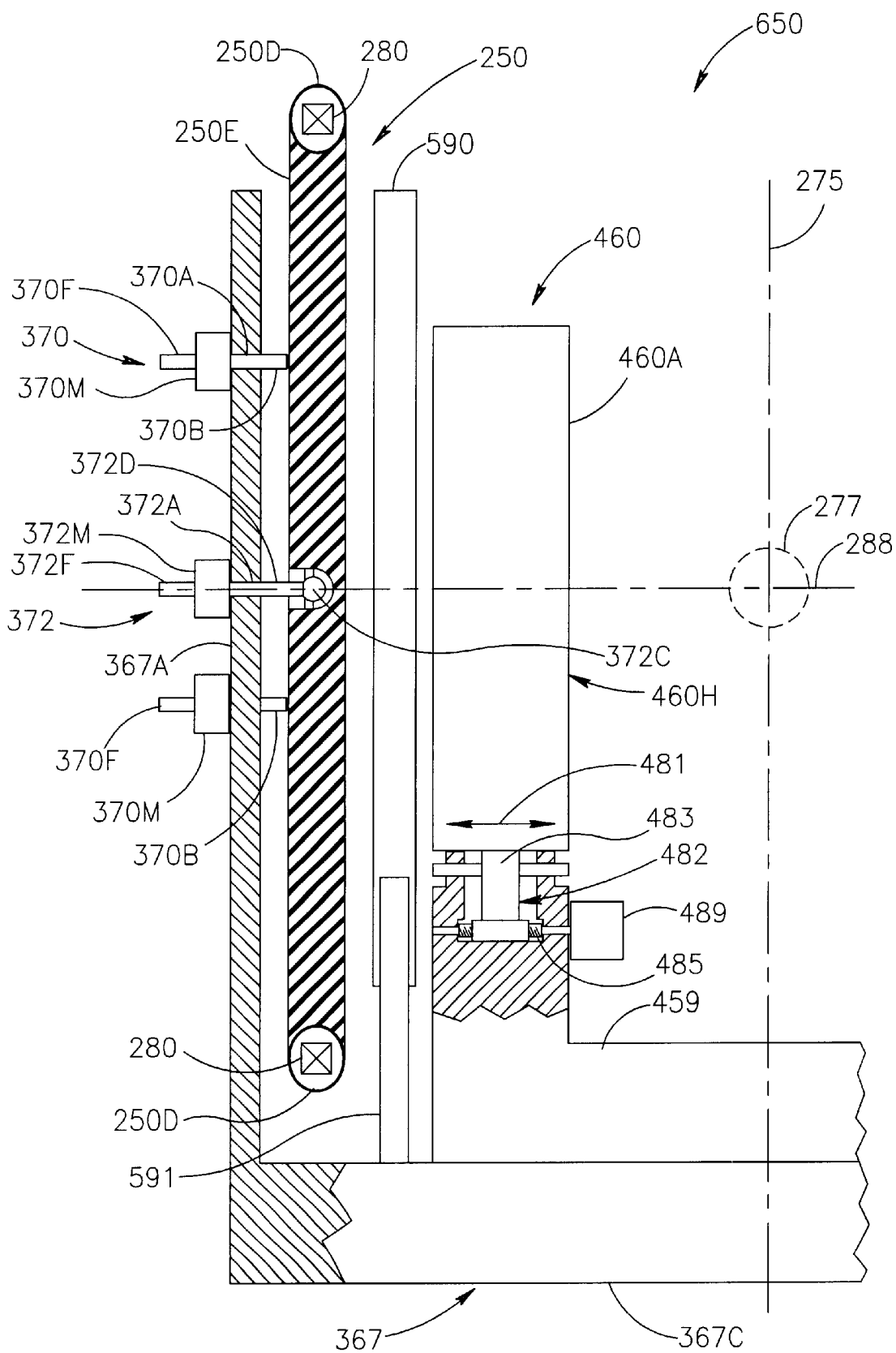

Reference is now made to FIGS. 26–28 which are schematic, part cross-sectional part side view diagrams illustrating portions of different preferred embodiments of motorized hybrid magnetic apparatus of the present invention.

In FIG. 26, a part of a hybrid magnetic apparatus 600 is illustrated. The illustrated part of the hybrid magnetic apparatus 600 includes the movable electromagnet assembly 250 and the supporting member 267 as disclosed hereinabove and illustrated in FIGS. 20 and 21. The illustrated part of the hybrid magnetic apparatus 600 also includes the movable electromagnet assembly 460 and a supporting member 459 attached thereto. The supporting member 459 is similar to the supporting member 456 of FIG. 24, except that the supporting member 459 does not include the handle 487 attached to the moving mechanism 482 of FIG. 24, but includes a motor 489. The motor 489 is suitably attached to the supporting member 459 and is operatively coupled to the helical member 485, for controllably rotating the helical member 485 clockwise or counter-clockwise to move the movable permanent magnet assembly 460 towards or away from the FOV 277, respectively. Preferably, the motor 489 is an MRI compatible motor. However, any other suitable type of MRI compatible motor operatively coupled to any other suitable moving mechanism known in the art may be used for controllably moving the movable permanent magnet assembly 460 of FIG. 26. The supporting member 459 of FIG. 26 is suitably attached to the supporting member 267 of FIG. 26.

It is noted that, for the sake of clarity of illustration, the wires connected to the motor 489, the motor controller and the power supply for the motor 489 are not shown.

The hybrid magnetic apparatus 600 of FIG. 26 has the advantage that the moving of the movable permanent magnet assemblies thereof may be performed by suitably controlling the motor 489, without having to physically reach the region of the moving mechanism 482. This facilitates the tuning procedure and may also be remotely performed by remotely controlling the motor 489 or the additional motor (not shown in FIG. 26) which controls the moving of the other complementary movable permanent magnet assembly (not shown in FIG. 26) of the hybrid magnetic apparatus 600.

In FIG. 27, a part of a hybrid magnetic apparatus 620 is illustrated. The illustrated part of the hybrid magnetic apparatus 620 includes the electromagnet assembly 450 (which is a static, non-movable electromagnet assembly) and the supporting member 467 as disclosed hereinabove and illustrated in FIG. 24. The illustrated part of the hybrid magnetic apparatus 620 also includes the motorized movable electromagnet assembly 460 and a supporting member 459 attached thereto as disclosed hereinabove and illustrated in FIG. 26. The supporting member 459 includes the motor 489 which is suitably attached to the supporting member 459 and is operatively coupled to the helical member 485, for controllably rotating the helical member 485 clockwise or counter-clockwise to move the movable permanent magnet assembly 460 towards or away from the FOV 477, respectively. Preferably, the motor 489 is a piezoelectric MRI compatible motor. However, any other suitable type of MRI compatible motor operatively coupled to any other suitable moving mechanism known in the art may be used for controllably moving the movable permanent magnet assembly 460 of FIG. 27. The supporting member 459 is suitably attached to the supporting member 467.

It is noted that, for the sake of clarity of illustration, the wires connected to the motor 489 for controlling the motor 489 and for providing power to the motor 489, the motor controller which controls the motor 489 and the power supply for the motor 489 are not shown in FIG. 27.

The hybrid magnetic apparatus 620 of FIG. 27 has the advantage that the moving of the movable permanent magnet assemblies thereof may be performed by suitably controlling the motor 489, without having to physically reach the region of the moving mechanism 482. This facilitates the tuning procedure and may also be remotely performed by remotely controlling the motor 489 or the additional motor (not shown in FIG. 26) which controls the moving of the other complementary movable permanent magnet assembly (not shown in FIG. 26) of the hybrid magnetic apparatus 600. It is noted that in the hybrid magnetic apparatus 620, the electromagnet assembly 450 and the complementary opposing electromagnet assembly (not shown in FIG. 27), are static non-movable electromagnet assemblies which are fixedly attached to the supporting member 467 and not designed to be moved with respect to the FOV 477. Thus, the hybrid magnetic apparatus 620 has the advantage of being relatively simple to construct and operate.

In FIG. 28, a part of a hybrid magnetic apparatus 650 is illustrated. The illustrated part of the hybrid magnetic apparatus 650 includes the movable electromagnet assembly 250 and the supporting member 367 as disclosed hereinabove and illustrated in FIG. 23. The illustrated part of the hybrid magnetic apparatus 650 also includes the movable electromagnet assembly 460 and a supporting member 459 attached thereto. The supporting member 459 is similar to the supporting member 459 of FIG. 27. It is noted that, for the sake of clarity of illustration, the wires connected to the motor 489 for controlling the motor 489 and for providing power to the motor 489, the motor controller which controls the motor 489 and the power supply for the motor 489 are not shown in FIG. 28. The illustrated part of the hybrid magnetic apparatus 650 also includes the gradient coil assembly 590 and the supporting member 591 as disclosed in detail hereinabove and illustrated in FIG. 26.

The hybrid magnetic apparatus 650 of FIG. 28 has the advantage that the moving of all of the movable magnet assemblies thereof, including the movable electromagnet assembly 250, the movable permanent magnet assembly 460, and the complementary opposed movable electromagnet assembly (not shown) and movable permanent magnet assembly (not shown) may be performed by suitably controlling the motors 489, 370M and 372M, and the complementary motors (not shown). Thus the tuning of the magnetic field in the FOV 277 does not require a technician to manually adjust any mechanical or other components in the hybrid magnetic apparatus 650. This facilitates the tuning procedure and may also be remotely performed by remotely controlling the appropriate motors.

It is noted that, while the controlling of all the motors of any of the motorized embodiments of the hybrid magnetic apparatus of the present invention may be performed by a single controller (not shown) which is operatively connected to all the motors (not shown) which are included in the hybrid magnetic apparatus, it may also be possible to used a plurality of different controllers (not shown). Each of the controllers may be connected to a single motor or to a group of motors. Furthermore, the controllers may be in communication with each other (not shown) or with a central processor (not shown), or a central computer (not shown) which may monitor, and/or control and/or coordinate or synchronize the various different controllers as is known in the art.

Figure 29:
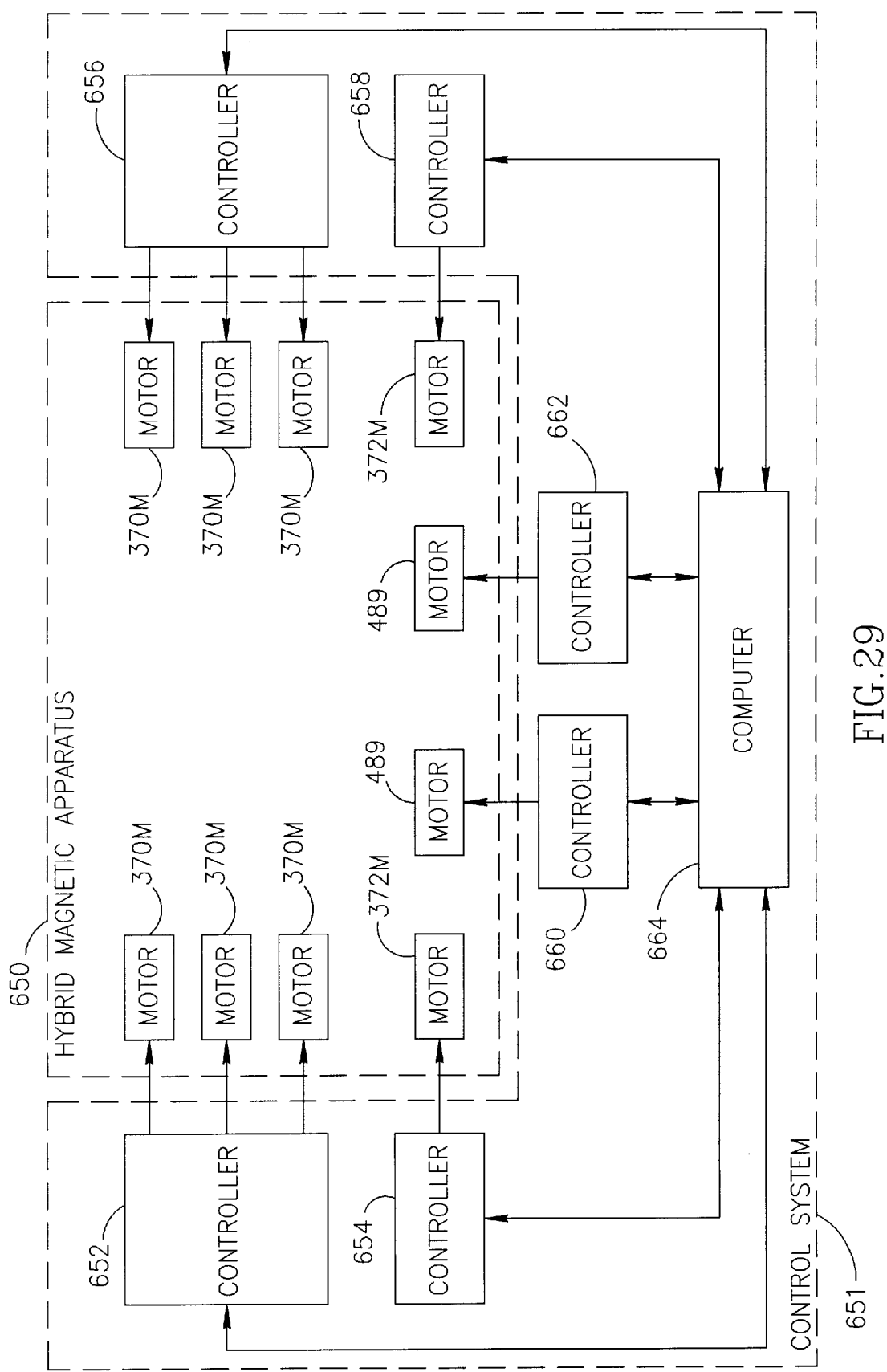
FIG. 29 is a schematic functional block diagram illustrating a control system suitable for controlling the moving of the magnet assemblies of the motorized hybrid magnetic apparatus illustrated in FIG. 28.

Reference is now made to FIG. 29 which is a schematic functional block diagram illustrating a control system suitable for controlling the moving of the magnet assemblies of the motorized hybrid magnetic apparatus illustrated in FIG. 28.

The control system 651 includes a computer 664 and six controllers 652 654, 656, 658 660 and 662. The controllers 652 654, 656, 658 660 and 662 are operatively coupled to the computer 664 and in communication therewith. The control system 651 is operatively connected to the hybrid magnetic apparatus 650 (see FIG. 28) for controlling the moving of the magnet assemblies thereof.

The controller 652 may be operatively connected to the three motors 370 M (FIGS. 28 and 29) attached to the side portion 367A of the hybrid magnetic apparatus 650 to control the actuation thereof for moving the electromagnet assembly 250. The controller 654 may be operatively connected to the motor 372M attached to the side portion 367A of the hybrid magnetic apparatus 650 to control the actuation thereof for moving the electromagnet assembly 250. The controller 660 may be operatively connected to the motor 489 attached to the supporting member 459 to control the actuation of the motor 489 for moving the permanent magnet assembly 460.

The controller 656 may be operatively connected to the three motors 370M (FIG. 29) which are attached to the complementary opposing side portion (not shown in FIG. 28) of the hybrid magnetic apparatus 650 to control the actuation of the three motors 370M for moving the electromagnet assembly (not shown in FIG. 28) which is complementary and opposing to the electromagnet assembly 250 within the hybrid magnetic apparatus 650. The controller 658 may be operatively connected to the motor 372M attached to the complementary opposing side portion (not shown in FIG. 28) of the hybrid magnetic apparatus 650 to control the actuation of the motor 372M for moving the electromagnet assembly (not shown in FIG. 28) which is complementary and opposing to the electromagnet assembly 250 within the hybrid magnetic apparatus 650. The controller 662 may be operatively connected to the motor 489 attached to the supporting member 459 to control the actuation of the motor 489 for moving the permanent magnet assembly (not shown in FIG. 28) which is complementary and opposing to the electromagnet assembly 460 within the hybrid magnetic apparatus 650.

The computer 664 may be a personal computer, a work station, a mainframe computer, a minicomputer, or any other suitable computer known in the art. The computer 664 may also be a processor, a microprocessor, a central controller, a micro-controller, or any other type of suitable controller adapted for synchronizing and/or coordinating a plurality of motor controllers.

The computer 664 may enable an operator or user to control the operation and/or actuation of any single motor selected from the motors 370M, 372M and 486. Additionally and/or alternatively, the computer 664 may enable an operator or user to control the synchronized operation and/or actuation of a group of motors selected from the motors 370M, 372M and 486. For example, as also described with respect to the hybrid magnetic apparatus 349 of FIG. 23, it may be necessary to synchronize or coordinate the operation of the motors 370M and 372M which are used for controlling the tilt and/or movement of the supporting member 250E of the electromagnet assembly 250. Thus, the computer 664 may perform the necessary synchronization between the controllers 652 and 654, such that the operation of the motors 370M is coordinated, and such that the operation of the motor 372M is coordinated with the operation of the motors 370M if necessary.

The computer 664 may include a program for coordinating and controlling the controllers 652 654, 656, 658 660 and 662 or of groups of controllers selected therefrom, such as but not limited example, the controller group including the controllers 652 and 654, or the controller group including the controllers 656 and 658. The program may be a software program stored on a hard disk drive or the like, and operative on the computer 664, or may also be a program embedded in a hardware device such as, but not limited to a flash memory device or a read only memory device, or the like. Thus, the computer 664 and the program operative thereon may synchronize the actuation and operation of the various motors by the controllers 652 654, 656, 658 660 and 662 or the controller groups disclosed hereinabove to perform the desired moving or tilting or moving and tilting of the electromagnet assembly 250 and the complementary opposing electromagnet assembly (not shown) of the hybrid magnetic apparatus 650, and the moving of the permanent magnet assembly 260 and the complementary opposing permanent magnet assembly (not shown) of the hybrid magnetic apparatus 650.

It is further noted that, while the configuration of motors and controllers illustrated in FIG. 29 may be used for tuning the magnetic field within the FOV 277 of the hybrid magnetic apparatus 650, other configurations and arrangements of controllers and motors may be used which are included within the scope and spirit of the present invention. For Example, in accordance with another preferred embodiment of the present invention, all of the motors 370M, 372M and 486, may be controlled and/or synchronized directly by the computer 664. This embodiment may be implemented in embodiments in which the motors do not require a dedicated controller for their operation and may be adequately controlled by signals send from the computer 664 or from a controller board (not shown) installed in the computer 664. Alternatively, the computer 664 may be operatively connected to a single controller (not shown) which in turn is suitably connected to all the motors (not shown) used to move or tilt or tilt and move any of the motorized electromagnet assemblies of the present invention and to move any of the motorized permanent magnet assemblies of the present invention.

It will be appreciated by those skilled in the art that the number of motors, the type of motors, and mechanisms used for coupling the various motors to the magnet assemblies which are to be moved (or tilted), may be varied, and that any suitable motor types, motor numbers and coupling mechanisms may be used to implement the present invention.

It is noted that, while the non-motorized permanent magnet assemblies 460 of FIGS. 24–25 and the motorized permanent magnet assemblies of FIGS. 26–28 magnet may be moved as a whole only towards or away from the center of the FOV of their respective hybrid magnetic apparatus, it should be born in mind that one or more of the permanent magnets (not shown in FIGS. 24–28) which are included within each of the permanent magnet assemblies (such as, but not limited to the disc-like permanent magnet 200 of FIG. 16) may be tilted with respect to the mid-plane of the different hybrid magnetic apparatus illustrated in FIGS. 20–28, as disclosed in detail hereinabove.

Additionally, in accordance with other preferred embodiments of the present invention, the permanent magnet assemblies of the hybrid magnetic apparatus may be configured such that the entire permanent magnet assembly (not shown) may be tilted as a whole with respect to the mid-plane of the hybrid magnetic apparatus by using suitable tilting mechanisms. Such tilting mechanisms are well known in the art, are not the subject matter of the present invention and are therefore not disclosed in detail herein.

It is noted that in accordance with other preferred embodiments of the present invention the hybrid magnetic apparatus of the present invention may also include a yoke which is made from or which includes a ferromagnetic material or materials or a material or materials having high magnetic permeability. In accordance with some preferred embodiments of the present invention, the high magnetic permeability yoke may be an open high magnetic permeability yoke which may be, inter alia, a generally c-shaped yoke, or a generally U-shaped yoke, or a generally Y-shaped yoke, but other open yoke shapes may also be used.

Thus, for example, the supporting member 267 (FIGS. 20, 25, 26) or the supporting member 467 (FIGS. 24, 27) or the supporting member 367 (FIGS. 23, 28) may be made from or may comprise a ferromagnetic material or a material having high magnetic permeability such as, but not limited to, soft iron, nickel-iron containing alloys, or silicon-iron containing alloys, or low carbon iron. Such ferromagnetic yokes may provide a path for closing the magnetic field flux generated by the electromagnet assemblies and the permanent magnet assemblies included in the hybrid magnetic apparatus 249, 349, 449, 549, 600, 620 and 650. The advantage of providing such high magnetic permeability yokes, or ferromagnetic yokes is that this increases the intensity of the magnetic field obtained within the FOV of the corresponding hybrid magnetic apparatus, without having to increase the amount of the permanently magnetized material used in the permanent magnet assemblies, and/or without increasing the dimensions of the electromagnet coils used in the electromagnet assemblies included in the hybrid magnetic apparatus (such as for example the electromagnet assemblies 250 and 252) or the intensity of the current flowing within the coils (such as the coils 280) of the electromagnet assemblies included in the hybrid magnetic apparatus. An additional advantage is that the use of such high magnetic permeability yokes or ferromagnetic yokes, reduces the magnetic field outside of the hybrid magnetic apparatus of the invention. This magnetic field also known as fringe field in the art of magnet design. The reduction of the fringe field is advantageous since it reduces the dimensions of the zone around the hybrid magnet in which zone ferromagnetic objects and/or tools are not allowed, and also reduces interference of the hybrid magnetic apparatus with the operation of nearby electronic, electrical or magnetic devices.

It is noted that care must be taken in designing the ferromagnetic yoke of such hybrid magnetic apparatus, so as to avoid excessive eddy currents in the ferromagnetic yoke in response to electrical currents flowing in the various coils (not shown) included in the hybrid magnetic apparatus, such as, for example gradient coils, shimming coils, RF coils (receiving RF coils, or transmitting RF coils, or receiving/transmitting RF coils).

Thus, at least parts of the ferromagnetic yokes or of the high magnetic permeability yokes may be made from segments or blocks which are attached to each other by electrically non-conducting spacer members (not shown) or glued to each other by an electrically non-conducting glue, as is known in the art. Additionally, at least part of the ferromagnetic yoke or the high magnetic permeability yoke may be slotted or may include gaps (not shown) filled with air or with a non-electrically conducting material or materials (not shown), as is known in the art, to reduce eddy currents.

It is noted that, while the embodiments of the hybrid magnetic apparatus disclosed hereinabove and illustrated in the drawings are shown as implemented using an electromagnetic flux generator having a pair of coils 280, other preferred embodiments of the present invention may include more than one pair of coils as disclosed hereinbelow. In preferred embodiments having more than one pair of coils, the dimensions, shapes, radial dimensions, and cross-sectional areas of the additional pair or pairs of coils may or may not be different than the dimensions, shapes, radial dimensions, and cross-sectional areas of the pair of coils 280, respectively.

Figure 30:
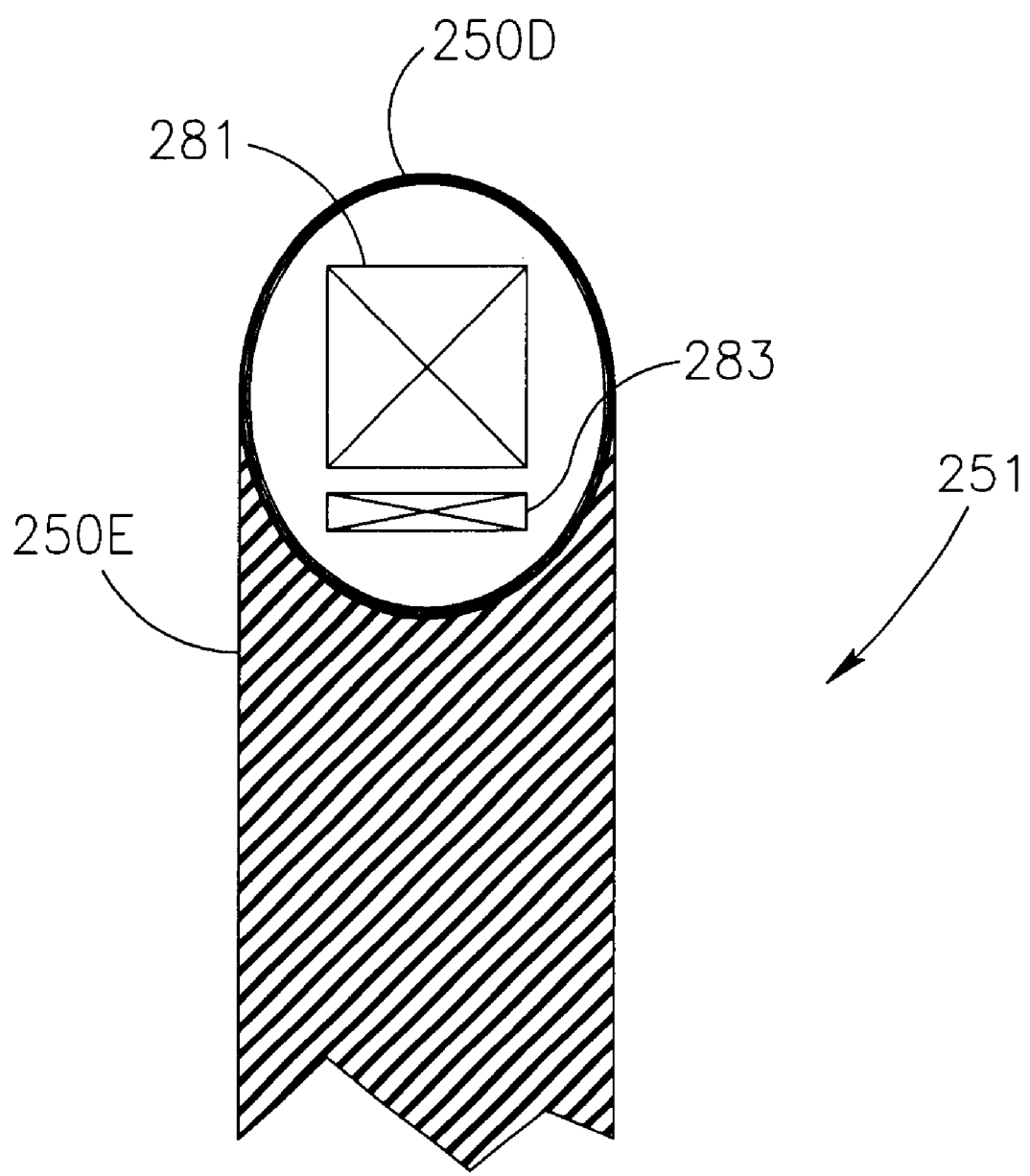
FIG. 30 is a schematic cross sectional diagram illustrating a detail of part of an electromagnet assembly having two coils, usable in a hybrid magnetic apparatus, in accordance with a preferred embodiment of the present invention.

Reference is now made to FIG. 30 which is a schematic cross sectional diagram illustrating a detail of part of an electromagnet assembly having two coils, usable in a hybrid magnetic apparatus, in accordance with a preferred embodiment of the present invention.

The electromagnet assembly 251 of FIG. 30 includes a supporting member 250E and a Dewar 250D. The electromagnet assembly 251 further includes a primary coil 281 and a secondary coil 283. The primary coil 281 and the secondary coil 283 are disposed within the Dewar 250D. The cross-sectional area and the number of windings of the secondary coil 283 are smaller than the cross-sectional area and the number of windings of the primary coil 281. The complementary electromagnet assembly (not shown) which opposes the electromagnet assembly 251 within a hybrid magnetic apparatus (not shown in FIG. 30) also includes a primary coil (not shown) and a secondary coil (not shown) which are configured as a mirror image of the primary coil 281 and the secondary coil 283 respectively, with respect to the mid-plane (not shown) of the hybrid magnetic apparatus (not shown). Thus, the primary coil 281 and the complementary primary coil (not shown) of the complementary opposed electromagnet assembly (not show) form a primary coil pair. It is noted that for the sake of clarity of illustration only the primary coil 281 of the primary coil pair is illustrated in FIG. 30.

Similarly, the secondary coil 283 and the complementary secondary coil (not shown) of the complementary opposed electromagnet assembly (not show) form a secondary coil pair. It is noted that for the sake of clarity of illustration only the secondary coil 283 of the secondary coil pair is illustrated in FIG. 30.

Preferably, the direction of flow of electrical current in the secondary coil 283 may be opposite to the direction of flow of current in the primary coil 281. The secondary coil 283 may thus be useful in increasing the homogeneity of the magnetic field within the imaging volume (not shown) of the hybrid magnetic apparatus.

It is noted that other additional coil pairs (not shown) may also be used in the electromagnet assemblies used in the hybrid magnetic apparatus of the present invention. The number of coils used and the shape, cross-sectional area, direction of current flow, and arrangement of the coil pairs may depend, inter alia, on the required intensity and homogeneity of the magnetic field within the imaging volume, the desired dimensions of the open region between the permanent magnet assemblies of the apparatus, the strength of the magnetic field provided by the permanent magnet assemblies of the apparatus, an other design considerations, manufacturing and materials cost considerations.

It is further noted that, while theoretically, the arranging the opposing coils 280 of the electromagnet assemblies of the hybrid magnetic apparatus of the present invention as a Helmholtz coil pair is desirable to achieve high homogeneity of the magnetic field, it is not obligatory to practicing the invention. Thus, in accordance with other preferred embodiments of the present invention, the coil pair within the hybrid magnetic apparatus may be arranged, such that the distance between the coils 280 along the axis 288 or the axis 488 of the hybrid magnetic apparatus is not equal to the radius of the coil 280. The distance between the coils 280 along the axis 288 or the axis 488 of the hybrid magnetic apparatus may be larger or smaller than the radius of the coil 280. Typically, the ratio between of the radius of the coils 280 and the distance between the coils 280 along the axis 288 or the axis 488 may be determined, inter al/a, by the required separation between the permanent magnet assemblies of the hybrid magnetic apparatus (which may depend on the organ or body part which is to be imaged by the apparatus), and on the longitudinal dimensions of the permanent magnet assemblies and of the gradient coil assemblies of the hybrid magnetic apparatus.

Similarly, if the hybrid magnetic apparatus includes multiple pairs of electromagnet coils (as illustrated in the non-limiting example of FIG. 30), each of the pairs of coils may or may not be configured as a Helmholtz coil pair depending, inter alia, on design constraints and other manufacturing considerations.

Figure 31:
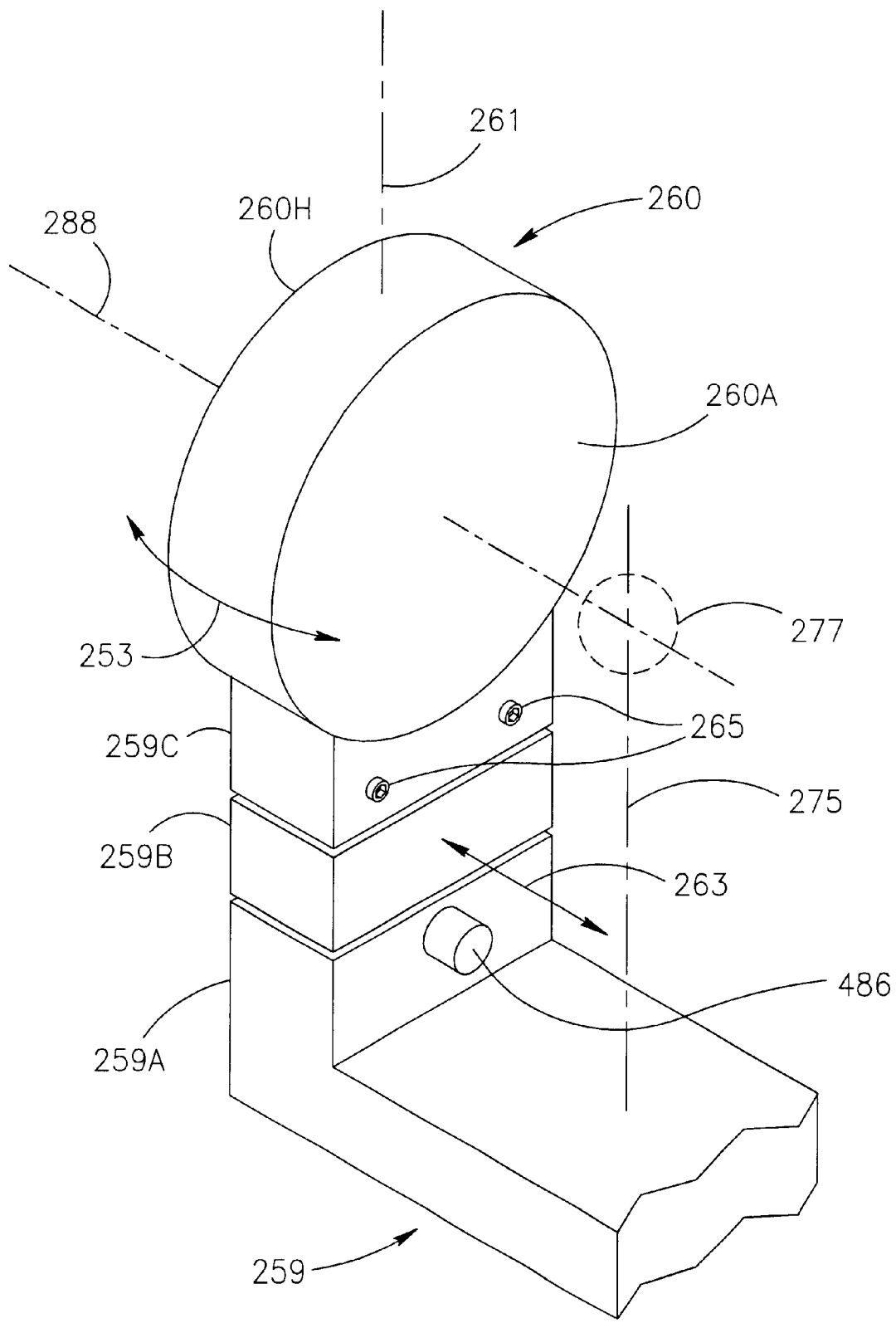
FIG. 31 is Reference is now made to FIG. 31 which is a schematic isometric view illustrating a part of a hybrid magnetic apparatus having a permanent magnet assembly which is movable and rotatable, in accordance with another preferred embodiment of the present invention.

Reference is now made to FIG. 31 which is a schematic isometric view illustrating a part of a hybrid magnetic apparatus having a movable and rotatable permanent magnet assembly, in accordance with another preferred embodiment of the present invention.

The permanent magnet assembly 260 of FIG. 31 is similar to the permanent magnet assembly 260 of FIGS. 20, 21, and 23. The permanent magnet assembly 260 is attached to a supporting member 259. The supporting member 259 includes a base member 259A, a movable member 259B and a rotatable member 259C. The movable member 259B is movably attached to the base member 259A. The rotatable member 259C is rotatably attached to the movable member 259B. The housing 260H of the permanent magnet assembly 260 may be suitably attached to the rotatable member 259C by a suitable glue, or by rivets or screws or by any other suitable attaching means, known in the art. The permanent magnet assembly 260 and the rotatable member 259C attached thereto may be controllably rotated in the directions represented by the double headed arrow 253. The rotation of the permanent magnet assembly 260 and the rotatable member 259C is performed around an axis 261 which is orthogonal to the axis 288 of the entire hybrid magnetic apparatus (not shown). The axis 261 passes through the geometrical center (not shown) of the permanent magnet assembly 260. The rotation of the permanent magnet assembly 260 and the rotatable member 259C attached thereto may be performed by any suitable rotating mechanism (not shown in detail). For example, the rotating mechanism may include rotatable screws 265 which are rotatably attached within the rotatable member 259C and are suitably coupled to a coupling mechanism (not shown) such that the rotating of the screws 265 in a suitable direction may rotate the permanent magnet assembly 260 and the rotatable member 259C attached thereto in a desired direction around the axis 261. It is noted that additional screws (not shown) may be rotatably attached within the rotatable member 259C (for example on the side of the rotatable member 259C which is opposite to and parallel to the side of the rotatable member 259C to which the screws 265 are rotatably attached). Such additional screws may also be suitably coupled to the rotating mechanism (not shown) to assist the rotating of the permanent magnet assembly 260 and the rotatable member 259C attached thereto, and to enable the locking of the rotatable member 259C, such that the permanent magnet assembly 260 and the rotatable member 259C are firmly locked at the new position reached after the rotating is performed. The screws 265 may be rotated by a suitable manual tool (not shown), or by a suitable power tool (not shown).

It is noted that the rotating mechanism which may be used for rotating the permanent magnet assembly 260 may be any suitable type of rotating mechanism known in the art, such as but not limited to a manual rotating mechanism and a motorized rotating mechanism (not shown).

The rotatable member 259C is movably attached to the base member 259A of the supporting member 259. The movable member 259B together with the rotatable member 259C attached thereto and with the permanent magnet assembly 260 attached to the rotatable member 259C, may be moved in the directions represented by the double headed arrow 263. The moving of the movable member 259B with respect to the base member 259A may be performed by an MRI compatible motor 486 which is suitably attached to the base member 259A. The motor 486 may be coupled to a suitable moving mechanism (not shown). The moving mechanism may be similar to the moving mechanism 482 of FIG. 26 with the exception that the 483 of the moving mechanism 482 is attached to the movable member 259B of FIG. 31 instead of being attached directly to the housing 260H of the permanent magnet assembly 260 as illustrated in FIG. 26.

It is noted that while the moving of the movable member 259B is motorized, using the motor 486 with or without a suitable controller (not shown), in other preferred embodiments of the present invention the moving of the movable member 259B may be performed by a manual moving mechanism (not shown in FIG. 31), such as but not limited to the manual moving mechanism 482 coupled to the handle 487 as illustrated in FIG. 24 and disclosed hereinabove, or by any other suitable manual moving mechanism known in the art.

It is noted that only one permanent magnet assembly 260 of the hybrid magnetic apparatus is shown in FIG. 31. Thus, the electromagnet assemblies of the hybrid magnetic apparatus and the supporting member which supports them are not shown in FIG. 31 for the sake of clarity of illustration. Similarly, the second complementary permanent magnet assembly of the hybrid magnetic apparatus which opposes the permanent magnet assembly 260 is not shown in FIG. 31 for the sake of clarity of illustration. The gradient coil assemblies of the hybrid magnetic apparatus are not shown in FIG. 31 for the sake of clarity of illustration.

It is further noted that, practically, only small rotations of the permanent magnet assembly 260 are needed for tuning of the magnetic field within the FOV 277. Thus, typically, the rotating mechanism (not shown) which rotates the rotatable member 259C is designed to allow a rotating of the permanent magnet assembly 260 within a rotation angle range of approximately±2–3° from a plane passing through the geometrical center point (not shown) of the permanent magnet assembly 260 (the plane is orthogonal to the axis 288) along the directions represented by the double headed arrow 253. For example, when viewing the inner surface 260A of the housing 260H from the center (not shown) of the FOV 277, a rotation of the permanent magnet assembly 260 by +0.1° may represent a rotation in which the permanent magnet assembly 260 is rotated by a tenth of a degree relative to a plane (not shown) orthogonal to the axis 288 and passing through the geometrical center of the permanent magnet assembly 260 (this plane arbitrarily represents 0° of rotation), in a direction which moves the left side (as viewed from the center of the FOV 277 of the permanent magnet assembly 260) towards the center of the FOV 277. Similarly, when viewing the inner surface 260A of the housing 260H from the center (not shown) of the FOV 277, a rotation of the permanent magnet assembly 260 by −0.2° may represent a rotation in which the permanent magnet assembly 260 is rotated by a fifth of a degree relative to a plane (not shown) orthogonal to the axis 288 and passing through the geometrical center of the permanent magnet assembly 260 (this plane arbitrarily represents 0° of rotation), in a direction which moves the left side (as viewed from the center of the FOV 277 of the permanent magnet assembly 260) away from the center of the FOV 277. The axis around which the permanent magnet assembly 260 rotates is the axis 261 which is orthogonal to the axis 288.

It is noted that the above definitions of the rotation magnitude and direction are arbitrary, and that other definitions may also be used. Moreover, the rotation mechanism (not shown) may be configured for allowing rotations of the permanent magnet assembly 260 within a range of rotation angles larger or smaller than ±2–3°.

An advantage of a hybrid magnetic apparatus including the movable and rotatable permanent magnet assemblies illustrated in FIG. 31 and disclosed hereinabove, is that the capability of rotating the permanent magnet assembly 260 as disclosed hereinabove and illustrated in FIG. 31 increases the repertoire of movements of the permanent magnet assembly 260 available for tuning the magnetic field within the FOV 277 over the repertoire available in preferred embodiments having a movable but non-rotatable permanent magnet assembly, such as, for example, the permanent magnet assembly 460 (FIG. 24). This increased or improved movement repertoire may facilitate the tuning of the magnetic field within the FOV 277.

It will be appreciated by those skilled in the art, that the movable and rotatable permanent magnet assembly of the type illustrated in FIG. 31 may be implemented in combination with any other types of permanent magnet assemblies disclosed herein and illustrated in the drawings, with suitable adaptation of the supporting member which support the permanent magnet assemblies. Similarly, any of the types of the electromagnet assemblies disclosed in the present application and illustrated in the drawing figures may be used in combination with one or two movable and rotatable permanent magnet assemblies of the type illustrated in FIG. 31, to implement the hybrid magnetic apparatus of the present invention. All such combinations are considered to be within the scope of the present invention It is noted that, the arrangements of the permanent magnet assemblies and of the electromagnet assemblies within the hybrid magnetic apparatus disclosed hereinabove are symmetrical arrangements with respect to the mid-plane (not shown) bisecting the imaging volume and orthogonal to the axis 288 or the axis 488. For example, if one of the permanent magnet assemblies of the hybrid magnetic apparatus is an independently movable permanent magnet assembly, the other opposing complementary permanent magnet assembly included in the same hybrid magnetic apparatus is also an independently movable permanent magnet assembly. Similarly, if one of the electromagnet assemblies of the hybrid magnetic apparatus is an independently movable electromagnet assembly, the other opposing complementary electromagnet assembly included in the same hybrid magnetic apparatus is also an independently movable electromagnet assembly. However, this feature is not obligatory, and other arrangements of the electromagnet assemblies and/or the permanent magnet assemblies and/or the electromagnet assemblies and the permanent magnet assemblies may be implemented which are included within the scope and spirit of the present invention.

Figure 32:
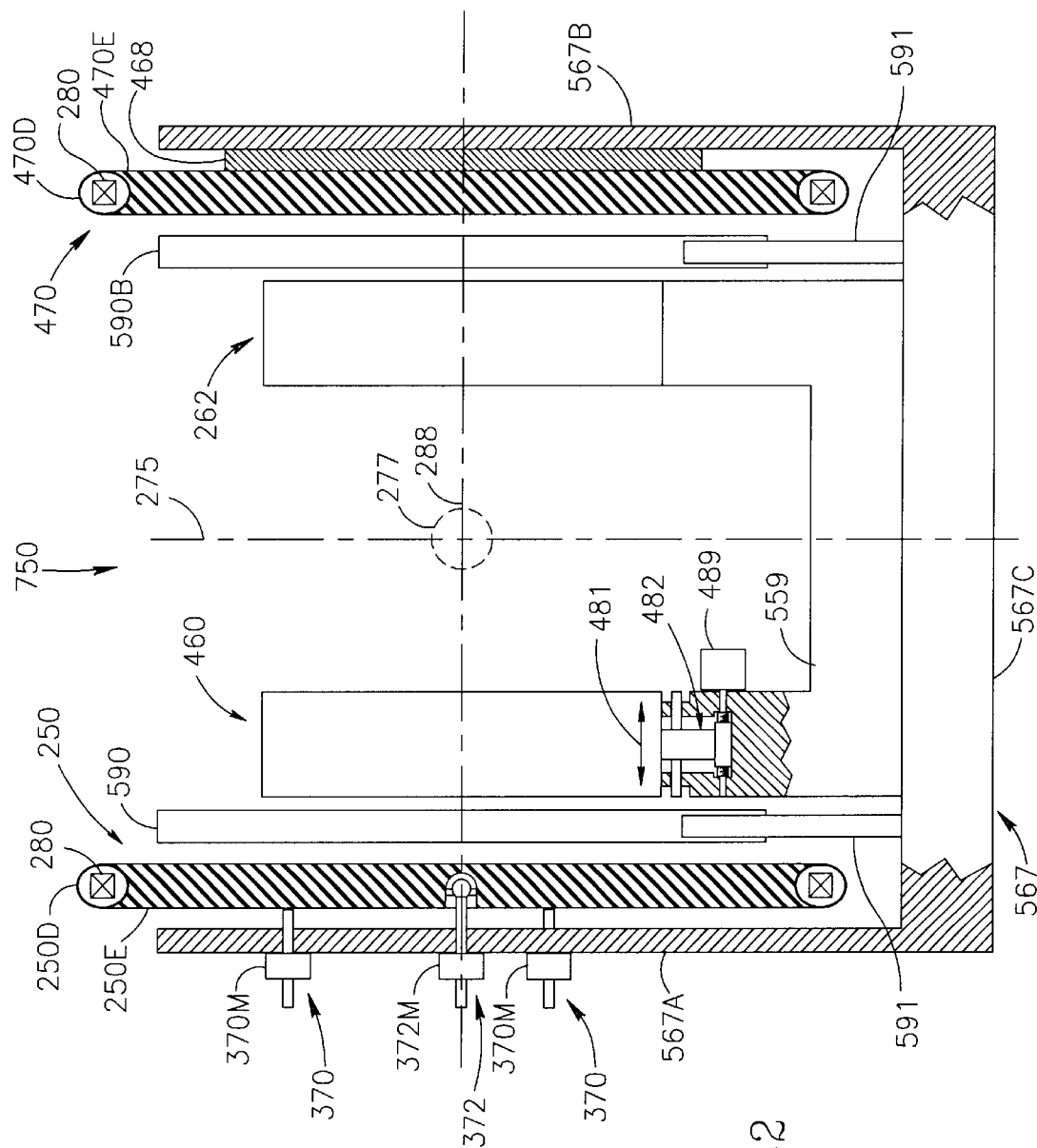
FIG. 32 is a schematic part cross-sectional part side view diagram illustrating a hybrid magnetic apparatus having a non symmetrical arrangement of movable and non-movable magnet assemblies, in accordance with yet another preferred embodiment of the present invention.

Reference is now made to FIG. 32 which is a schematic part cross-sectional part side view diagram illustrating a hybrid magnetic apparatus having a non symmetrical arrangement of movable and non-movable magnet assemblies, in accordance with yet another preferred embodiment of the present invention. The hybrid magnetic apparatus 750 includes a motorized movable electromagnet assembly 250 as disclosed in detail and illustrated in FIG. 28. The hybrid magnetic apparatus 750 also includes a motorized movable permanent magnet assembly 460 as disclosed in detail and illustrated in FIG. 26. The hybrid magnetic apparatus 750 also includes a static (non-movable) permanent magnet assembly 262, and a static (non-movable) electromagnet assembly 470. The static electromagnet assembly 470 includes a supporting member 470E similar to the support member 450E of FIG. 24.

A Dewar 470D is attached to the supporting member 470E. The Dewar 470D is constructed as a mirror image of the opposing Dewar 250D. The Dewar 470D has a coil 280 disposed therewithin which may be preferably arranged and operatively electrically connected with the opposing complementary coil 280 disposed in the Dewar 250D to form a Helmholtz coil pair as disclosed hereinabove. However, as disclosed hereinabove, the coils 280 may also be arranged differently than a Helmholtz coil pair. Additionally, the dewars 250D and 470D may each include two or more coils (not shown), as disclosed in detail hereinabove and illustrated for the electromagnet assembly 251 of FIG. 30.

The static permanent magnet assembly 262 is structurally constructed as a mirror image of the permanent magnet 260 of FIG. 21, except that the direction of magnetization of the pairs of complementary opposed permanent magnets (not shown) included in the movable permanent magnet assembly 460 and in the static permanent magnet assembly 262 are identical (not opposite) within each pair of permanent magnets, as is disclosed in detail hereinabove. The hybrid magnetic apparatus 750 further includes an asymmetrical supporting member 559. The movable permanent magnet assembly 460 is movably attached to the supporting member 559 through a moving mechanism 482 which is operatively coupled to a motor 489 attached to the supporting member 559. The moving of the movable permanent magnet assembly 460 in the directions indicated by the double headed arrow 481 is performed as disclosed in detail hereinabove. The static permanent magnet assembly 262 is non-movably attached to the supporting member 559.

The hybrid magnetic apparatus 750 further includes a supporting member 567. The supporting member 567 includes a base portion 567C and two non-identical side portions, 567A and 567B. The static (non-movable) electromagnet assembly 470 is suitably attached to side portion 567B by a spacer member 468 as is disclosed in detail hereinabove for the static electromagnet assembly 450 of FIG. 24. The motorized movable electromagnet assembly 250 is movably and tiltably attached to the side portion 567A by the adjusting members 370 and 372 through suitable passages formed within the side portion 567A as disclosed in detail hereinabove for the side portion 367A and illustrated in FIG. 23. The motorized movable electromagnet assembly 250 may be moved or tilted or moved and tiled with respect to the mid-plane (not shown) bisecting the FOV 277 as disclosed in detail hereinabove for the motorized movable electromagnet 250 of FIG. 23. The dashed line 275 represents the line along which the mid-plane intersects the plane of the drawing.

The hybrid magnetic apparatus 750 further includes two complementary opposed gradient coil assemblies 590 and 590B. Each of the gradient coil assemblies 590 and 590B is attached to the base portion 567C of the supporting member 567 by a suitable supporting member 591 as disclosed in detail hereinabove.

In operation, the tuning of the magnetic field may be performed by moving and/or tilting and/or moving and tilting of the movable electromagnet assembly 250 using the motors 370M and/or the motor 372M as disclosed in detail hereinabove. The actuation of the motors 370M and/or of the motor 372M may be performed using a controller (not shown) or a group of controllers (not shown) coordinated by a computer (not shown), as disclosed in detail hereinabove. The tuning of the magnetic field may also be performed by moving of the permanent magnet assembly 460, using or actuating the motor 486 as disclosed in detail hereinabove. The tuning may also be performed by moving both the movable permanent magnet assembly 460 and the movable and tiltable electromagnet assembly 250. The static permanent magnet assembly 262 and the static electromagnet assembly 470 are thus not moved or tilted as a whole during the tuning of the magnetic field within the FOV 277 of the hybrid magnetic apparatus 750 of FIG. 32.

The advantage of the hybrid magnetic apparatus 750 of FIG. 32 is that it is simpler to construct and therefore less expensive to manufacture than the hybrid magnetic apparatus 649 of FIG. 28, while still providing adequate capabilities for fine tuning of the magnetic field within the FOV 277.

It is noted that the term "static permanent magnet assembly" is used throughout the present application to mean a permanent magnet assembly which may not be moved in its entirety with respect to the FOV of the hybrid magnetic apparatus which includes the static. However, internal parts or components of such a static permanent magnet assembly, such as the permanent magnets disposed within the permanent magnet assembly, may be movable within the static permanent magnet assembly, with respect to the housing of the static permanent magnet assembly, or with respect to each other, as disclosed in detail hereinabove and illustrated in FIG. 16 for one, non-limiting, example of the permanent magnet assemblies of the present invention. Thus, tuning or shimming of the magnetic field within the FOV may also be performed by moving one or more of the permanent magnets disposed within a static permanent magnet assembly or a movable permanent magnet assembly as disclosed in detail hereinabove and illustrated in FIGS. 7 and 16. It should be noted that this additional tuning capability may not be available in hybrid magnetic apparatus in which the two opposing permanent magnet assemblies are implemented similarly to the permanent magnet assembly of FIG. 2.

It will be appreciated that in preferred embodiments having one or two static permanent magnet assemblies, such as but not limited to, the static permanent magnet assembly 260 of FIGS. 20, 21, and 23 and the permanent magnet assembly 262 of FIGS. 20 and 32, some or all of the permanent magnets included within the permanent magnet assemblies may be moved with respect to each other and/or with respect to the housings 260H and 262H, respectively, for shimming or tuning of the magnetic field. The moving of the permanent magnets within the permanent magnet assembly may be performed as disclosed in detail hereinabove for the permanent magnet assemblies illustrated in FIGS. 7 and 16. Thus, tuning or shimming of the magnetic field within the FOV of hybrid magnetic apparatus having one or more static permanent magnet assemblies, my be performed by moving of one or more of the permanent magnets included in the static permanent magnet assembly or assemblies.

It is noted that additional different embodiments of the invention may be implemented. For example in accordance with another preferred embodiment. The hybrid magnetic apparatus of this embodiment of the present invention may include two static permanent magnet assemblies such as, for example, the static permanent magnet assembly 260 of FIG. 21, one movable electromagnet assembly such as, but not limited to, the movable electromagnet magnet assembly 250 of FIG. 32, and one static electromagnet assembly such as, but not limited to, the static electromagnet assembly 470 of FIG. 32. In such a preferred embodiment only the movable electromagnet assembly may be moved for performing tuning. The gradient coil assemblies (not shown) included in this embodiment may be attached to the permanent magnet assemblies as disclosed for the gradient coil assemblies 190 of FIG. 21, or may be attached to a supporting member (not shown) which supports the electromagnet assemblies, similar to the attachment of the gradient coil assemblies 590 of FIG. 26 to the supporting member 267 by the supporting member 591.

In accordance with another exemplary preferred embodiment of the present invention, the hybrid magnetic apparatus may include two static electromagnet assemblies such as, for example, the static electromagnet assembly 450 of FIG. 27, one movable permanent magnet assembly such as, but not limited to, the movable permanent magnet assembly 460 of FIG. 32, and one static permanent magnet assembly such as, but not limited to, the static electromagnet assembly 470 of FIG. 32. In such a preferred embodiment only the movable permanent magnet assembly may be moved for performing tuning. The gradient coil assemblies included in this embodiment may be attached to the static electromagnet assemblies of the hybrid magnetic apparatus as disclosed for the gradient coil assemblies 490 of FIG. 27, or may be attached to a supporting member (not shown) which supports the electromagnet assemblies, similar to the attachment of the gradient coil assemblies 590 of FIG. 26 to the supporting member 267 by the supporting member 591.

It will be appreciated by those skilled in the art, that the moving mechanisms or moving means used for moving and/or tilting or changing the inclination of the electromagnet assemblies and/or the permanent magnet assemblies of the hybrid magnetic apparatus of the present invention, are not limited to the moving mechanisms disclosed herein and illustrated in the drawings, thus, any moving or tilting or moving/tilting mechanisms, motorized or non-motorized, which are known in the art may be used for moving and/or tilting or changing the inclination and/or moving and tilting of the permanent magnet assemblies and/or the electromagnet assemblies of the different embodiments of the hybrid magnetic apparatus of the present invention.

It is noted that the various supporting members disclosed hereinabove and illustrating in the figures may or may not be separate supporting members as disclosed hereinabove. For example, while the supporting members 459 and 591 of FIG. 28 are separate supporting and are attached to the supporting member 367 of the hybrid magnetic apparatus 650 of FIG. 28, such as for example by a suitable glue or by screws or other suitable attachment methods or devices, in accordance with another preferred embodiment of the present invention, the supporting members 367, 459 and 591 may be replaced by a similarly shaped single monolithic support member (not shown) which suitably supports the electromagnet assemblies, the permanent magnet assemblies and the gradient coil assemblies of the hybrid magnetic apparatus. Such, and other permutations and variations of the various supporting members of the hybrid magnetic apparatus may be clearly understood and implemented by the person skilled in the art, based on the disclosure of the embodiments of the present application.

It will be appreciated that various permutations and modifications to the above-described embodiments will be apparent to those of ordinary skill in the art in light thereof. The above embodiments are provided by way of illustration and not by way of limitation.

What is claimed is:

1. An open magnetic apparatus for producing a predetermined volume of substantially uniform magnetic field directed parallel to an axis of symmetry of said volume, the apparatus comprising:

a first electromagnet assembly disposed at a first position along said axis, said first electromagnet assembly includes at least a first electromagnet coil, said at least first electromagnet coil is radially symmetric with respect to said axis;

a second electromagnet assembly disposed at a second position spaced apart from said first position of said first electromagnet assembly along said axis, said second electromagnet assembly includes at least a second electromagnet coil, said at least second electromagnet coil is radially symmetric with respect to said axis, said at least first electromagnet coil and said at least second electromagnet coil are substantially equidistant from the center of said is volume, said first electromagnet assembly and said second electromagnet assembly are configured for generating a first magnetic field within said volume;

a first permanent magnet assembly positioned at a third position disposed between said first position and said second position along said axis, said first permanent magnet assembly has an inner surface facing said volume and an outer surface facing said first electromagnet assembly, said first permanent magnet assembly includes at least two coaxial permanent magnets, said at least two permanent magnets are radially symmetric with respect to said axis; and a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes at least two coaxial permanent magnets, said at least two permanent magnets of said second permanent magnet assembly are radially symmetric with respect to said axis, said inner surface of said first permanent magnet assembly and said inner surface of said second permanent magnet assembly define an open region therebetween, said volume is disposed within said open region, said third position of said first permanent magnet assembly and said fourth position of second permanent magnet assembly are substantially equidistant from the center of said volume along said axis, said first permanent magnet assembly and said second permanent magnet assembly are configured for generating a second magnetic field superimposed on said first magnetic field to provide said substantially uniform magnetic field within said volume.

2. The magnetic apparatus according to claim 1, wherein said at least first electromagnet coil and said at least second electromagnet coil are configured such that the radius of said at least first electromagnet coil is equal to the radius of said at least second electromagnet coil, and the distance between said at least first electromagnet coil and said at least second electromagnet coil is equal to the radius of said at least first electromagnet coil.

3. The magnetic apparatus according to claim 1, wherein said at least first electromagnet coil and said at least second electromagnet coil are configured such that the radius of said at least first electromagnet coil is equal to the radius of said at least second electromagnet coil, and the distance between said at least first electromagnet coil and said at least second electromagnet coil is greater than the radius of said at least first electromagnet coil.

4. The magnetic apparatus according to claim 1, wherein at least one electromagnet assembly of said first electromagnet assembly and said second electromagnet assembly is a movable electromagnet assembly.

5. The magnetic apparatus according to claim 1, wherein at least one electromagnet assembly of said first electromagnet assembly and said second electromagnet assembly is controllably movable relative to said volume.

6. The magnetic apparatus according to claim 5, wherein said open magnetic apparatus further comprises at least one moving mechanism configured for moving said at least one electromagnet assembly relative to said volume.

7. The magnetic apparatus according to claim 6, wherein said at least one moving mechanism is configured for moving said at least one electromagnet assembly towards or away from said volume in a direction parallel to said axis.

8. The magnetic apparatus according to claim 6, wherein said at least one moving mechanism is configured for tilting said at least one electromagnet assembly at an angle with respect to a plane orthogonal to said axis.

9. The magnetic apparatus according to claim 6, wherein said at least one moving mechanism is configured for moving said at least one electromagnet assembly towards or away from said volume in a direction parallel to said axis and for tilting said at least one electromagnet assembly at an angle with respect to a plane orthogonal to said axis.

10. The magnetic apparatus according to claim 6, wherein said at least one moving mechanism is a motorized moving mechanism.

11. The magnetic apparatus according to claim 6, wherein said motorized moving mechanism comprises at least one motor for controllably moving said at least one electromagnet assembly.

12. The magnetic apparatus according to claim 11, wherein said at least one motor is a magnetic resonance imaging compatible motor.

13. The magnetic apparatus according to claim 1, wherein at least one permanent magnet assembly of said first permanent magnet assembly and said second permanent magnet assembly is a movable permanent magnet assembly.

14. The magnetic apparatus according to claim 1, wherein at least one permanent magnet assembly of said first permanent magnet assembly and said second permanent magnet assembly is movable relative to said volume.

15. The magnetic apparatus according to claim 14, wherein said open magnetic apparatus further comprises at least one moving mechanism configured for moving said at least one permanent magnet assembly relative to said volume.

16. The magnetic apparatus according to claim 15, wherein said at least one moving mechanism is configured for moving said at least one permanent magnet assembly towards or away from said volume in a direction parallel to said axis.

17. The magnetic apparatus according to claim 15, wherein said at least one moving mechanism is configured for tilting said at least one permanent magnet assembly at an angle with respect to a plane orthogonal to said axis.

18. The magnetic apparatus according to claim 15, wherein said at least one moving mechanism is configured for moving said at least one permanent magnet assembly towards or away from said volume in a direction parallel to said axis and for tilting said at least one permanent magnet assembly at an angle with respect to a plane orthogonal to said axis.

19. The magnetic apparatus according to claim 15, wherein said at least one moving mechanism is a motorized moving mechanism.

20. The magnetic apparatus according to claim 15, wherein said motorized moving mechanism comprises at least one motor for controllably moving said at least one permanent magnet assembly.

21. The magnetic apparatus according to claim 20, wherein said at least one motor is a magnetic resonance imaging compatible motor.

22. The magnetic apparatus according to claim 1, wherein said at least first electromagnet coil and said at least second electromagnet coil are super-conducting electromagnet coils.

23. The magnetic apparatus according to claim 22 further including at least a first cooling device for cooling said at least first electromagnet coil and a second cooling device for cooling said at least second electromagnet coil.

24. The magnetic apparatus according to claim 22 wherein said at least first cooling device and said at least second cooling device comprise a Dewar container or cryostat.

25. The magnetic apparatus according to claim 22 wherein said at least first cooling device and said at least second cooling device are selected from a low temperature gas operated cooling device, a low temperature liquefied gas based cooling device, an active cryo-cooling device, and a cooling device based on low pressure evaporative cooling of a liquefied gas.

26. The magnetic apparatus according to claim 22, wherein said super-conducting electromagnet coils comprise a low temperature super-conducting material.

27. The magnetic apparatus according to claim 22, wherein said super-conducting electromagnet coils comprise a high temperature super-conducting material.

28. The magnetic apparatus according to claim 1, wherein said at least two coaxial permanent magnets of said first permanent magnet assembly comprise a first permanent magnet having an outer diameter, said first permanent magnet has a first magnetization direction parallel to said axis, and at least a second generally annular permanent magnet, said at least second permanent magnet has an inner diameter larger than said outer diameter of said first permanent magnet, said second permanent magnet has a second magnetization direction parallel to said axis, and said at least two coaxial permanent magnets of said second permanent magnet assembly comprise a third permanent magnet having an outer diameter, said third permanent magnet has a magnetization direction equal to said first magnetization direction of said first permanent magnet, and at least a fourth generally annular permanent magnet, said at least fourth permanent magnet has an inner diameter larger than said outer diameter of said third permanent magnet, said at least fourth permanent magnet has a magnetization direction equal to said second magnetization direction of said at least second permanent magnet.

29. The magnetic apparatus according to claim 28, wherein said first permanent magnet has a first surface facing said volume, said at least second permanent magnet has a second surface facing said volume, said third permanent magnet has a third surface facing said volume, and said at least fourth permanent magnet has a fourth surface facing said volume, and wherein at least part of said second surface is offset from at least part of said first surface by a first distance along said axis, at least part of said fourth surface is offset from at least part of said third surface by a second distance along said axis, said first distance is substantially equal to said second distance.

30. The magnetic apparatus according to claim 28, wherein said first permanent magnet has a first surface facing said volume, said at least second permanent magnet has a second surface facing said volume, said third permanent magnet has a third surface facing said volume, and said at least fourth permanent magnet has a fourth surface facing said volume, at least part of said second surface is coplanar with at least part of said first surface, and at least part of said third surface is coplanar with at least part of said fourth surface.

31. The magnetic apparatus according to claim 28, wherein said first permanent magnet and said third permanent magnet are selected from a disc-like permanent magnet having a circular cross section in a plane perpendicular to said axis, a regular right polygonal prism-like permanent magnet having a regular polygonal cross-section in a plane perpendicular to said axis and having N sides, a ring-like annular permanent magnet and a annular right regular polygonal permanent magnet having N sides.

32. The magnetic apparatus according to claim 31, wherein N is equal to or larger than eight.

33. The magnetic apparatus according to claim 28, wherein said at least second and said at least fourth permanent magnets are selected from a ring-like annular permanent magnet and an annular right regular polygonal permanent magnet having N sides.

34. The magnetic apparatus according to claim 33, wherein N is equal to or larger than eight.

35. The magnetic apparatus according to claim 28, wherein said first permanent magnet and said third permanent magnet comprise a plurality of permanently magnetized segments attached to adjacent segments using a non-conductive adhesive, to reduce eddy currents.

36. The magnetic apparatus according to claim 35, wherein said segments are equi-angular segments.

37. The magnetic apparatus according to claim 28, wherein said at least second annular permanent magnet and said at least fourth annular permanent magnet comprise a plurality of permanently magnetized segments attached to adjacent segments using a non-conductive adhesive, to reduce eddy currents.

38. The magnetic apparatus according to claim 37, wherein said segments are equi-angular segments.

39. The magnetic apparatus according to claim 28, wherein said first permanent magnet assembly includes a first low magnetic permeability frame for supporting said first permanent magnet and said at least second permanent magnet, and said second permanent magnet assembly includes a second low magnetic permeability frame for supporting said third permanent magnet and said at least fourth permanent magnet.

40. The magnetic apparatus according to claim 39, wherein said first magnetization direction and said second magnetization direction are parallel to said axis and have the same polarity.

41. The magnetic apparatus according to claim 39, wherein said first magnetization direction and said second magnetization direction are parallel to said axis and have opposite polarities.

42. The magnetic apparatus according to claim 1, wherein said at least first electromagnet coil and said at least second electromagnet coil are selected from a circular coil and a regular polygonal shaped coil having N sides.

43. The magnetic apparatus according to claim 42, wherein N is equal to or larger than eight.

44. The magnetic apparatus according to claim 1, wherein said first permanent magnet assembly includes a first low magnetic permeability frame for supporting said at least two coaxial permanent magnets included in said first permanent magnet assembly, and said second permanent magnet assembly includes a second low magnetic permeability frame for supporting said at least two coaxial permanent magnets included in said second permanent magnet assembly.

45. The magnetic apparatus according to claim 1, wherein said first permanent magnet assembly comprises a first adjustment mechanism configured for moving at least one of said at least two coaxial permanent magnets of said first permanent magnet assembly with respect to said volume.

46. The magnetic apparatus according to claim 45, wherein said second permanent magnet assembly comprises a second adjustment mechanism configured for moving at least one of said at least two coaxial permanent magnets of said second permanent magnet assembly with respect to said volume.

47. The magnetic apparatus according to claim 1, further including a first gradient coil assembly disposed between said first permanent magnet assembly and said first electromagnet assembly, and a second gradient coil assembly disposed between said second permanent magnet assembly and said second electromagnet assembly.

48. The magnetic apparatus according to claim 47 wherein each of said first gradient coil assembly and said second gradient coil assembly are non-movably attached within said open magnetic apparatus.

49. The magnetic apparatus according to claim 47, wherein each of said first gradient coil assembly and said second gradient coil assembly includes one or more gradient coils selected from a x-gradient coil, a y-gradient coil, a z-gradient coil, and any combination thereof.

50. The magnetic apparatus according to claim 49, wherein each of said first gradient coil assembly and said second gradient coil assembly is a multi-layer printed circuit assembly, and wherein at least one of said x-gradient coil, y-gradient coil and z-gradient coil of each of said first gradient coil assembly and said second gradient coil assembly is a substantially planar printed circuit coil.

51. The magnetic apparatus according to claim 1, further including an open high magnetic permeability yoke configured for closing the magnetic field lines of said open magnetic apparatus.

52. The magnetic apparatus according to claim 51, wherein said open high magnetic permeability yoke comprises at least one material selected from a ferromagnetic material, a high magnetic permeability material, soft iron, a nickel-iron containing alloy, a silicon-iron containing alloy, low carbon iron, and combinations thereof.

53. The magnetic apparatus according to claim 51, wherein said open high magnetic permeability yoke is selected from a generally c-shaped yoke, a generally U-shaped yoke, and a generally Y-shaped yoke.

54. An open magnetic apparatus for producing a predetermined volume of substantially uniform magnetic field directed parallel to an axis of symmetry of said volume, the apparatus comprising:

a first electromagnet assembly disposed at a first position along said axis, said first electromagnet assembly includes at least a first electromagnet coil, said at least first electromagnet coil is radially symmetric with respect to said axis;

a second electromagnet assembly disposed at a second position spaced apart from said first position of said first electromagnet assembly along said axis, said second electromagnet assembly includes at least a second electromagnet coil, said at least second electromagnet coil is radially symmetric with respect to said axis, said at least first electromagnet coil and said at least second electromagnet coil are substantially equidistant from the center of said volume, said first electromagnet assembly and said second electromagnet assembly are configured for generating a first magnetic field within said volume;

a first permanent magnet assembly positioned at a third position disposed between said first position and said second position along said axis, said first permanent magnet assembly has an inner surface facing said volume and an outer surface facing said first electromagnet assembly, said first permanent magnet assembly includes at least two coaxial permanent magnets, said at least two permanent magnets are radially symmetric with respect to said axis; and a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes at least two coaxial permanent magnets, said at least two permanent magnets of said second permanent magnet assembly are radially symmetric with respect to said axis, said inner surface of said first permanent magnet assembly and said inner surface of said second permanent magnet assembly define an open region therebetween, said volume is disposed within said open region, said third position of said first permanent magnet assembly and said fourth position of second permanent magnet assembly are substantially equidistant from the center of said volume along said axis, said first permanent magnet assembly and said second permanent magnet assembly are configured for generating a second magnetic field superimposed on said first magnetic field to provide said substantially uniform magnetic field within said volume, at least one of said first electromagnet assembly, said second electromagnet assembly, said first permanent magnet assembly and said second permanent magnet assembly is controllably movable relative to said volume.

55. The magnetic apparatus according to claim 54, wherein at least one electromagnet assembly of said first electromagnet assembly and said second electromagnet assembly is controllably movable relative to said volume.

56. The magnetic apparatus according to claim 55, wherein said open magnetic apparatus further comprises at least one moving mechanism configured for moving said at least one electromagnet assembly relative to said volume.

57. The magnetic apparatus according to claim 56, wherein said at least one moving mechanism is configured for moving said at least one electromagnet assembly towards or away from said volume in a direction parallel to said axis.

58. The magnetic apparatus according to claim 56, wherein said at least one moving mechanism is configured for tilting said at least one electromagnet assembly at an angle with respect to a plane orthogonal to said axis.

59. The magnetic apparatus according to claim 56, wherein said at least one moving mechanism is configured for moving said at least one electromagnet assembly towards or away from said volume in a direction parallel to said axis and for tilting said at least one electromagnet assembly at an angle with respect to a plane orthogonal to said axis.

60. The magnetic apparatus according to claim 56, wherein said at least one moving mechanism is a motorized moving mechanism.

61. The magnetic apparatus according to claim 60, wherein said motorized moving mechanism comprises at least one motor for controllably moving said at least one electromagnet assembly.

62. The magnetic apparatus according to claim 61, wherein said at least one motor is a magnetic resonance imaging compatible motor.

63. The magnetic apparatus according to claim 54, wherein at least one permanent magnet assembly of said first permanent magnet assembly and said second permanent magnet assembly is movable relative to said volume.

64. The magnetic apparatus according to claim 63, wherein said open magnetic apparatus further comprises at least one moving mechanism configured for moving said at least one permanent magnet assembly relative to said volume.

65. The magnetic apparatus according to claim 64, wherein said at least one moving mechanism is configured for moving said at least one permanent magnet assembly towards or away from said volume in a direction parallel to said axis.

66. The magnetic apparatus according to claim 64, wherein said at least one moving mechanism is configured for tilting said at least one permanent magnet assembly at an angle with respect to a plane orthogonal to said axis.

67. The magnetic apparatus according to claim 64, wherein said at least one moving mechanism is configured for moving said at least one permanent magnet assembly towards or away from said volume in a direction parallel to said axis and for tilting said at least one permanent magnet assembly at an angle with respect to a plane orthogonal to said axis.

68. The magnetic apparatus according to claim 64, wherein said at least one moving mechanism is a motorized moving mechanism.

69. The magnetic apparatus according to claim 68, wherein said motorized moving mechanism comprises at least one motor for controllably moving said at least one permanent magnet assembly.

70. The magnetic apparatus according to claim 69, wherein said at least one motor is a magnetic resonance imaging compatible motor.

71. The magnetic apparatus according to claim 54, wherein said at least first electromagnet coil and said at least second electromagnet coil are configured such that the radius of said at least first electromagnet coil is equal to the radius of said at least second electromagnet coil, and the distance between said at least first electromagnet coil and said at least second electromagnet coil is equal to the radius of said at least first electromagnet coil.

72. The magnetic apparatus according to claim 54, wherein said at least first electromagnet coil and said at least second electromagnet coil are configured such that the radius of said at least first electromagnet coil is equal to the radius of said at least second electromagnet coil, and the distance between said at least first electromagnet coil and said at least second electromagnet coil is greater than the radius of said at least first electromagnet coil.

73. The magnetic apparatus according to claim 54, wherein said at least first electromagnet coil and said at least second electromagnet coil are super-conducting electromagnet coils.

74. The magnetic apparatus according to claim 73 further including at least a first cooling device for cooling said at least first electromagnet coil and a second cooling device for cooling said at least second electromagnet coil.

75. The magnetic apparatus according to claim 73 wherein said at least first cooling device and said at least second cooling device comprise a Dewar container or cryostat.

76. The magnetic apparatus according to claim 74 wherein said at least first cooling device and said at least second cooling device are selected from a low temperature gas operated cooling device, a low temperature liquefied gas based cooling device, an active cryo-cooling device, and a cooling device based on low pressure evaporative cooling of a liquefied gas.

77. The magnetic apparatus according to claim 73, wherein said super-conducting electromagnet coils comprise a low-temperature super-conducting material.

78. The magnetic apparatus according to claim 73, wherein said super-conducting electromagnet coils comprise a high-temperature super-conducting material.

79. The magnetic apparatus according to claim 54, wherein said at least two coaxial permanent magnets of said first permanent magnet assembly comprise a first permanent magnet having an outer diameter, said first permanent magnet has a first magnetization direction parallel to said axis, and at least a second generally annular permanent magnet, said at least second permanent magnet has an inner diameter larger than said outer diameter of said first permanent magnet, said second permanent magnet has a second magnetization direction parallel to said axis, and said at least two coaxial permanent magnets of said second permanent magnet assembly comprise a third permanent magnet having an outer diameter, said third permanent magnet has a magnetization direction equal to said first magnetization direction of said first permanent magnet, and at least a fourth generally annular permanent magnet, said at least fourth permanent magnet has an inner diameter larger than said outer diameter of said third permanent magnet, said at least fourth permanent magnet has a magnetization direction equal to said second magnetization direction of said at least second permanent magnet.

80. The magnetic apparatus according to claim 79, wherein said first permanent magnet has a first surface facing said volume, said at least second permanent magnet has a second surface facing said volume, said third permanent magnet has a third surface facing said volume, and said at least fourth permanent magnet has a fourth surface facing said volume, and wherein at least part of said second surface is offset from at least part of said first surface by a first distance along said axis, at least part of said fourth surface is offset from at least part of said third surface by a second distance along said axis, said first distance is substantially equal to said second distance.

81. The magnetic apparatus according to claim 79, wherein said first permanent magnet has a first surface facing said volume, said at least second permanent magnet has a second surface facing said volume, said third permanent magnet has a third surface facing said volume, and said at least fourth permanent magnet has a fourth surface facing said volume, at least part of said second surface is coplanar with at least part of said first surface, and at least part of said third surface is coplanar with at least part of said fourth surface.

82. The magnetic apparatus according to claim 79, wherein said first permanent magnet and said third permanent magnet are selected from a disc-like permanent magnet having a circular cross section in a plane perpendicular to said axis, a regular right polygonal prism-like permanent magnet having a regular polygonal cross-section in a plane perpendicular to said axis and having N sides, a ring-like annular permanent magnet and a annular right regular polygonal permanent magnet having N sides.

83. The magnetic apparatus according to claim 82, wherein N is equal to or larger than eight.

84. The magnetic apparatus according to claim 79, wherein said at least second and said at least fourth permanent magnets are selected from a ring-like annular permanent magnet and an annular right regular polygonal permanent magnet having N sides.

85. The magnetic apparatus according to claim 84, wherein N is equal to or larger than eight.

86. The magnetic apparatus according to claim 79, wherein said first permanent magnet and said third permanent magnet comprise a plurality of permanently magnetized segments attached to adjacent segments using a non-conductive adhesive, to reduce eddy currents.

87. The magnetic apparatus according to claim 86, wherein said segments are equi-angular segments.

88. The magnetic apparatus according to claim 79, wherein said at least second annular permanent magnet and said at least fourth annular permanent magnet comprise a plurality of permanently magnetized segments attached to adjacent segments using a non-conductive adhesive, to reduce eddy currents.

89. The magnetic apparatus according to claim 88, wherein said segments are equi-angular segments.

90. The magnetic apparatus according to claim 79, wherein said first permanent magnet assembly includes a first low magnetic permeability frame for supporting said first permanent magnet and said at least second permanent magnet, and said second permanent magnet assembly includes a second low magnetic permeability frame for supporting said third permanent magnet and said at least fourth permanent magnet.

91. The magnetic apparatus according to claim 90, wherein said first magnetization direction and said second magnetization direction are parallel to said axis and have the same polarity.

92. The magnetic apparatus according to claim 90, wherein said first magnetization direction and said second magnetization direction are parallel to said axis and have opposite polarities.

93. The magnetic apparatus according to claim 54, wherein said at least first electromagnet coil and said at least second electromagnet coil are selected from a circular coil and a regular polygonal shaped coil having N sides.

94. The magnetic apparatus according to claim 93, wherein N is equal to or larger than eight.

95. The magnetic apparatus according to claim 54, wherein said first permanent magnet assembly includes a first low magnetic permeability frame for supporting said at least two coaxial permanent magnets included in said first permanent magnet assembly, and said second permanent magnet assembly includes a second low magnetic permeability frame for supporting said at least two coaxial permanent magnets included in said second permanent magnet assembly.

96. The magnetic apparatus according to claim 54, wherein said first permanent magnet assembly comprises a first adjustment mechanism configured for moving at least one of said at least two coaxial permanent magnets of said first permanent magnet assembly with respect to said volume.

97. The magnetic apparatus according to claim 96, wherein said second permanent magnet assembly comprises a second adjustment mechanism configured for moving at least one of said at least two coaxial permanent magnets of said second permanent magnet assembly with respect to said volume.

98. The magnetic apparatus according to claim 54, further including a first gradient coil assembly disposed between said first permanent magnet assembly and said first electromagnet assembly, and a second gradient coil assembly disposed between said second permanent magnet assembly and said second electromagnet assembly.

99. The magnetic apparatus according to claim 98 wherein each of said first gradient coil assembly and said second gradient coil assembly are non-movably attached within said open magnetic apparatus.

100. The magnetic apparatus according to claim 98, wherein each of said first gradient coil assembly and said second gradient coil assembly includes one or more gradient coils selected from a x-gradient coil, a y-gradient coil, a z-gradient coil, and any combination thereof.

101. The magnetic apparatus according to claim 100, wherein each of said first gradient coil assembly and said second gradient coil assembly is a multi-layer printed circuit assembly, and wherein at least one of said x-gradient coil, y-gradient coil and z-gradient coil of each of said first gradient coil assembly and said second gradient coil assembly is a substantially planar printed circuit coil.

102. The magnetic apparatus according to claim 54, further including an open high magnetic permeability yoke configured for closing the magnetic field lines of said open magnetic apparatus.

103. The magnetic apparatus according to claim 102, wherein said open high magnetic permeability yoke comprises at least one material selected from a ferromagnetic material, a high magnetic permeability material, soft iron, a nickel-iron containing alloy, a silicon-iron containing alloy, low carbon iron, and combinations thereof.

104. The magnetic apparatus according to claim 102, wherein said open high magnetic permeability yoke is selected from a generally c-shaped yoke, a generally U-shaped yoke, and a generally Y-shaped yoke.

105. The magnetic apparatus according to claim 1, further including one or more support members attached to said first electromagnet assembly, said second electromagnet assembly, said first permanent magnet assembly, and said second permanent magnet assembly, for supporting said first electromagnet assembly, said second electromagnet assembly, said first permanent magnet assembly, and said second permanent magnet assembly within said open magnetic apparatus.

106. The magnetic apparatus according to claim 54, further including one or more support members attached to said first electromagnet assembly, said second electromagnet assembly, said first permanent magnet assembly, and said second permanent magnet assembly, for supporting said first electromagnet assembly, said second electromagnet assembly, said first permanent magnet assembly, and said second permanent magnet assembly within said open magnetic apparatus.

107. The magnetic apparatus according to claim 47, wherein said first gradient coil assembly is attached to said first electromagnet assembly.

108. The magnetic apparatus according to claim 47, wherein said first gradient coil assembly is attached to said first permanent magnet assembly.

109. The magnetic apparatus according to claim 47, wherein said first gradient coil assembly is attached to a support member, said support member is suitably attached to said open magnetic apparatus.

110. The magnetic apparatus according to claim 47, wherein said second gradient coil assembly is attached to said second electromagnet assembly.

111. The magnetic apparatus according to claim 47, wherein said second gradient coil assembly is attached to said second permanent magnet assembly.

112. The magnetic apparatus according to claim 47, wherein said second gradient coil assembly is attached to a support member, said support member is suitably attached to said open magnetic apparatus.

113. The magnetic apparatus according to claim 98, wherein said first gradient coil assembly is attached to said first electromagnet assembly.

114. The magnetic apparatus according to claim 98, wherein said first gradient coil assembly is attached to said first permanent magnet assembly.

115. The magnetic apparatus according to claim 98, wherein said first gradient coil assembly is attached to a support member, said support member is suitably attached to said open magnetic apparatus.

116. The magnetic apparatus according to claim 98, wherein said second gradient coil assembly is attached to said second electromagnet assembly.

117. The magnetic apparatus according to claim 98, wherein said second gradient coil assembly is attached to said second permanent magnet assembly.

118. The magnetic apparatus according to claim 98, wherein said second gradient coil assembly is attached to a support member, said support member is suitably attached to said open magnetic apparatus.

119. A method for constructing an open magnetic apparatus for producing a predetermined volume of substantially uniform magnetic field directed parallel to an axis of symmetry of said volume, the method comprising the steps of:

providing a first electromagnet assembly disposed at a first position along said axis, said first electromagnet assembly includes at least a first electromagnet coil, said at least first electromagnet coil is radially symmetric with respect to said axis;

providing a second electromagnet assembly disposed at a second position spaced apart from said first position of said first electromagnet assembly along said axis, said second electromagnet assembly includes at least a second electromagnet coil, said at least second electromagnet coil is radially symmetric with respect to said axis, said at least first electromagnet coil and said at least second electromagnet coil are substantially equidistant from the center of said volume, said first electromagnet assembly and said second electromagnet assembly are configured for generating a first magnetic field within said volume;

providing a first permanent magnet assembly positioned at a third position disposed between said first position and said second position along said axis, said first permanent magnet assembly has an inner surface facing said volume and an outer surface facing said first electromagnet assembly, said first permanent magnet assembly includes at least two coaxial permanent magnets, said at least two permanent magnets are radially symmetric with respect to said axis;

providing a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes at least two coaxial permanent magnets, said at least two permanent magnets of said second permanent magnet assembly are radially symmetric with respect to said axis; and positioning said first permanent magnet assembly and said second permanent magnet assembly such that said inner surface of said first permanent magnet assembly and said inner surface of said second permanent magnet assembly define an open region therebetween, said volume is disposed within said open region, said third position of said first permanent magnet assembly and said fourth position of second permanent magnet assembly are substantially equidistant from the center of said volume along said axis, said first permanent magnet assembly and said second permanent magnet assembly generate a second magnetic field superimposed on said first magnetic field to provide said substantially uniform magnetic field within said volume.

120. The method according to claim 119, further including the step of providing an open high magnetic permeability yoke configured for closing the magnetic field lines of said open magnetic apparatus.

121. The method according to claim 120, wherein said open high magnetic permeability yoke comprises at least one material selected from a ferromagnetic material, a high magnetic permeability material, soft iron, a nickel-iron containing alloy, a silicon-iron containing alloy, low carbon iron, and combinations thereof.

122. A method for tuning an open magnetic apparatus for producing a predetermined volume of substantially uniform magnetic field directed parallel to an axis of symmetry of said volume, the method comprising the steps of:

providing a first electromagnet assembly disposed at a first position along said axis, said first electromagnet assembly includes at least a first electromagnet coil, said at least first electromagnet coil is radially symmetric with respect to said axis;

providing a second electromagnet assembly disposed at a second position spaced apart from said first position of said first electromagnet assembly along said axis, said second electromagnet assembly includes at least a second electromagnet coil, said at least second electromagnet coil is radially symmetric with respect to said axis, said at least first electromagnet coil and said at least second electromagnet coil are substantially equidistant from the center of said volume, said first electromagnet assembly and said second electromagnet assembly are configured for generating a first magnetic field within said volume;

providing a first permanent magnet assembly positioned at a third position disposed between said first position and said second position along said axis, said first permanent magnet assembly has an inner surface facing said volume and an outer surface facing said first electromagnet assembly, said first permanent magnet assembly includes at least two coaxial permanent magnets, said at least two permanent magnets are radially symmetric with respect to said axis;

providing a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes at least two coaxial permanent magnets, said at least two permanent magnets of said second permanent magnet assembly are radially symmetric with respect to said axis;

positioning said first permanent magnet assembly and said second permanent magnet assembly such that said inner surface of said first permanent magnet assembly and said inner surface of said second permanent magnet assembly define an open region therebetween, said volume is disposed within said open region, said third position of said first permanent magnet assembly and said fourth position of second permanent magnet assembly are substantially equidistant from the center of said volume along said axis, said first permanent magnet assembly and said second permanent magnet assembly generate a second magnetic field superimposed on said first magnetic field to provide said substantially uniform magnetic field within said volume; and controllably moving at least one of said first electromagnet assembly, said second electromagnet assembly, said first permanent magnet assembly, and said second permanent magnet assembly relative to said volume for improving the homogeneity of the magnetic field within said volume.

123. The method according to claim 122, further including the step of providing an open high magnetic permeability yoke configured for closing the magnetic field lines of said open magnetic apparatus, prior to said step of controllably moving.

124. The method according to claim 123, wherein said open high magnetic permeability yoke comprises at least one material selected from a ferromagnetic material, a high magnetic permeability material, soft iron, a nickel-iron containing alloy, a silicon-iron containing alloy, low carbon iron, and combinations thereof.

125. A method for operating an open magnetic apparatus for producing a predetermined volume of substantially uniform magnetic field directed parallel to an axis of symmetry of said volume, the method comprising the steps of:

providing a first electromagnet assembly disposed at a first position along said axis, said first electromagnet assembly includes at least a first electromagnet coil, said at least first electromagnet coil is radially symmetric with respect to said axis;

providing a second electromagnet assembly disposed at a second position spaced apart from said first position of said first electromagnet assembly along said axis, said second electromagnet assembly includes at least a second electromagnet coil, said at least second electromagnet coil is radially symmetric with respect to said axis, said at least first electromagnet coil and said at least second electromagnet coil are substantially equidistant from the center of said volume, said first electromagnet assembly and said second electromagnet assembly are configured for generating a first magnetic field within said volume;

providing a first permanent magnet assembly positioned at a third position disposed between said first position and said second position along said axis, said first permanent magnet assembly has an inner surface facing said volume and an outer surface facing said first electromagnet assembly, said first permanent magnet assembly includes at least two coaxial permanent magnets, said at least two permanent magnets are radially symmetric with respect to said axis;

providing a second permanent magnet assembly opposed to said first permanent magnet assembly, said second permanent magnet assembly is positioned at a fourth position spaced apart from said third position along said axis, said second permanent magnet assembly has an inner surface facing said volume and an outer surface facing said second electromagnet assembly, said second permanent magnet assembly includes at least two coaxial permanent magnets, said at least two permanent magnets of said second permanent magnet assembly are radially symmetric with respect to said axis;

positioning said first permanent magnet assembly and said second permanent magnet assembly such that said inner surface of said first permanent magnet assembly and said inner surface of said second permanent magnet assembly define an open region therebetween, said volume is disposed within said open region, said third position of said first permanent magnet assembly and said fourth position of second permanent magnet assembly are substantially equidistant from the center of said volume along said axis, said first permanent magnet assembly and said second permanent magnet assembly generate a second magnetic field superimposed on said first magnetic field to provide said substantially uniform magnetic field within said volume; and electrically energizing said first electromagnet assembly and said second electromagnet assembly to provide said first magnetic field within said volume, wherein said first magnetic field is superimposed on said second magnetic field to provide said substantially uniform magnetic field within said volume.

126. The method according to claim 125, further including the step of providing an open high magnetic permeability yoke configured for closing the magnetic field lines of said open magnetic apparatus.

127. The method according to claim 126, wherein said open high magnetic permeability yoke comprises at least one material selected from a ferromagnetic material, a high magnetic permeability material, soft iron, a nickel-iron containing alloy, a silicon-iron containing alloy, low carbon iron, and combinations thereof.

128. The method according to claim 126 further including the step of controllably moving at least one of said first electromagnet assembly, said second electromagnet assembly, said first permanent magnet assembly, and said second permanent magnet assembly relative to said high magnetic permeability yoke for improving the homogeneity of the magnetic field within said volume.

* * * * *